(12) United States Patent
Bloom et al.

(10) Patent No.: US 7,786,512 B2
(45) Date of Patent: Aug. 31, 2010

(54) DENSE NON-VOLATILE MEMORY ARRAY AND METHOD OF FABRICATION

(75) Inventors: Ilan Bloom, Haifa (IL); Boaz Eitan, Ra'anana (IL); Rustom Irani, Santa Clara, CA (US)

(73) Assignee: Saifun Semiconductors Ltd., Netanya (IL)

( * ) Notice: Subject to any disclaimer, the term of this patent is extended or adjusted under 35 U.S.C. 154(b) by 426 days.

(21) Appl. No.: 11/489,747

(22) Filed: Jul. 18, 2006

(65) Prior Publication Data

US 2007/0051982 A1 Mar. 8, 2007

Related U.S. Application Data

(60) Provisional application No. 60/699,857, filed on Jul. 18, 2005, provisional application No. 60/739,426, filed on Nov. 25, 2005, provisional application No. 60/800,022, filed on May 15, 2006.

(51) Int. Cl.
| | |
|---|---|
| H01L 27/10 | (2006.01) |
| H01L 29/739 | (2006.01) |
| H01L 29/73 | (2006.01) |
| H01L 29/74 | (2006.01) |
| H01L 23/48 | (2006.01) |
| H01L 23/52 | (2006.01) |
| H01L 29/40 | (2006.01) |

(52) U.S. Cl. ............... 257/202; 257/207; 257/208; 257/211; 257/758; 257/759; 257/760; 257/E21.575

(58) Field of Classification Search ........... 252/202, 252/207–208, 211, 758–760, E21.575
See application file for complete search history.

(56) References Cited

U.S. PATENT DOCUMENTS

| | | | |
|---|---|---|---|
| 3,881,180 | A | 4/1975 | Gosney, Jr. |
| 3,895,360 | A | 7/1975 | Cricchi et al. |
| 3,952,325 | A | 4/1976 | Beale et al. |
| 4,016,588 | A | 4/1977 | Ohya et al. |
| 4,017,888 | A | 4/1977 | Christie et al. |
| 4,145,703 | A | 3/1979 | Blanchard et al. |
| 4,151,021 | A | 4/1979 | McElroy |
| 4,173,766 | A | 11/1979 | Hayes |

(Continued)

FOREIGN PATENT DOCUMENTS

EP  0 656 628  6/1995

(Continued)

OTHER PUBLICATIONS

U.S. Appl. No. 08/902,890, filed Jul. 30, 1997, Eitan.

(Continued)

*Primary Examiner*—Ida M Soward
(74) *Attorney, Agent, or Firm*—Eitan Mehulal Law Group

(57) ABSTRACT

A non-volatile memory array includes a multiplicity of memory cells, each of whose area is less than 4 $F^2$ per cell (where F is a minimum feature size), and periphery elements to control the memory cells. The present invention also includes a non-volatile memory which includes word lines and bit lines generally perpendicular to the word lines, with a word line pitch of less than 2 F. In one embodiment, the word lines are made of polysilicon spacers.

20 Claims, 35 Drawing Sheets

U.S. PATENT DOCUMENTS

| | | | |
|---|---|---|---|
| 4,173,791 A | 11/1979 | Bell | |
| 4,247,861 A | 1/1981 | Hsu et al. | |
| 4,257,832 A | 3/1981 | Schwabe et al. | |
| 4,281,397 A | 7/1981 | Neal et al. | |
| 4,306,353 A | 12/1981 | Jacobs et al. | |
| 4,342,102 A | 7/1982 | Puar | |
| 4,342,149 A | 8/1982 | Jacobs et al. | |
| 4,360,900 A | 11/1982 | Bate | |
| 4,373,248 A | 2/1983 | McElroy | |
| 4,380,057 A | 4/1983 | Kotecha et al. | |
| 4,388,705 A | 6/1983 | Sheppard | |
| 4,389,705 A | 6/1983 | Sheppard | |
| 4,404,747 A | 9/1983 | Collins | |
| 4,435,786 A | 3/1984 | Tickle | |
| 4,448,400 A | 5/1984 | Hararl | |
| 4,471,373 A | 9/1984 | Shimizu et al. | |
| 4,494,016 A | 1/1985 | Ransom et al. | |
| 4,507,673 A | 3/1985 | Aoyama | |
| 4,521,796 A | 6/1985 | Rajkanan et al. | |
| 4,527,257 A | 7/1985 | Cricchi | |
| 4,586,163 A | 4/1986 | Koike | |
| 4,613,956 A | 9/1986 | Paterson et al. | |
| 4,630,085 A | 12/1986 | Koyama | |
| 4,663,645 A | 5/1987 | Komori et al. | |
| 4,665,426 A | 5/1987 | Allen et al. | |
| 4,667,217 A | 5/1987 | Janning | |
| 4,672,409 A | 6/1987 | Takei et al. | |
| 4,725,984 A | 2/1988 | Ip et al. | |
| 4,733,105 A | 3/1988 | Shin et al. | |
| 4,742,491 A | 5/1988 | Liang et al. | |
| 4,758,869 A | 7/1988 | Eitan et al. | |
| 4,760,555 A | 7/1988 | Gelsomini et al. | |
| 4,761,764 A | 8/1988 | Watanabe | |
| 4,769,340 A | 9/1988 | Chang et al. | |
| 4,780,424 A | 10/1988 | Holler et al. | |
| 4,839,705 A | 6/1989 | Tigelaar et al. | |
| 4,847,808 A | 7/1989 | Kobatake | |
| 4,857,770 A | 8/1989 | Partovi et al. | |
| 4,870,470 A | 9/1989 | Bass, Jr. et al. | |
| 4,888,735 A | 12/1989 | Lee et al. | |
| 4,916,671 A | 4/1990 | Ichiguchi | |
| 4,941,028 A | 7/1990 | Chen et al. | |
| 4,961,010 A | 10/1990 | Davis | |
| 4,992,391 A | 2/1991 | Wang | |
| 5,013,680 A * | 5/1991 | Lowrey et al. | 438/242 |
| 5,021,847 A * | 6/1991 | Eitan et al. | 365/185.16 |
| 5,021,999 A | 6/1991 | Kohda et al. | |
| 5,027,321 A | 6/1991 | Park | |
| 5,029,063 A | 7/1991 | Lingstaedt et al. | |
| 5,042,009 A | 8/1991 | Kazerounian et al. | |
| 5,075,245 A | 12/1991 | Woo et al. | |
| 5,081,371 A | 1/1992 | Wong | |
| 5,086,325 A | 2/1992 | Schumann et al. | |
| 5,094,968 A | 3/1992 | Schumann et al. | |
| 5,104,819 A | 4/1992 | Freiberger et al. | |
| 5,117,389 A | 5/1992 | Yiu | |
| 5,120,672 A | 6/1992 | Mitchell et al. | |
| 5,142,495 A | 8/1992 | Canepa | |
| 5,142,496 A | 8/1992 | Van Buskirk | |
| 5,159,570 A | 10/1992 | Mitchell et al. | |
| 5,168,334 A | 12/1992 | Mitchell et al. | |
| 5,172,338 A | 12/1992 | Mehrotra et al. | |
| 5,175,120 A | 12/1992 | Lee | |
| 5,204,835 A | 4/1993 | Eitan | |
| 5,214,303 A | 5/1993 | Aoki | |
| 5,237,213 A | 8/1993 | Tanoi | |
| 5,241,497 A | 8/1993 | Komarek | |
| 5,260,593 A | 11/1993 | Lee | |
| 5,268,861 A | 12/1993 | Hotta | |
| 5,276,646 A | 1/1994 | Kim et al. | |
| 5,280,420 A | 1/1994 | Rapp | |
| 5,289,412 A | 2/1994 | Frary et al. | |
| 5,293,563 A | 3/1994 | Ohta | |
| 5,295,092 A | 3/1994 | Hotta et al. | |
| 5,295,108 A | 3/1994 | Higa | |
| 5,305,262 A | 4/1994 | Yoneda | |
| 5,311,049 A | 5/1994 | Tsuruta | |
| 5,315,541 A | 5/1994 | Harari et al. | |
| 5,324,675 A | 6/1994 | Hayabuchi | |
| 5,334,555 A | 8/1994 | Sugiyama et al. | |
| 5,335,198 A | 8/1994 | Van Buskirk et al. | |
| 5,338,954 A | 8/1994 | Shimoji | |
| 5,345,425 A | 9/1994 | Shikatani | |
| 5,349,221 A | 9/1994 | Shimoji | |
| 5,350,710 A | 9/1994 | Hong et al. | |
| 5,352,620 A | 10/1994 | Komori et al. | |
| 5,357,134 A | 10/1994 | Shimoji | |
| 5,359,554 A | 10/1994 | Odake et al. | |
| 5,361,343 A | 11/1994 | Kosonocky et al. | |
| 5,366,915 A | 11/1994 | Kodama | |
| 5,375,094 A | 12/1994 | Naruke | |
| 5,381,374 A | 1/1995 | Shiraishi et al. | |
| 5,393,701 A | 2/1995 | Ko et al. | |
| 5,394,355 A | 2/1995 | Uramoto et al. | |
| 5,399,891 A | 3/1995 | Yiu et al. | |
| 5,400,286 A | 3/1995 | Chu et al. | |
| 5,402,374 A | 3/1995 | Tsuruta et al. | |
| 5,412,601 A | 5/1995 | Sawada et al. | |
| 5,414,693 A | 5/1995 | Ma et al. | |
| 5,418,176 A | 5/1995 | Yang et al. | |
| 5,418,743 A | 5/1995 | Tomioka et al. | |
| 5,422,844 A | 6/1995 | Wolstenholme et al. | |
| 5,424,567 A | 6/1995 | Chen | |
| 5,424,978 A | 6/1995 | Wada et al. | |
| 5,426,605 A | 6/1995 | Van Berkel et al. | |
| 5,434,825 A | 7/1995 | Harari et al. | |
| 5,436,478 A | 7/1995 | Bergemont et al. | |
| 5,436,481 A | 7/1995 | Egawa et al. | |
| 5,440,505 A | 8/1995 | Fazio et al. | |
| 5,450,341 A | 9/1995 | Sawada et al. | |
| 5,450,354 A | 9/1995 | Sawada et al. | |
| 5,455,793 A | 10/1995 | Amin et al. | |
| 5,467,308 A | 11/1995 | Chang et al. | |
| 5,477,499 A | 12/1995 | Van Buskirk et al. | |
| 5,495,440 A | 2/1996 | Asakura | |
| 5,496,753 A | 3/1996 | Sakurai et al. | |
| 5,508,968 A | 4/1996 | Collins et al. | |
| 5,518,942 A | 5/1996 | Shrivastava | |
| 5,521,870 A | 5/1996 | Ishikawa | |
| 5,523,251 A | 6/1996 | Hong | |
| 5,523,972 A | 6/1996 | Rashid et al. | |
| 5,530,803 A | 6/1996 | Chang et al. | |
| 5,534,804 A | 7/1996 | Woo | |
| 5,537,358 A | 7/1996 | Fong | |
| 5,544,116 A | 8/1996 | Chao et al. | |
| 5,553,018 A | 9/1996 | Wang et al. | |
| 5,553,030 A | 9/1996 | Tedrow et al. | |
| 5,557,221 A | 9/1996 | Taguchi et al. | |
| 5,557,570 A | 9/1996 | Iwahashi | |
| 5,559,687 A | 9/1996 | Nicollini et al. | |
| 5,563,823 A | 10/1996 | Yiu et al. | |
| 5,566,125 A | 10/1996 | Fazio et al. | |
| 5,568,085 A | 10/1996 | Eitan et al. | |
| 5,579,199 A | 11/1996 | Kawamura et al. | |
| 5,581,252 A | 12/1996 | Thomas | |
| 5,583,808 A | 12/1996 | Brahmbhatt | |
| 5,590,068 A | 12/1996 | Bergemont | |
| 5,590,074 A | 12/1996 | Akaogi et al. | |
| 5,592,417 A | 1/1997 | Mirabel | |
| 5,596,527 A | 1/1997 | Tomioka et al. | |
| 5,599,727 A | 2/1997 | Hakozaki et al. | |
| 5,600,586 A | 2/1997 | Lee et al. | |
| 5,604,804 A | 2/1997 | Micall | |
| 5,606,523 A | 2/1997 | Mirabel | |

| Patent | Date | Inventor |
|---|---|---|
| 5,608,679 A | 3/1997 | Mi et al. |
| 5,612,642 A | 3/1997 | McClinyock |
| 5,617,357 A | 4/1997 | Haddad et al. |
| 5,623,438 A | 4/1997 | Guritz et al. |
| 5,627,790 A | 5/1997 | Golla et al. |
| 5,633,603 A | 5/1997 | Lee |
| 5,636,288 A | 6/1997 | Bonneville et al. |
| 5,644,531 A | 7/1997 | Kuo et al. |
| 5,654,568 A | 8/1997 | Nakao |
| 5,656,513 A | 8/1997 | Wang et al. |
| 5,657,332 A | 8/1997 | Auclair et al. |
| 5,661,060 A | 8/1997 | Gill et al. |
| 5,663,907 A | 9/1997 | Frayer et al. |
| 5,666,365 A | 9/1997 | Kostreski |
| 5,672,959 A | 9/1997 | Der |
| 5,675,280 A | 10/1997 | Nomura |
| 5,677,867 A | 10/1997 | Hazani |
| 5,677,869 A | 10/1997 | Fazio et al. |
| 5,683,925 A | 11/1997 | Irani et al. |
| 5,689,459 A | 11/1997 | Chang et al. |
| 5,691,551 A * | 11/1997 | Eimori .................. 257/303 |
| 5,694,356 A | 12/1997 | Wong et al. |
| 5,696,929 A | 12/1997 | Hasbun et al. |
| 5,708,608 A | 1/1998 | Park et al. |
| 5,712,814 A | 1/1998 | Fratin et al. |
| 5,712,815 A | 1/1998 | Bill et al. |
| 5,715,193 A | 2/1998 | Norman |
| 5,717,581 A | 2/1998 | Canclini |
| 5,717,632 A | 2/1998 | Richart et al. |
| 5,717,635 A | 2/1998 | Akatsu |
| 5,721,781 A | 2/1998 | Deo et al. |
| 5,726,946 A | 3/1998 | Yamagata et al. |
| 5,748,534 A | 5/1998 | Dunlap et al. |
| 5,751,037 A | 5/1998 | Aozasa et al. |
| 5,751,637 A | 5/1998 | Chen et al. |
| 5,754,475 A | 5/1998 | Bill et al. |
| 5,760,445 A | 6/1998 | Diaz |
| 5,760,634 A | 6/1998 | Fu |
| 5,768,192 A | 6/1998 | Eitan |
| 5,768,193 A | 6/1998 | Lee et al. |
| 5,771,197 A | 6/1998 | Kim |
| 5,774,395 A | 6/1998 | Richart et al. |
| 5,777,919 A | 7/1998 | Chi-Yung et al. |
| 5,781,476 A | 7/1998 | Seki et al. |
| 5,781,478 A | 7/1998 | Takeuchi et al. |
| 5,783,934 A | 7/1998 | Tran |
| 5,784,314 A | 7/1998 | Sali et al. |
| 5,787,036 A | 7/1998 | Okazawa |
| 5,793,079 A | 8/1998 | Georgescu et al. |
| 5,801,076 A | 9/1998 | Ghneim et al. |
| 5,805,500 A | 9/1998 | Campardo et al. |
| 5,808,506 A | 9/1998 | Tran |
| 5,812,449 A | 9/1998 | Song |
| 5,812,456 A | 9/1998 | Hull et al. |
| 5,812,457 A | 9/1998 | Arase |
| 5,815,435 A | 9/1998 | Van Tran |
| 5,822,256 A | 10/1998 | Bauer et al. |
| 5,825,683 A | 10/1998 | Chang et al. |
| 5,825,686 A | 10/1998 | Schmitt-Landsiedel et al. |
| 5,828,601 A | 10/1998 | Hollmer et al. |
| 5,834,851 A | 11/1998 | Ikeda et al. |
| 5,835,935 A | 11/1998 | Estakhri et al. |
| 5,836,772 A | 11/1998 | Chang et al. |
| 5,841,700 A | 11/1998 | Chang |
| 5,847,441 A | 12/1998 | Cutter et al. |
| 5,861,771 A | 1/1999 | Matsuda et al. |
| 5,862,076 A | 1/1999 | Eitan |
| 5,864,164 A | 1/1999 | Wen |
| 5,867,429 A | 2/1999 | Chen et al. |
| 5,870,334 A | 2/1999 | Hemink et al. |
| 5,870,335 A | 2/1999 | Khan et al. |
| 5,872,848 A | 2/1999 | Romney et al. |
| 5,875,128 A | 2/1999 | Ishizuka et al. |
| 5,877,537 A | 3/1999 | Aoki |
| 5,880,620 A | 3/1999 | Gitlin et al. |
| 5,886,927 A | 3/1999 | Takeuchi |
| RE36,179 E | 4/1999 | Shimoda |
| 5,892,710 A | 4/1999 | Fazio et al. |
| 5,903,031 A | 5/1999 | Yamada et al. |
| 5,910,924 A | 6/1999 | Tanaka et al. |
| 5,920,503 A | 7/1999 | Lee et al. |
| 5,920,507 A | 7/1999 | Takeuchi et al. |
| 5,926,409 A | 7/1999 | Engh et al. |
| 5,930,195 A | 7/1999 | Komatsu et al. |
| 5,933,366 A | 8/1999 | Yoshikawa |
| 5,933,367 A | 8/1999 | Matsuo et al. |
| 5,936,888 A | 8/1999 | Sugawara |
| 5,940,332 A | 8/1999 | Artleri |
| 5,946,258 A | 8/1999 | Evertt et al. |
| 5,946,558 A | 8/1999 | Hsu |
| 5,949,714 A | 9/1999 | Hemink et al. |
| 5,949,728 A | 9/1999 | Liu et al. |
| 5,959,311 A | 9/1999 | Shih et al. |
| 5,963,412 A | 10/1999 | En |
| 5,963,465 A | 10/1999 | Eitan |
| 5,966,603 A | 10/1999 | Eitan |
| 5,969,989 A | 10/1999 | Iwahashi |
| 5,969,993 A | 10/1999 | Takeshima |
| 5,973,373 A | 10/1999 | Krautschneider et al. |
| 5,982,666 A | 11/1999 | Campardo |
| 5,986,940 A | 11/1999 | Atsumi et al. |
| 5,990,526 A | 11/1999 | Bez et al. |
| 5,991,202 A | 11/1999 | Derhacobian et al. |
| 5,999,444 A | 12/1999 | Fujiwara et al. |
| 5,999,494 A | 12/1999 | Holzrichter |
| 6,000,006 A | 12/1999 | Bruce et al. |
| 6,005,423 A | 12/1999 | Schultz |
| 6,011,725 A | 1/2000 | Eitan |
| 6,018,186 A | 1/2000 | Hsu |
| 6,020,241 A | 2/2000 | You et al. |
| 6,028,324 A | 2/2000 | Su et al. |
| 6,030,871 A | 2/2000 | Eitan |
| 6,034,403 A | 3/2000 | Wu |
| 6,034,896 A | 3/2000 | Ranaweera et al. |
| 6,037,627 A | 3/2000 | Kitamura et al. |
| 6,040,610 A | 3/2000 | Noguchi et al. |
| 6,044,019 A | 3/2000 | Cernea et al. |
| 6,044,022 A | 3/2000 | Nachumovsky |
| 6,063,666 A | 5/2000 | Chang et al. |
| 6,064,226 A | 5/2000 | Earl |
| 6,064,251 A | 5/2000 | Park |
| 6,064,591 A | 5/2000 | Takeuchi et al. |
| 6,074,916 A | 6/2000 | Cappelletti |
| 6,075,402 A | 6/2000 | Ghilardelli |
| 6,075,724 A | 6/2000 | Li et al. |
| 6,078,518 A | 6/2000 | Chevallier |
| 6,081,456 A | 6/2000 | Dadashev |
| 6,084,794 A | 7/2000 | Lu et al. |
| 6,091,640 A | 7/2000 | Kawahara et al. |
| 6,094,095 A | 7/2000 | Murray et al. |
| 6,097,639 A | 8/2000 | Choi et al. |
| 6,107,862 A | 8/2000 | Mukainakano et al. |
| 6,108,240 A | 8/2000 | Lavi et al. |
| 6,108,241 A | 8/2000 | Chevallier |
| 6,117,714 A | 9/2000 | Beatty |
| 6,118,207 A | 9/2000 | Ormerod et al. |
| 6,118,692 A | 9/2000 | Banks |
| 6,122,198 A | 9/2000 | Haddad et al. |
| 6,128,226 A | 10/2000 | Eitan et al. |
| 6,128,227 A | 10/2000 | Kim |
| 6,130,572 A | 10/2000 | Ghilardelli et al. |
| 6,130,574 A | 10/2000 | Bloch et al. |
| 6,133,095 A | 10/2000 | Eitan et al. |
| 6,134,156 A | 10/2000 | Eitan |
| 6,137,718 A | 10/2000 | Reisinger |
| 6,147,904 A | 11/2000 | Liron |

| | | | | | | |
|---|---|---|---|---|---|---|
| 6,147,906 | A | 11/2000 | Bill et al. | 6,344,959 | B1 | 2/2002 | Milazzo |
| 6,150,800 | A | 11/2000 | Kinoshita et al. | 6,346,442 | B1 | 2/2002 | Aloni et al. |
| 6,154,081 | A | 11/2000 | Pakkala et al. | 6,348,374 | B1 * | 2/2002 | Athavale et al. ............ 438/243 |
| 6,156,149 | A | 12/2000 | Cheung et al. | 6,348,381 | B1 | 2/2002 | Jong |
| 6,157,242 | A | 12/2000 | Fukui | 6,348,711 | B1 | 2/2002 | Eitan |
| 6,157,570 | A | 12/2000 | Nachumovsky | 6,351,415 | B1 | 2/2002 | Kushnarenko |
| 6,163,048 | A | 12/2000 | Hirose et al. | 6,353,356 | B1 | 3/2002 | Liu |
| 6,163,484 | A | 12/2000 | Uekubo | 6,353,554 | B1 | 3/2002 | Banks |
| 6,169,691 | B1 | 1/2001 | Pasotti et al. | 6,353,555 | B1 | 3/2002 | Jeong |
| 6,172,898 | B1 * | 1/2001 | Kajiyama ................... 365/149 | 6,356,062 | B1 | 3/2002 | Elmhurst et al. |
| 6,175,523 | B1 | 1/2001 | Yang et al. | 6,356,469 | B1 | 3/2002 | Roohparvar et al. |
| 6,181,597 | B1 | 1/2001 | Nachumovsky | 6,359,501 | B2 | 3/2002 | Lin et al. |
| 6,181,605 | B1 | 1/2001 | Hollmer et al. | 6,374,337 | B1 | 4/2002 | Estakhri |
| 6,185,143 | B1 | 2/2001 | Perner et al. | 6,381,166 | B1 * | 4/2002 | Yoshida et al. ................. 365/63 |
| 6,188,211 | B1 | 2/2001 | Rincon-Mora et al. | 6,385,086 | B1 | 5/2002 | Mihara et al. |
| 6,190,966 | B1 | 2/2001 | Ngo et al. | 6,396,741 | B1 | 5/2002 | Bloom et al. |
| 6,192,445 | B1 | 2/2001 | Rezvani | 6,400,209 | B1 | 6/2002 | Matsuyama et al. |
| 6,195,196 | B1 | 2/2001 | Kimura et al. | 6,400,607 | B1 | 6/2002 | Pasotti et al. |
| 6,198,342 | B1 | 3/2001 | Kawai | 6,407,537 | B2 | 6/2002 | Antheunis |
| 6,201,282 | B1 | 3/2001 | Eitan | 6,410,388 | B1 | 6/2002 | Kluth et al. |
| 6,201,737 | B1 | 3/2001 | Hollmer et al. | 6,417,081 | B1 | 7/2002 | Thurgate |
| 6,205,055 | B1 | 3/2001 | Parker | 6,418,506 | B1 | 7/2002 | Pashley et al. |
| 6,205,056 | B1 | 3/2001 | Pan et al. | 6,426,898 | B1 | 7/2002 | Mihnea et al. |
| 6,205,059 | B1 | 3/2001 | Gutala et al. | 6,429,063 | B1 | 8/2002 | Eitan |
| 6,208,200 | B1 | 3/2001 | Arakawa | 6,433,624 | B1 | 8/2002 | Grossnikle et al. |
| 6,208,557 | B1 | 3/2001 | Bergemont et al. | 6,436,766 | B1 | 8/2002 | Rangarajan et al. |
| 6,211,548 | B1 * | 4/2001 | Ma ............................ 257/321 | 6,436,768 | B1 | 8/2002 | Yang et al. |
| 6,214,666 | B1 | 4/2001 | Mehta | 6,438,031 | B1 | 8/2002 | Fastow |
| 6,215,148 | B1 | 4/2001 | Eitan | 6,438,035 | B2 | 8/2002 | Yamamoto et al. |
| 6,215,697 | B1 | 4/2001 | Lu et al. | 6,440,797 | B1 | 8/2002 | Wu et al. |
| 6,215,702 | B1 | 4/2001 | Derhacobian et al. | 6,442,074 | B1 | 8/2002 | Hamilton et al. |
| 6,218,695 | B1 | 4/2001 | Nachumovsky | 6,445,030 | B1 | 9/2002 | Wu et al. |
| 6,219,277 | B1 | 4/2001 | Devin et al. | 6,449,188 | B1 | 9/2002 | Fastow |
| 6,219,290 | B1 | 4/2001 | Chang et al. | 6,449,190 | B1 | 9/2002 | Bill |
| 6,222,762 | B1 | 4/2001 | Guterman et al. | 6,452,438 | B1 | 9/2002 | Li |
| 6,222,768 | B1 | 4/2001 | Hollmer et al. | 6,455,896 | B1 | 9/2002 | Chou et al. |
| 6,570,211 | B1 | 4/2001 | Guterman et al. | 6,456,528 | B1 | 9/2002 | Chen |
| 6,233,180 | B1 | 5/2001 | Eitan et al. | 6,456,533 | B1 | 9/2002 | Hamilton et al. |
| 6,240,032 | B1 | 5/2001 | Fukumoto | 6,458,656 | B1 | 10/2002 | Park et al. |
| 6,240,040 | B1 | 5/2001 | Akaogi et al. | 6,458,677 | B1 | 10/2002 | Hopper et al. |
| 6,246,555 | B1 | 6/2001 | Tham | 6,469,929 | B1 | 10/2002 | Kushnarenko et al. |
| 6,252,442 | B1 | 6/2001 | Malherbe | 6,469,935 | B2 | 10/2002 | Hayashi |
| 6,252,799 | B1 | 6/2001 | Liu et al. | 6,472,706 | B2 | 10/2002 | Widdershoven et al. |
| 6,256,231 | B1 | 7/2001 | Lavi et al. | 6,477,085 | B1 | 11/2002 | Kuo |
| 6,261,904 | B1 | 7/2001 | Pham et al. | 6,490,204 | B2 | 12/2002 | Bloom et al. |
| 6,265,268 | B1 | 7/2001 | Halliyal et al. | 6,496,414 | B2 | 12/2002 | Kasa et al. |
| 6,266,281 | B1 | 7/2001 | Derhacobian et al. | 6,504,756 | B2 | 1/2003 | Gonzalez et al. |
| 6,272,047 | B1 | 8/2001 | Mihnea et al. | 6,510,082 | B1 | 1/2003 | Le et al. |
| 6,275,414 | B1 | 8/2001 | Randolph et al. | 6,512,701 | B1 | 1/2003 | Hamilton et al. |
| 6,281,545 | B1 | 8/2001 | Liang et al. | 6,519,180 | B2 | 2/2003 | Tran et al. |
| 6,282,133 | B1 | 8/2001 | Nakagawa et al. | 6,519,182 | B1 | 2/2003 | Derhacobian et al. |
| 6,282,145 | B1 | 8/2001 | Tran et al. | 6,522,585 | B2 | 2/2003 | Pasternak |
| 6,285,246 | B1 | 9/2001 | Basu | 6,525,969 | B1 | 2/2003 | Kurihara et al. |
| 6,285,574 | B1 | 9/2001 | Eitan | 6,528,390 | B2 | 3/2003 | Komori et al. |
| 6,285,589 | B1 | 9/2001 | Kajitani | 6,529,412 | B1 | 3/2003 | Chen et al. |
| 6,285,614 | B1 | 9/2001 | Mulatti et al. | 6,532,173 | B2 | 3/2003 | Lioka et al. |
| 6,292,394 | B1 | 9/2001 | Cohen et al. | 6,535,020 | B1 | 3/2003 | Yin |
| 6,297,096 | B1 | 10/2001 | Boaz | 6,535,434 | B2 | 3/2003 | Maayan et al. |
| 6,297,143 | B1 | 10/2001 | Foote et al. | 6,537,881 | B1 | 3/2003 | Rangarjan et al. |
| 6,297,974 | B1 | 10/2001 | Ganesan et al. | 6,538,270 | B1 | 3/2003 | Randolph et al. |
| 6,304,485 | B1 | 10/2001 | Harari et al. | 6,541,816 | B2 | 4/2003 | Ramsbey et al. |
| 6,307,784 | B1 | 10/2001 | Hamilton et al. | 6,552,387 | B1 | 4/2003 | Eitan |
| 6,307,807 | B1 | 10/2001 | Sakui et al. | 6,555,436 | B2 | 4/2003 | Ramsbey et al. |
| 6,320,786 | B1 | 11/2001 | Chang et al. | 6,559,500 | B2 | 5/2003 | Torii |
| 6,324,094 | B1 | 11/2001 | Chevallier | 6,562,683 | B1 | 5/2003 | Wang et al. |
| 6,326,265 | B1 | 12/2001 | Liu et al. | 6,566,194 | B1 | 5/2003 | Ramsbey et al. |
| 6,330,192 | B1 | 12/2001 | Ohba et al. | 6,566,699 | B2 | 5/2003 | Eitan |
| 6,331,950 | B1 | 12/2001 | Kuo et al. | 6,567,303 | B1 | 5/2003 | Hamilton et al. |
| 6,335,874 | B1 | 1/2002 | Eitan | 6,567,312 | B1 | 5/2003 | Torii et al. |
| 6,335,990 | B1 | 1/2002 | Chen et al. | 6,574,139 | B2 | 6/2003 | Kurihara |
| 6,337,502 | B1 | 1/2002 | Eitan et al. | 6,577,514 | B2 | 6/2003 | Shor et al. |
| 6,339,556 | B1 | 1/2002 | Watanabe | 6,577,532 | B1 | 6/2003 | Chevallier |
| 6,343,033 | B1 | 1/2002 | Parker | 6,577,547 | B2 | 6/2003 | Ukon |

| | | |
|---|---|---|
| 6,583,005 B2 | 6/2003 | Hashimoto et al. |
| 6,583,479 B1 | 6/2003 | Fastow et al. |
| 6,584,017 B2 | 6/2003 | Maayan et al. |
| 6,590,811 B1 | 7/2003 | Hamilton et al. |
| 6,593,606 B1 | 7/2003 | Randolph et al. |
| 6,594,181 B1 | 7/2003 | Yamada |
| 6,608,526 B1 | 8/2003 | Sauer |
| 6,608,905 B1 | 8/2003 | Muza et al. |
| 6,614,052 B1 | 9/2003 | Zhang |
| 6,614,295 B2 | 9/2003 | Tsuchi |
| 6,614,686 B1 | 9/2003 | Kawamura |
| 6,614,692 B2 | 9/2003 | Maayan et al. |
| 6,617,179 B1 | 9/2003 | Kim |
| 6,617,215 B1 | 9/2003 | Halliyal et al. |
| 6,618,290 B1 | 9/2003 | Wang et al. |
| 6,624,672 B2 | 9/2003 | Confaloneri et al. |
| 6,627,555 B2 | 9/2003 | Eitan et al. |
| 6,630,384 B1 | 10/2003 | Sun et al. |
| 6,633,496 B2 | 10/2003 | Maayan et al. |
| 6,633,499 B1 | 10/2003 | Eitan et al. |
| 6,633,956 B1 | 10/2003 | Mitani |
| 6,636,440 B2 | 10/2003 | Maayan et al. |
| 6,639,271 B1 | 10/2003 | Zheng et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |
| 6,642,586 B2 | 11/2003 | Takahashi |
| 6,643,170 B2 | 11/2003 | Huang et al. |
| 6,643,177 B1 | 11/2003 | Le et al. |
| 6,643,178 B2 | 11/2003 | Kurihara |
| 6,643,181 B2 | 11/2003 | Sofer et al. |
| 6,645,801 B1 | 11/2003 | Ramsbey et al. |
| 6,649,972 B2 | 11/2003 | Eitan |
| 6,650,568 B2 | 11/2003 | Iijima |
| 6,653,190 B1 | 11/2003 | Yang et al. |
| 6,653,191 B1 | 11/2003 | Yang et al. |
| 6,654,296 B2 | 11/2003 | Jang et al. |
| 6,661,692 B2 * | 12/2003 | Anzai et al. ................ 365/63 |
| 6,664,588 B2 | 12/2003 | Eitan |
| 6,665,769 B2 | 12/2003 | Cohen et al. |
| 6,670,241 B1 | 12/2003 | Kamal et al. |
| 6,670,669 B1 | 12/2003 | Kawamura |
| 6,674,138 B1 | 1/2004 | Halliyal et al. |
| 6,677,805 B2 | 1/2004 | Shor et al. |
| 6,680,509 B1 | 1/2004 | Wu et al. |
| 6,686,242 B2 | 2/2004 | Willer et al. |
| 6,689,660 B1 * | 2/2004 | Noble et al. ................ 438/268 |
| 6,690,602 B1 | 2/2004 | Le et al. |
| 6,693,483 B2 | 2/2004 | Deml et al. |
| 6,700,818 B2 | 3/2004 | Shappir et al. |
| 6,717,207 B2 | 4/2004 | Kato |
| 6,720,606 B1 * | 4/2004 | Nitayama et al. .......... 257/306 |
| 6,723,518 B2 | 4/2004 | Papsidero et al. |
| 6,731,542 B1 | 5/2004 | Le et al. |
| 6,738,289 B2 | 5/2004 | Gongwer et al. |
| 6,744,692 B2 | 6/2004 | Shiota et al. |
| 6,765,259 B2 | 7/2004 | Kim |
| 6,768,165 B1 | 7/2004 | Eitan |
| 6,781,876 B2 | 8/2004 | Forbes et al. |
| 6,788,579 B2 | 9/2004 | Gregori et al. |
| 6,791,396 B2 | 9/2004 | Shor et al. |
| 6,794,249 B2 | 9/2004 | Palm et al. |
| 6,794,280 B2 | 9/2004 | Chang |
| 6,818,956 B2 | 11/2004 | Kuo et al. |
| 6,829,172 B2 | 12/2004 | Bloom et al. |
| 6,831,872 B2 | 12/2004 | Matsuoka |
| 6,836,431 B2 | 12/2004 | Chang |
| 6,859,028 B2 | 2/2005 | Toner |
| 6,870,772 B1 | 3/2005 | Nitta et al. |
| 6,871,258 B2 | 3/2005 | Micheloni et al. |
| 6,885,585 B2 | 4/2005 | Maayan et al. |
| 6,885,590 B1 | 4/2005 | Zheng et al. |
| 6,906,357 B1 | 6/2005 | Vashchenko et al. |
| 6,912,160 B2 | 6/2005 | Yamada |
| 6,917,544 B2 | 7/2005 | Maayan et al. |
| 6,928,001 B2 | 8/2005 | Avni et al. |
| 6,937,523 B2 | 8/2005 | Eshel |
| 6,967,872 B2 | 11/2005 | Quader et al. |
| 6,992,343 B2 * | 1/2006 | Miyatake et al. ............ 257/296 |
| 6,996,692 B2 | 2/2006 | Kuono |
| 7,054,219 B1 * | 5/2006 | Petti et al. ............... 365/230.06 |
| 7,079,420 B2 | 7/2006 | Shappir et al. |
| 7,254,051 B2 * | 8/2007 | Takashima .................. 365/145 |
| 2001/0006477 A1 | 7/2001 | Banks |
| 2002/0004878 A1 | 1/2002 | Norman |
| 2002/0004921 A1 | 1/2002 | Muranaka et al. |
| 2002/0064911 A1 | 5/2002 | Eitan |
| 2002/0109179 A1 * | 8/2002 | Johnson et al. .............. 257/314 |
| 2002/0132436 A1 | 9/2002 | Eliyahu et al. |
| 2002/0140109 A1 | 10/2002 | Keshavarzi et al. |
| 2002/0145465 A1 | 10/2002 | Shor et al. |
| 2002/0191458 A1 * | 12/2002 | Kobayashi et al. .......... 365/200 |
| 2002/0191465 A1 | 12/2002 | Maayan et al. |
| 2002/0199065 A1 | 12/2002 | Subramoney et al. |
| 2003/0001213 A1 | 1/2003 | Lai |
| 2003/0021155 A1 | 1/2003 | Yachareni et al. |
| 2003/0072192 A1 | 4/2003 | Bloom et al. |
| 2003/0076710 A1 | 4/2003 | Sofer et al. |
| 2003/0117841 A1 | 6/2003 | Yamashita |
| 2003/0131186 A1 | 7/2003 | Buhr |
| 2003/0134476 A1 | 7/2003 | Roizin et al. |
| 2003/0142544 A1 | 7/2003 | Maayan et al. |
| 2003/0145176 A1 | 7/2003 | Dvir et al. |
| 2003/0145188 A1 | 7/2003 | Cohen et al. |
| 2003/0155659 A1 | 8/2003 | Verma et al. |
| 2003/0156457 A1 * | 8/2003 | Ooishi ..................... 365/185.21 |
| 2003/0190786 A1 | 10/2003 | Ramsbey et al. |
| 2003/0193824 A1 * | 10/2003 | Tsukikawa et al. .......... 365/149 |
| 2003/0197221 A1 | 10/2003 | Shinozaki et al. |
| 2003/0202411 A1 | 10/2003 | Yamada |
| 2003/0206435 A1 | 11/2003 | Takahashi |
| 2003/0208663 A1 | 11/2003 | Van Buskirk et al. |
| 2003/0209767 A1 | 11/2003 | Takahashi et al. |
| 2003/0214844 A1 | 11/2003 | Iijima |
| 2003/0218207 A1 | 11/2003 | Hashimoto et al. |
| 2003/0218913 A1 | 11/2003 | Le et al. |
| 2003/0222303 A1 | 12/2003 | Fukuda et al. |
| 2003/0227796 A1 | 12/2003 | Miki et al. |
| 2004/0007730 A1 | 1/2004 | Chou et al. |
| 2004/0012993 A1 | 1/2004 | Kurihara |
| 2004/0013000 A1 | 1/2004 | Torii |
| 2004/0014280 A1 | 1/2004 | Willer et al. |
| 2004/0014290 A1 | 1/2004 | Yang et al. |
| 2004/0021172 A1 | 2/2004 | Zheng et al. |
| 2004/0027858 A1 | 2/2004 | Takahashi et al. |
| 2004/0151034 A1 | 8/2004 | Shor et al. |
| 2004/0153621 A1 | 8/2004 | Polansky et al. |
| 2004/0157393 A1 | 8/2004 | Hwang |
| 2004/0222437 A1 | 11/2004 | Avni et al. |
| 2005/0117395 A1 | 6/2005 | Maayan et al. |
| 2005/0117601 A1 | 6/2005 | Anderson et al. |
| 2005/0140405 A1 | 6/2005 | Do et al. |
| 2005/0213593 A1 | 9/2005 | Anderson et al. |
| 2005/0232024 A1 | 10/2005 | Atir et al. |
| 2006/0084219 A1 | 4/2006 | Lusky et al. |
| 2006/0126382 A1 | 6/2006 | Maayan et al. |
| 2006/0126383 A1 | 6/2006 | Shappir et al. |
| 2006/0211188 A1 | 9/2006 | Lusky et al. |
| 2007/0070708 A1 * | 3/2007 | Ichige et al. ............ 365/185.28 |
| 2007/0147152 A1 * | 6/2007 | Sekiguchi et al. ........... 365/207 |

| | | | | | | |
|---|---|---|---|---|---|---|
| 2008/0106931 | A1 * | 5/2008 | Toda ......................... 365/163 | WO | WO 03/100790 | 12/2003 |

FOREIGN PATENT DOCUMENTS

| | | |
|---|---|---|
| EP | 0751560 | 6/1995 |
| EP | 0693781 | 1/1996 |
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291962 | 10/1992 |
| JP | 05021758 | 1/1993 |
| JP | 05-326893 | 12/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10-108276 | 4/1998 |
| JP | 10 334676 | 12/1998 |
| JP | 11-162182 | 6/1999 |
| JP | 11-354758 | 12/1999 |
| JP | 2001-085646 | 3/2001 |
| JP | 2001-118392 | 4/2001 |
| JP | 2001-156189 | 6/2001 |
| JP | 2002-216488 | 8/2002 |
| JP | 3358663 | 10/2002 |
| WO | WO 81/00790 | 3/1981 |
| WO | WO 96/15553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 00/46808 | 8/2000 |
| WO | WO 01/65565 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/088353 | 10/2003 |

OTHER PUBLICATIONS

U.S. Appl. No. 11/489,327, filed Jul. 18, 2006, Eitan et al.

Bude et al., EEPROM/Flash Sub 3.0V drain—Source Bias Hot Carrier Writing, IEDM, 1995, pp. 989-992.

Bude et al., Secondary Electron Flash—a High Performance, Low Power Flash Technology for 0.35 um and below, IEDM, 1997, 279-282.

Bude et al., Modeling Nonequilibrium Hot Carrier Device Effects, Conference of Insulator Specialists of Europe, Jun. 1997, Sweden.

Jung et al., IEEE Journal of Solid-State Circuits, Nov. 1996, 1575-1583, vol. 31, No. 11.

Campardo et al., IEEE Journal of Solid-State Circuits, Nov. 2000, 1655-1667, vol. 35, No. 11.

Lin et al., Novel Source-Controlled Self-Verified Programming for Multilevel EEPROM's, IEEE Transactions on Electron Devices, Jun. 2000, 1166-1174, vol. 47, No. 6.

Chan et al., A True Single-Transistor Oxide-Nitride-Oxide EEPROM Device, IEEE Electron Device Letters, Mar. 1987, vol. EDL-8, No. 3.

Eitan et al., "Hot-Electron Injection into the Oxide in n-Channel MOS Devices", IEEE Transactions on Electron Devices, vol. ED-28, No. 3, pp. 328-370, Mar. 1981.

Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.

Tanaka et al., "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.

Ma et al., A Dual-bit Split-Gate EEPROM (DSG) Cell in Contactless Array for Single-Vcc High Density Flash Memories, IEEE, 1994, 57-60.

Oshima et al., Process and Device Technologies for 16Mbit EPROMs with Large-Tilt-Angle Implanted P-Pocket Cell, IEEE, Dec. 1990, Ch. 2865-4/90/0000-0095, pp. 521-524, San Francisco, California.

Lee, A new approach for the floating-gate MOS nonvolatile memory, Applied Physics Letters, Oct. 1977, 475-476, vol. 31, No. 7, American Institute of Physics.

Glasser et al., MOS Device Electronics, The Design and Analysis of VLSI Circuits, Chapter 2, 67-163, 1998, Addison-Wesley Publishing Company.

Bhattacharyya et al., FET Gate Structure for Nonvolatile N-Channel Read-Mostly Memory Device, IBM Technical Disclosure Bulletin, Nov. 1975, 1768, vol. 18, No. 6.

Ricco et al., Nonvolatile Multilevel Memories for Digital Applications, Dec. 1998, 2399-2421, vol. 86, No. 12, Institute of Electrical and Electronics Engineers, Inc.

Martin, Improved Circuits for the Realization of Switched-Capacitor Filters, IEEE Transactions on Circuits and Systems, Apr. 1980, 237-244, vol. CAS-27.

Tseng et al., "Thin CVD Stacked Gate Dielectric for ULSI Technology", IEEE, pp. 321-214; 1993, 13.1.1-13.1.4.

Pickar, Ion Implementation is Silicon—Physics, Processing, and Microelectronic Devices, Applied Solid State Science, 1975, 151-241, vol. 5, Academic Press.

2 Bit/Cell EEPROM Cell Using Band-To-Band Tunneling for Data Read-Out, IBM Technical Disclosure Bulletin, 1992, 136-140, vol. 35 No. 4B.

Umezawa, et al., A 5-V-Only Operation 0.6μm Flash EEPROM with Row Decoder Scheme in Triple-Well Structure, IEEE Journal of Solid-State Circuits, 1992, 1540, vol. 27.

Mitchell, et al., A new self-aligned planar array cell for ultra high density EPROMS, 1987.

Esquivel, et al, High Density Contactless, Self Aligned EPROM Cell Array Technology, 1986.

Johns, Martin, Analog Integrated Circuit Designl, Jun. 1, 1997, Chapter 10, John Wiley and Sons Inc.

Allen, et al., CMOS Analog Circuit Design, 2002, 259pages, Oxford University Press.

Klinke, et al., A very-high-slew-rate CMOS operational amplifier, IEEE Journal of Solid-State Circuits, 1989, 744-746, 24 vol.

Shor, et al, paper WA2.04.01—Self regulated Four phased charge pump with boosted wells, ISCAS 2002.

Fotouhi, An efficient CMOS line driver for 1.544-Mb/s T1 and 2.048-Mb/s E1 applications, IEEE Journal of Solid-State Circuits, 2003, 226-236pages, 38vol.

P-N Junction Diode, Physics of semiconductor devices, 1981, ch. 2, "A Wiley-Interscience Publication", John Wiley & Sons Publishers.

Chang, Non Volatile Semiconductor Memory Devices, Proceedings of the IEEE, 64 vol., No. 7, pp. 1039-1059; Jul. 1976.

Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.

4 Bits of Digital Data Fit in a Single Cell, Technology Newsletter, Electronic Design, Apr. 1, 1996.

M. Specht et al, Novel Dual Bit Tri- Gate Charge Trapping Memory Devices, IEEE Electron Device Letters, vol. 25, No. 12, Dec. 2004, pp. 810-812.

"Design Considerations in Scaled SONOS Nonvolatile Memory Devices" Bu, Jiankang et al., Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.

"SONOS Nonvolatile Semiconductor Memories for Space and Military Applications", Adams et al., Symposium, 2000. http://klabs.org/richcontent/MemoryContent/nvmt_symp/nvmts_2000/papers/adams_d.pdf.

"Philips Research—Technologies—Embedded Nonvolatile Memories" http://research.philips.com/technologies/ics/nvmemories/index.html.

"Semiconductor Memory: Non-Volatile Memory (NVM)", National University of Singapore, Department of Electrical and Computer Engineering: http://ece.nus.edu.sg/stfpage/elezhucx/myweb/NVM.pdf.

"Saifun Non-Volatile Memory Technology", 1st Edition, 2005, published and written by Saifun Semiconductors Ltd. 1110 pgs.

* cited by examiner

DENSE NON-VOLATILE MEMORY ARRAY AND METHOD OF FABRICATION

CROSS-REFERENCE TO RELATED APPLICATIONS

This application claims benefit from U.S. Provisional Patent Application No. 60/699,857, filed Jul. 18, 2005, from U.S. Provisional Patent Application No. 60/739,426, filed Nov. 25, 2005, and from U.S. Provisional Patent Application No. 60/800,022, filed May 15, 2006, all of which are hereby incorporated in their entirety by reference.

FIELD OF THE INVENTION

The present invention relates to non-volatile memory cells generally and to a method of fabrication thereof in particular.

BACKGROUND OF THE INVENTION

Dual bit memory cells are known in the art. One such memory cell is the NROM (nitride read only memory) cell 10, shown in FIG. 1 to which reference is now made, which stores two bits 12 and 14 in a nitride based layer 16, such as an oxide-nitride-oxide (ONO) stack, sandwiched between a polysilicon word line 18 and a channel 20. Channel 20 is defined by buried bit line diffusions 22 on each side which are isolated from word line 18 by a thermally grown oxide layer 26, grown after bit lines 22 are implanted. During oxide growth, bit lines 22 may diffuse sideways, expanding from the implantation area.

NROM cells are described in many patents, for example in U.S. Pat. No. 6,649,972, assigned to the common assignees of the present invention, whose disclosure is incorporated herein. Where applicable, descriptions involving NROM are intended specifically to include related oxide-nitride technologies, including SONOS (Silicon-Oxide-Nitride-Oxide-Silicon), MNOS (Metal-Nitride-Oxide-Silicon), MONOS (Metal-Oxide-Nitride-Oxide-Silicon) and the like used for NVM devices. Further description of NROM and related technologies may be found at "Non Volatile Memory Technology", 2005 published by Saifin Semiconductor and materials presented at and through http://siliconnexus.com, "Design Considerations in Scaled SONOS Nonvolatile Memory Devices" found at:
http://klabs.org/richcontent/MemoryContent/nvmt_symp/nvmts_2000/presentations/bu_white_sonos_lehigh_univ.pdf, "SONOS Nonvolatile Semiconductor Memories for Space and Military Applications" found at:
http://labs.org/richontent/MemoryContent/nvmt_000/papers/adams_d.pdf, "Philips Research—Technologies—Embedded Nonvolatile Memories" found at: http://research.philips.com/technologies/ics/nvmemories/index.html, and "Semiconductor Memory: Non-Volatile Memory (NVM)" found at: http://ece.nus.edu.sg/stfpage/elezhucx/myweb/NVM.pdf, all of which are incorporated by reference herein in their entirety.

As shown in FIG. 2, to which reference is now briefly made, NROM technology employs a virtual-ground array architecture with a dense crisscrossing of word lines 18 and bit lines 22. Word lines 18 and bit lines 22 optimally can allow a 4 $F^2$ size cell, where F designates the minimum feature size of an element of the chip for the technology in which the array was constructed. For example, the feature size for a 65 nm technology is F=65 nm.

For NROM cells, the minimum length of a cell is 2 F, being the minimum length (1 F) of a bit line 22 plus the minimum length (1 F) of a spacing 23 between bit lines 22. The minimum width of a cell is also 2 F, being the minimum width (1 F) of a word line 18 plus the minimum width (1 F) of a spacing 19 between word lines 18. Thus, the theoretical minimum area of a cell is 4 $F^2$.

It should be noted, that it is possible to create bit lines 22 of less than 1 F, but in such cases the length of associated spacing 23 must be increased by a corresponding amount, such that the total length of a bit line 22 and an associated spacing 23 must be at least 2 F. Similarly, it is possible to create word lines 18 of less than 1 F, but in such cases the width of associated spacing 19 must be increased by a corresponding amount, such that the total width of a word line 18 and an associated spacing 19 must be at least 2 F.

Unfortunately, most NROM technologies which use the more advanced processes of less than 170 nm (where F=0.17 μm) employ a larger cell, of 5-6 $F^2$ due to the side diffusion of the bit lines which required a bit line spacing of about 1.6 F.

There exists a dual polysilicon process (DPP) for the NROM cell, where a first polysilicon layer is deposited and etched in columns between which bit lines 22 are implanted. Word lines 18 are then deposited as a second polysilicon layer, cutting the columns of the first polysilicon layer into islands between bit lines 22. Before creating the second polysilicon layer, bit line oxides are deposited between the first polysilicon columns, rather than grown as previously done. The result are bit line oxides that remain within the feature size of the polysilicon columns. In some DPP processes, spacers are created on the sides of the first polysilicon columns, which reduces the space for the bit lines. This enables the bit lines to be thinner than 1 F. For example, bit lines 22 might be 0.7 F while the columns between them might be 1.6 F. This produces a width of 2.3 F and a resultant cell area of 4.6 $F^2$, which is closer to the theoretical minimum of 4 $F^2$ than for prior processes, but still not there. Approaching the theoretical minimum is important as there is a constant push in industry to put more features into the same real estate.

SUMMARY OF THE PRESENT INVENTION

An object of the present invention is to, at least, increase the density of memory arrays.

There is therefore provided, in accordance with a preferred embodiment of the present invention, a non-volatile memory array with word lines and bit lines generally perpendicular to the word lines, and with a pitch between two neighboring word lines of less than 2 F.

Moreover, in accordance with a preferred embodiment of the present invention, the pitch between two neighboring word lines is between 1 F and 2 F.

Further, in accordance with a preferred embodiment of the present invention, the array is a NROM (nitride read only memory) array.

Still further, in accordance with a preferred embodiment of the present invention, the word lines are formed from polysilicon spacers and are at least 0.1 F wide.

Moreover, in accordance with a preferred embodiment of the present invention, the distance from a first word line to a second word line two away from the first word line is 2 F.

Additionally, in accordance with an alternative preferred embodiment of the present invention, the pitch is comprised of a word line width and a word line spacing, and a minimum spacing is electrically limited to the point at which a dielectric between neighboring word lines breaks down. In one embodiment, the dielectric is oxide-nitride-oxide.

Additionally, there is provided, in accordance with a preferred embodiment of the present invention, a non-volatile memory array with an array of memory cells each of whose area is less than 4 $F^2$ per cell (where F is a minimum feature size) and periphery elements to control the memory cells.

Moreover, in accordance with a preferred embodiment of the present invention, the cells are NROM cells.

Further, in accordance with a preferred embodiment of the present invention, the array includes gates of rows of the memory cells that are formed together into word lines and the word lines are formed from polysilicon spacers.

Still further, in accordance with a preferred embodiment of the present invention, the word lines are at least 0.1 F wide and a pitch from a first word line to a neighboring word line is less than 2 F.

Further, in accordance with an alternative preferred embodiment of the present invention, the word line width is at least 0.5 F and the spacing is less than 0.5 F.

There is provided, in accordance with a preferred embodiment of the present invention, a non-volatile memory array with polysilicon spacer word lines and bit lines generally perpendicular to the word lines.

Further, in accordance with a preferred embodiment of the present invention, the spacer word lines are at least 0.1 F wide.

Still further, in accordance with a preferred embodiment of the present invention, the width of the word lines is less than 1 F.

Moreover, in accordance with a preferred embodiment of the present invention, the word lines generally pass low programming currents.

Additionally, in accordance with a preferred embodiment of the present invention, a distance from a first word line to a word line two away from said first word line is 2 F.

There is provided, in accordance with a preferred embodiment of the present invention, a method for word-line patterning of a non-volatile memory array. The method includes generating word line retaining walls and generating polysilicon spacer word lines to the sides of said retaining walls.

Further, in accordance with a preferred embodiment of the present invention, the method also comprises removing the retaining walls and depositing oxide between the spacer word lines.

Still further, in accordance with a preferred embodiment of the present invention, the retaining walls are formed of nitride.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
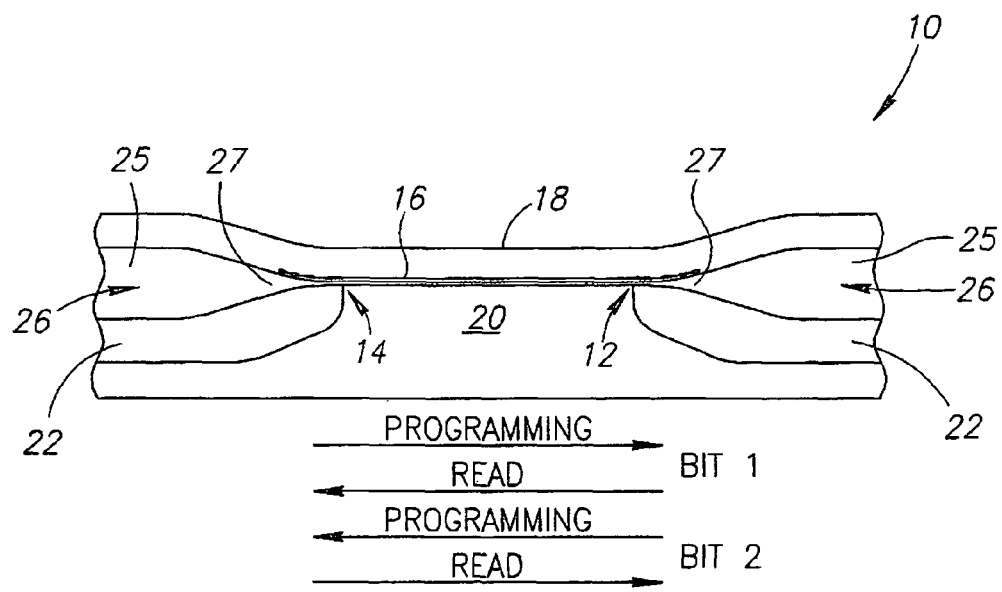
FIG. 1 is a schematic illustration of an NROM memory cell.
Figure 2:
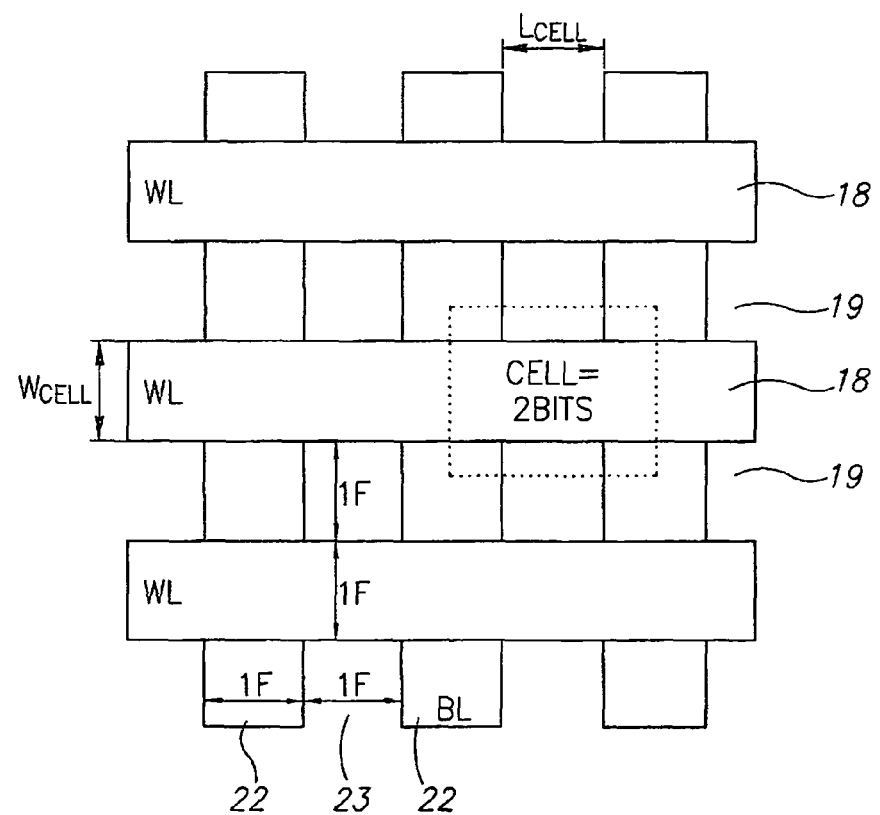
FIG. 2 is a schematic illustration of a layout of the cell of FIG. 1.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The present invention may provide an increased number of bits per given area over the prior art. In general, increasing the density of the cells increases the number of bits in a given area. One way to increase the density is to reduce the length of the cells. Another method to increase density is to utilize the space between word lines to insert more word lines. In an ideal situation, the cell size may be reduced by half by having 2 word lines in an opening of 2 F (resulting in 1 word line in a 1 F pitch). Such a "double density" array may store twice as much data.

Applicants have realized that such a double density array generates cells significantly smaller than the 4 $F^2$ minimum size of the prior art. It further reduces the pitch between word lines to less than the 2 F minimum of the prior art.

Applicants have realized that there may be more than one way to create such a double density array. The present application may therefore comprise more than one preferred embodiment for such creation.

In the first such preferred embodiment, shown in FIGS. 3-10D, a self aligning process may be used to generate sub-1 F word lines from an initial mask generated by a standard lithographic process. Word line spacings may also be sub-1 F and may be filled with a dielectric.

In an alternative preferred embodiment, discussed with respect to FIGS. 11A-26B, sub-1 F word lines may be generated using spacer technology.

Self-Aligning Embodiment

Figure 3:
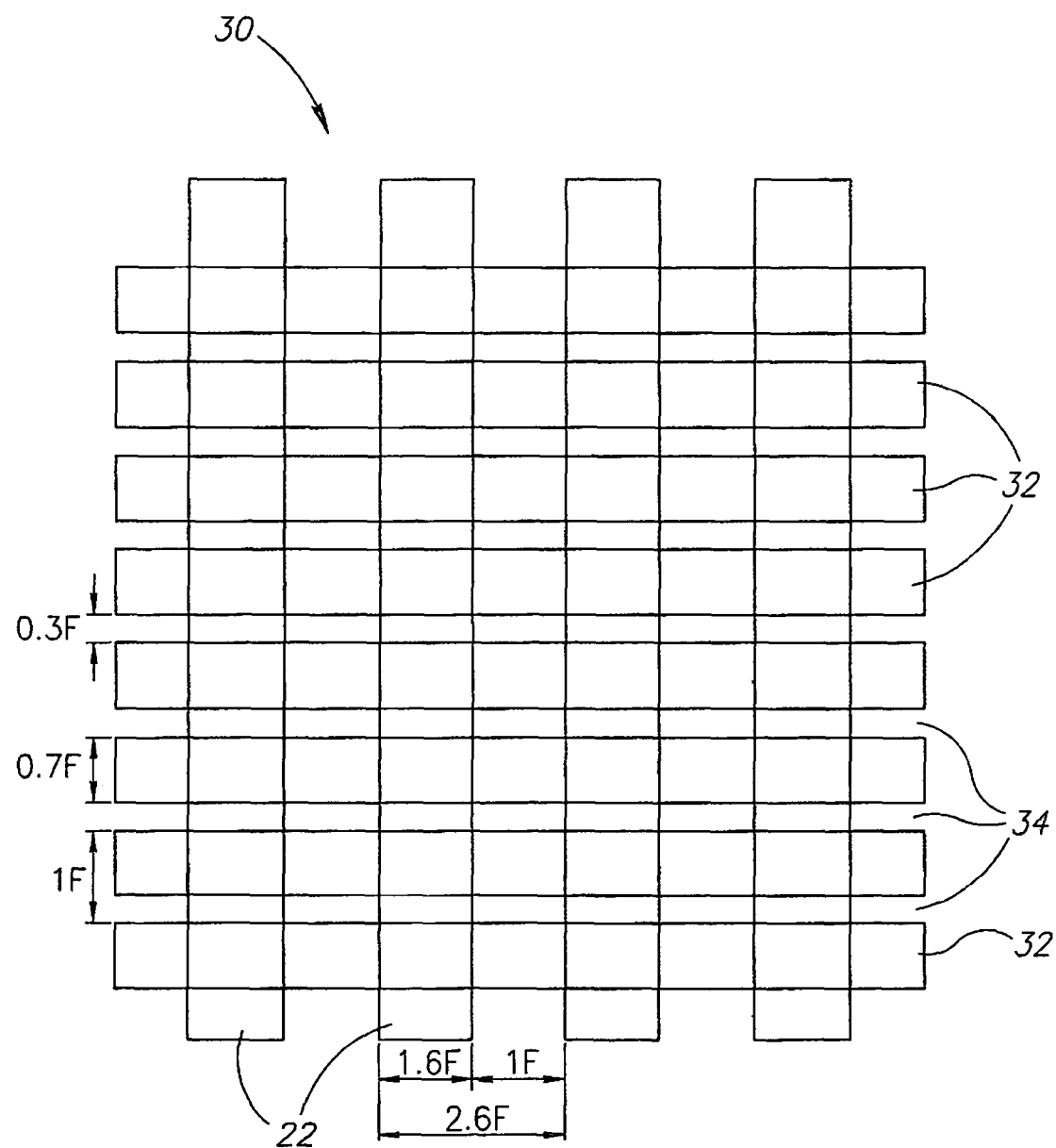
FIG. 3 is a schematic illustration of a layout of an array, constructed and operative in accordance with a preferred embodiment of the present invention.

Reference is now made to FIG. 3, which illustrates a novel, dense array 30, constructed and operative in accordance with the first preferred embodiment of the present invention. Array 30 may reduce the minimum size of a memory cell, by providing sub-minimum-feature-size, "sub-1 F", word lines 32 and word line spacings 34 (resulting in a word line width that is less than 1 F and a spacing that is less than 1 F). For example, in FIG. 3, word line spacings 34 are shown as an exemplary 0.3 F. Because word line spacings 34 may be so narrow, they may be filled with a dielectric, such as ONO, nitride or oxide.

Word lines 32 may also be thin (of sub-F width). In FIG. 3, the width of word lines 32 is shown as 0.7 F. It will be appreciated that the widths of word lines 32 and spacings 34 in FIG. 3 are exemplary; other sub-F widths are possible and are included in the present invention. For example, for a 1 F pitch (which includes the word line width together with the spacing), spacings 34 may be 0.4 F wide and word lines 32 might be 0.6 F wide. For a 1.2 F pitch, spacings 34 might be 0.4 F and word lines 32 might be 0.8 F. Alternatively, spacings 34 might be 0.3 F wide and word lines 32 might be 0.9 F wide. It will be appreciated that, in all of the above examples, there is a substantial reduction of the word line spacing and a smaller reduction of the word line width.

It will also be appreciated that, in the present invention, the widths of word lines 32 and spacings 34 are not required to be the same. In FIG. 3, word lines 32 are wider than word line spacings 34. However, the pitch for word lines 32 may be 1 F and the minimum spacing between word lines may be electrically limited to the point at which the dielectric between word lines 32 breaks down.

For example, oxide breakdown is 9-11 MV/cm, which, for a 10V voltage drop between word lines during programming or erasing, may occur with a dielectric thickness of about 10 nm. Thus, for this type of dielectric, a minimal width for word line spacing 34 may be 10 nm. For reliability and quality purposes, such a minimal word line spacing may be increased to 15 nm.

Assuming a pitch of 2.6 F between bit lines 22, as is possible for dual polysilicon process (DPP) type memory cells and as shown in FIG. 3, the cell size of the example in FIG. 3 may be 2.6 F×1 F=2.6 F², a considerably smaller size than in the prior art. It will be appreciated that the minimum cell size for the present invention is 2 F×1 F=2 F².

It will be appreciated that the present invention may also be implemented in non-DPP type memory cells, and also for non-NROM type memory cells. Furthermore, the memory cells may store 2 bits or 4 bits, with no change in the basic physics and operating mode of the cell.

In accordance with a preferred embodiment of the present invention and as will be shown hereinbelow, sub-F elements may be generated from elements which are the minimum feature size F or larger. As will be described hereinbelow, the present invention utilizes common lithographic concepts to generate such small features.

Figure 4A:
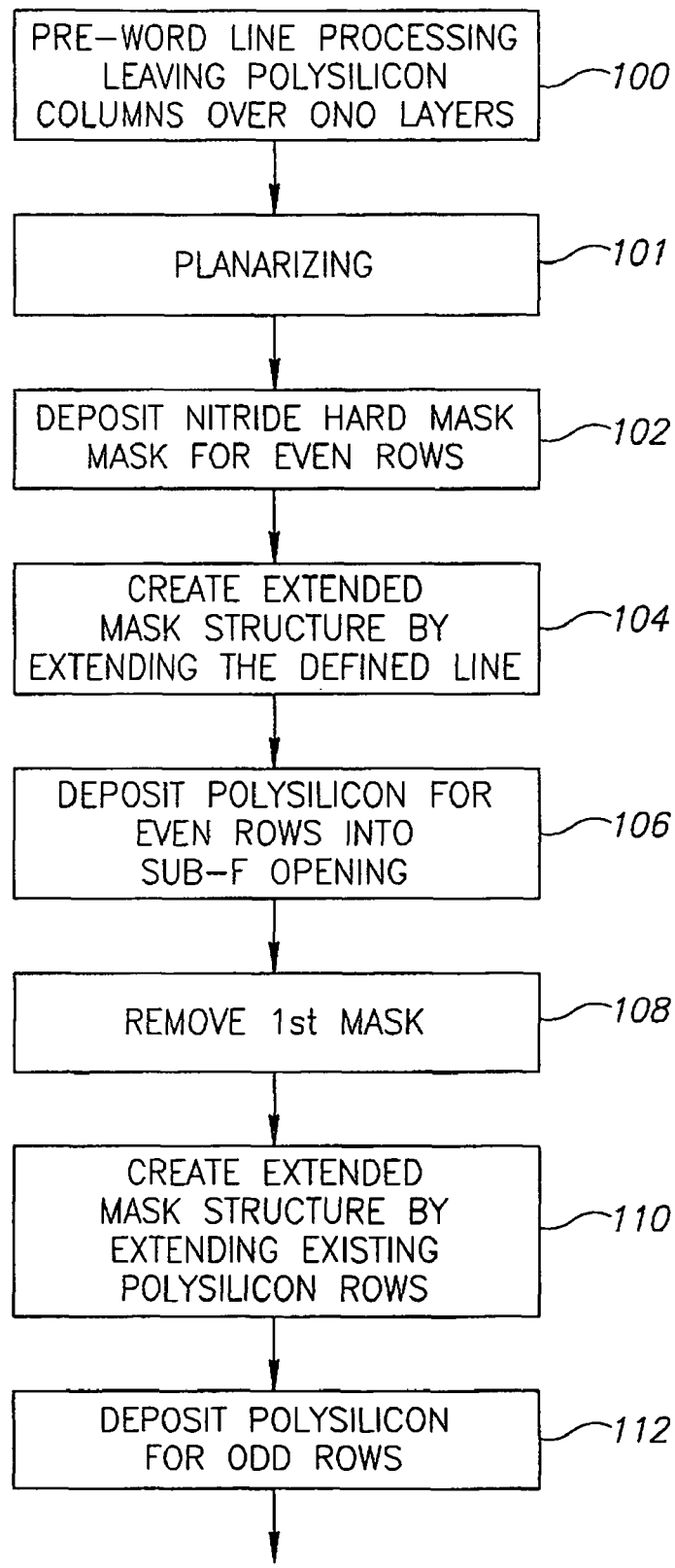
FIGS. 4A and 4B are flow chart illustrations of a word-line patterning method for creating the array of FIG. 3, constructed and operative in accordance with a preferred embodiment of the present invention.
Figure 4B:
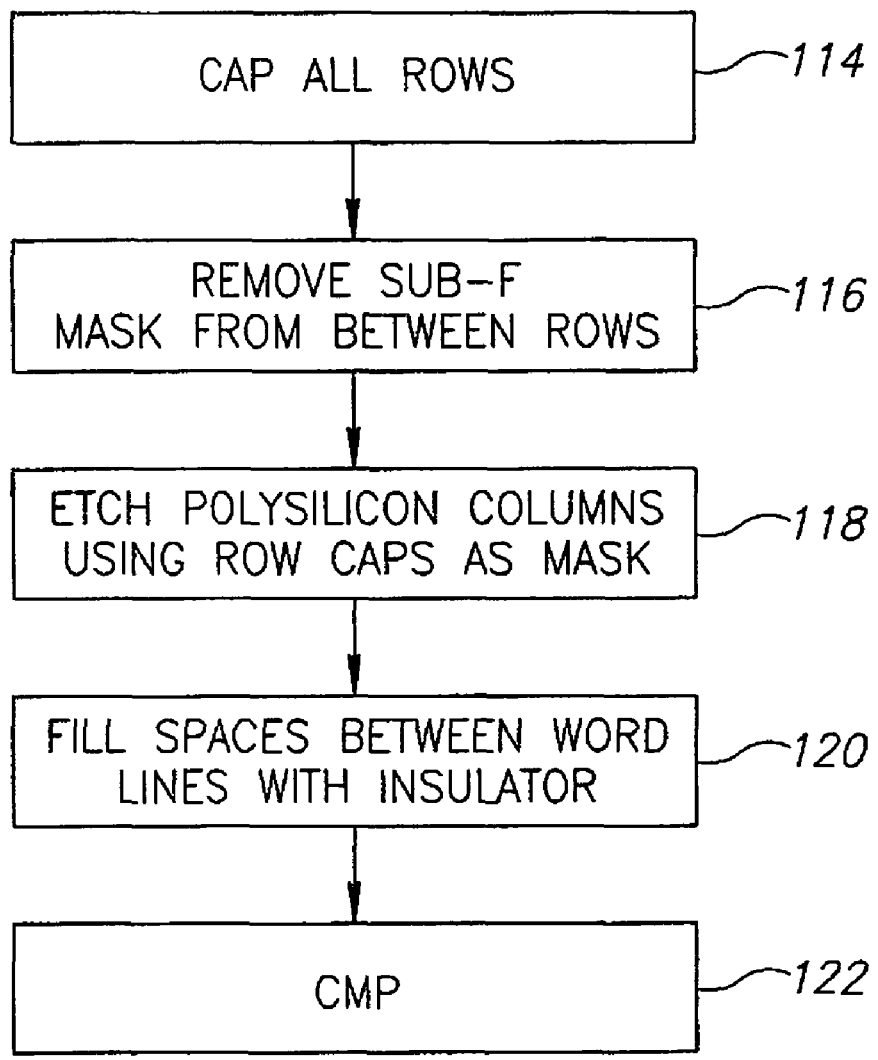

Reference is now made to FIGS. 4A and 4B, which illustrate the process and to FIGS. 5A and 5B and 6A-6M, which illustrate various steps within the process of FIGS. 4A and 4B.

The process begins, in step 100, with the process steps prior to word line patterning. The process steps may be any suitable set of steps, an exemplary set of which are described herein below with respect to FIG. 7. Other suitable DPP type process steps may be found in the following applications assigned to the common assignees of the present invention, which applications are incorporated herein by reference: U.S. patent application Ser. No. 11/247,733 filed Oct. 11, 2005, U.S. patent application Ser. No. 11/336,093 filed Jan. 20, 2006 and U.S. patent application Ser. No. 11/440,624, filed May 24, 2006.

Figure 5A:
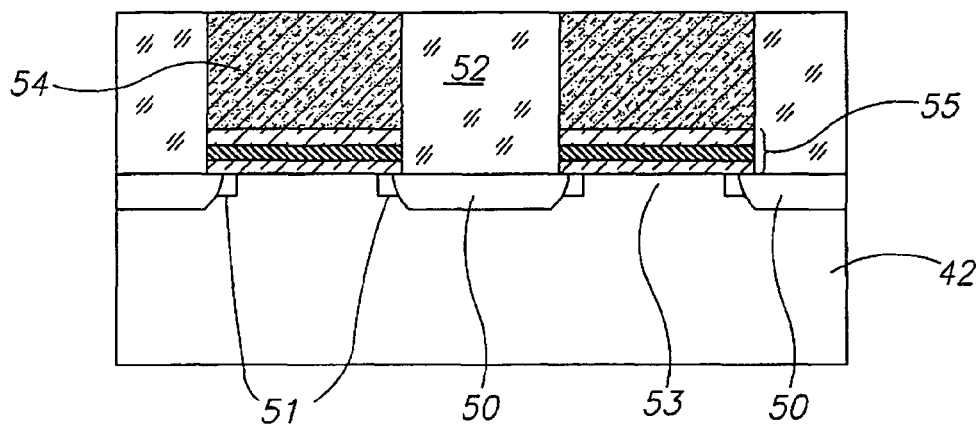
FIGS. 5A, 5B, 6A, 6B, 6C, 6D, 6E, 6F, 6G, 6H, 6I, 6J, 6K, 6L and 6M are schematic illustrations of various steps within the process of FIGS. 4A and 4B.

An exemplary cross-section of the memory array is shown in FIG. 5A. Columns of bit lines 50 and pocket implants 51 may be implanted into a substrate 42. Above bit lines 50 may be squared bit line oxides 52. Channels 53 may be formed between bit lines 50 and columns of ONO elements 55 may be formed above channels 53 and between bit line oxides 52. Columns 54 of polysilicon, of a first polysilicon layer, may be formed above ONO elements 55 and may protect ONO elements 55 during the word line patterning described hereinbelow. Columns 54 may be formed of polysilicon or, alternatively, of polysilicon with oxide or nitride spacers (or a combination thereof) on their sides.

In accordance with a preferred embodiment of the present invention, the memory array may be planarized (step 101) prior to beginning word line patterning. An exemplary planarizing operation may be chemical-mechanical polishing (CMP). Thus, columns 54 of polysilicon and columns 52 of bit line oxides may, together, provide a flat surface for word line patterning. In one embodiment, polysilicon columns 54 may be deposited to 60 nm and may be planarized down to 55 nm; however, in alternative embodiments, polysilicon columns may have an initial thickness of 30-100 nm.

With polysilicon columns 54 protecting ONO elements 55, the word line patterning may begin. In accordance with a preferred embodiment of the present invention, the word lines may be generated as rows first, perpendicular to polysilicon columns 54, which may be separated into two interleaved types. For ease of discussion, the rows will be called here "even" rows and "odd" rows. The present discussion will show the creation of the even rows first, it being appreciated that the odd rows may be created first just as easily. Once both sets of rows are generated, the word lines may be created therefrom. It will be appreciated that, since the two sets of rows are not created at the same time, they may have slightly different widths.

Figure 5B:
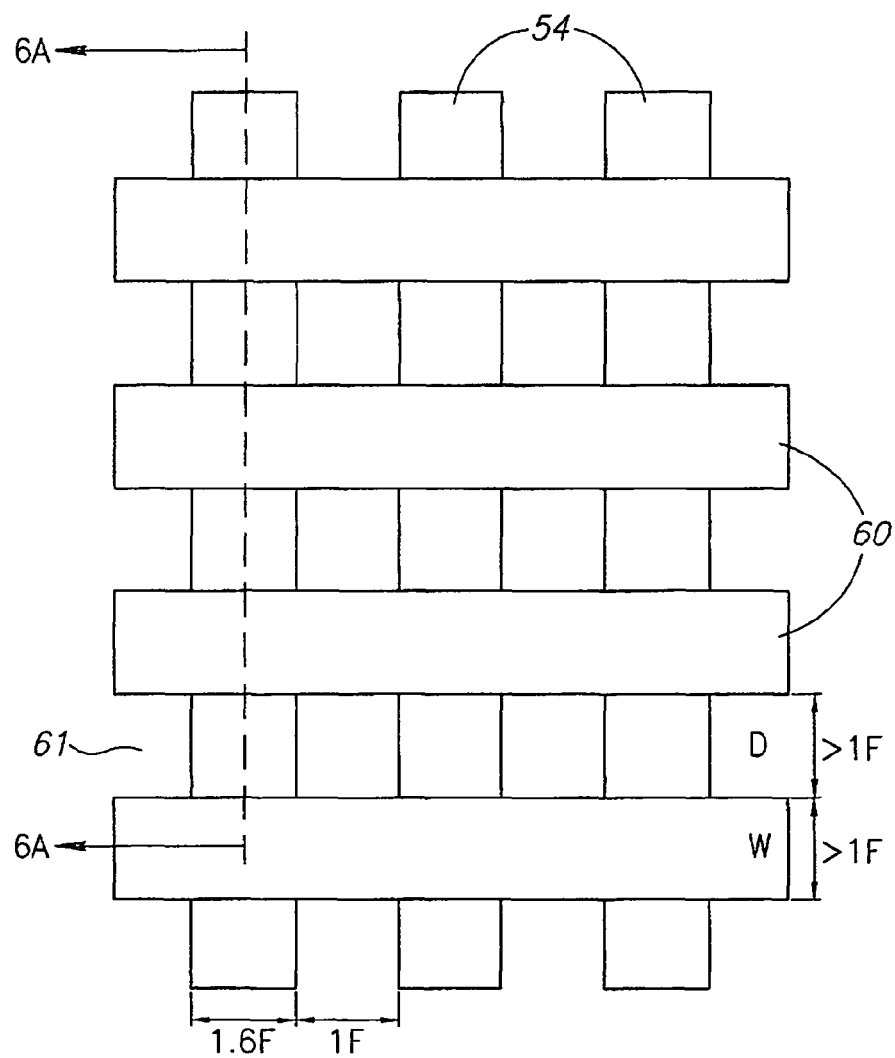

To create the even rows, a first mask, such as a nitride hard mask, may be deposited (step 102) on the array and may be patterned into rows 60. FIG. 5B is a plan view of the array, showing polysilicon columns 54 and rows 60 of the first mask. As can be seen, polysilicon columns 54 are of width 1.6 F and are separated by a distance of 1 F while rows 60 may be of a mask width W of 1 F or more and may be separated from its neighbor by a spacing D of 1 F or larger, defining openings 61. For the example described hereinbelow, for a 63 nm technology, mask width W is 75 nm (which is larger than the minimum feature size of 63 nm) and spacing D is 75 nm. Alternatively, mask width W might be 100 nm and spacing D might also be 100 nm. In another embodiment, mask width W might be 63 nm and spacing D might be 63 nm. In general, mask width W and spacing D are the same but this is not required.

Figure 6A:
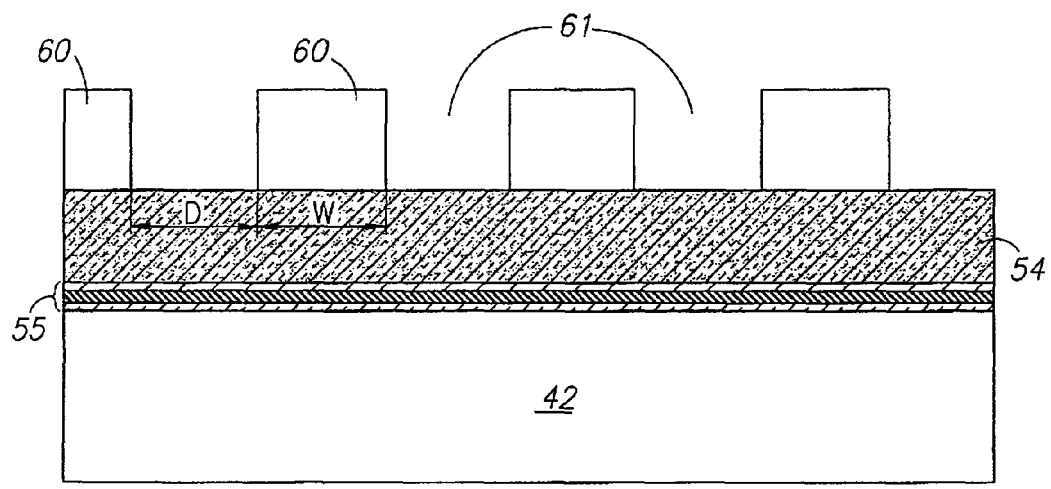

FIG. 6A is a cross-sectional view along one polysilicon column 54 of FIG. 5B. Thus, it shows polysilicon column 54 atop ONO layer 55 on top of substrate 42. Moreover, it shows even mask rows 60, in cross-section, above polysilicon column 54.

Figure 6B:
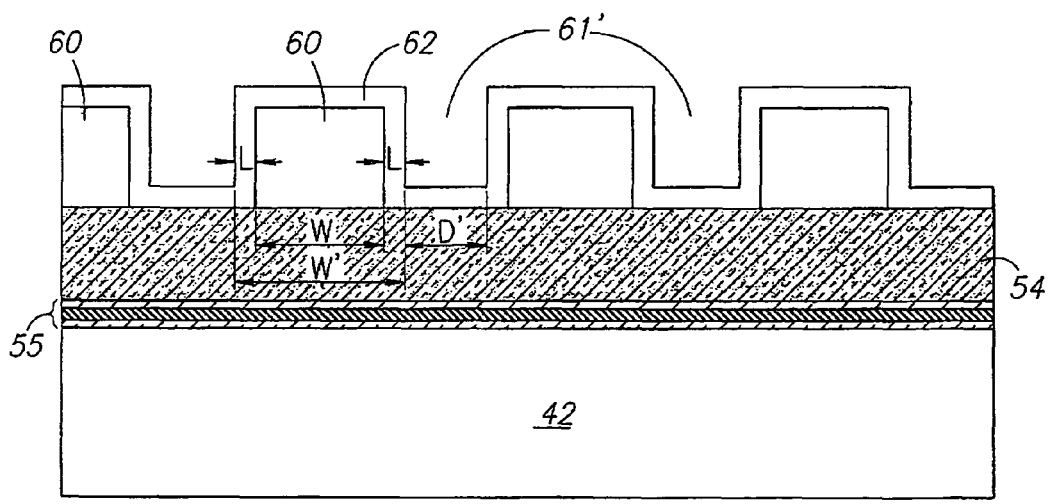
Figure 6C:
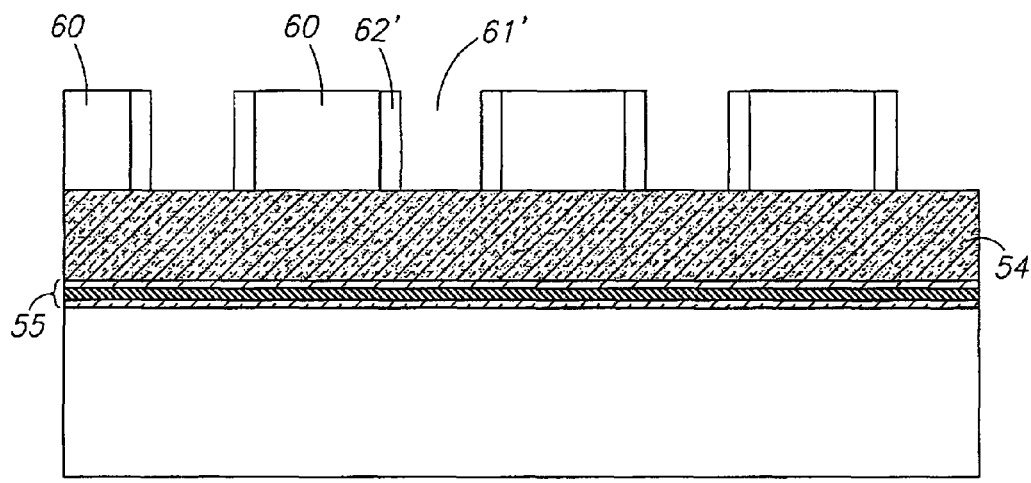
Figure 6D:
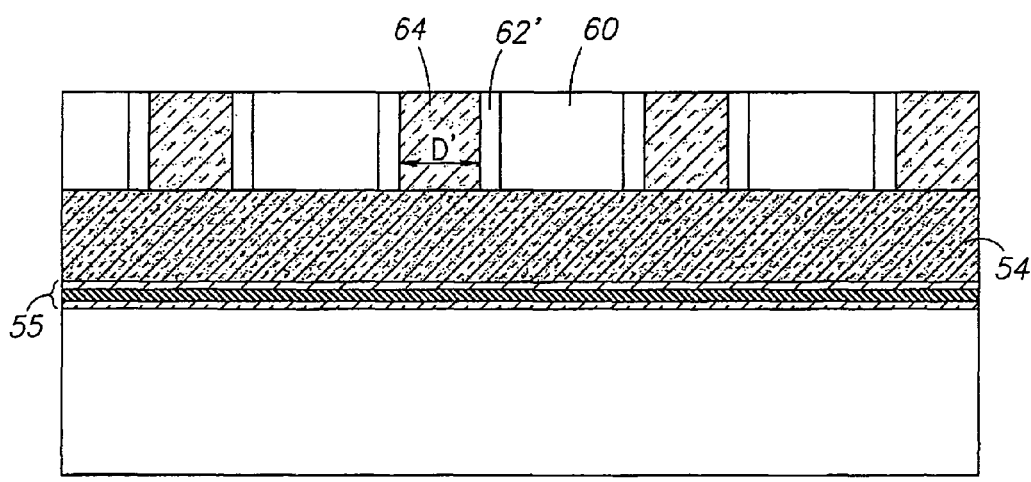
Figure 6E:
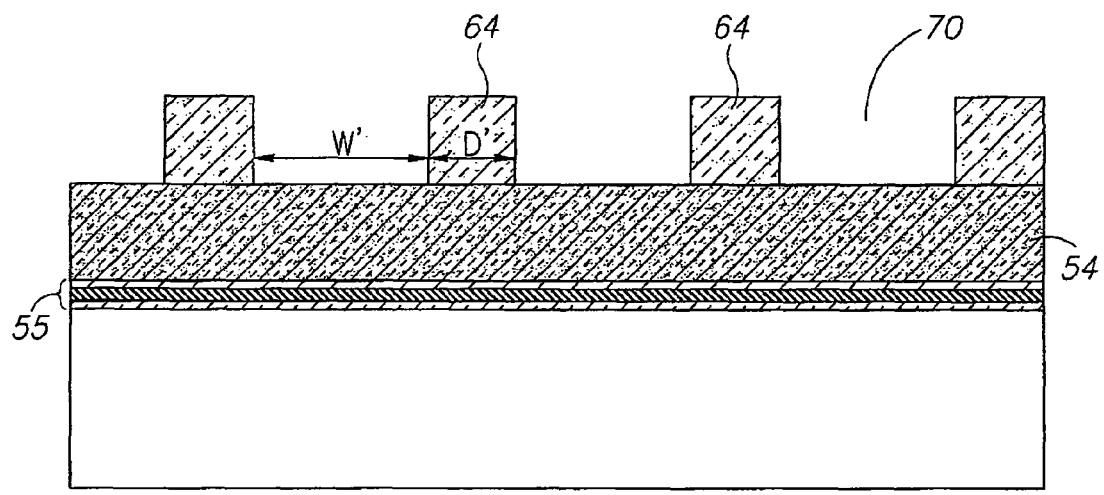

In step 104, an extended mask structure may be generated by extending mask width W of rows 60. For example, as shown in FIG. 6B, a liner 62, of width L, may first be deposited over rows 60 and, as shown in FIG. 6C, may then be etched back to generate spacers 62'. If the first mask is of nitride, then liner 62 (and the subsequent spacers 62') may also be of nitride. The spacer etch may be such to make spacers 62' with vertical sides and a planarization step may be performed later to make them flat. FIG. 6D shows them steep and rectangular.

Spacers 62' reduce the size of opening 61, now labeled 61', by twice the width L of liner 62. Thus, reduced opening 61' may be of a sub-F width D'=D−2 L. Similarly, spacers 62' may increase the mask width W of rows 60 to W'=W+2 L.

For the 75/75 mask width, liner 62 may be of width L=12.5 nm, which generates sub-F opening 61' of spacing D'=50 mm and extended mask width W' of 100 nm. It will be appreciated that sub-F openings 61' are not only smaller than the mask width rows 60 but also smaller than the minimum feature size F of 63 nm.

In step 106, polysilicon 64 may be deposited on the array to create the even rows. The polysilicon may cover the array and may fill sub-F openings 61'. The resultant array may be planarized, such as by a CMP process, to remove polysilicon 64 from everywhere but between spacers 62'. The CMP process may be continued to flatten spacers 62' as well. The CMP process may remove polysilicon 64 from the periphery as well.

It will be appreciated that the resultant polysilicon rows 64 are of width D', which is a sub-F width. In the 63 nm technology of FIG. 5, polysilicon rows 64 are a sub-F, 50 nm width.

With the even rows finished, the process may continue to the odd rows. Initially, the first mask may be removed (step 108). In the example, both rows 60 and spacers 62' are of nitride and thus, may be removed together with a nitride wet etch, leaving an extended opening 70 (shown in FIG. 6E) of width W'=W+2 L. In the present example, opening 70 may be of 100 nm. If the first mask is of a material other than nitride, then it may be removed with the appropriate etchant. The nitride (or other material) hard mask is also removed from the periphery during this step.

Figure 6F:
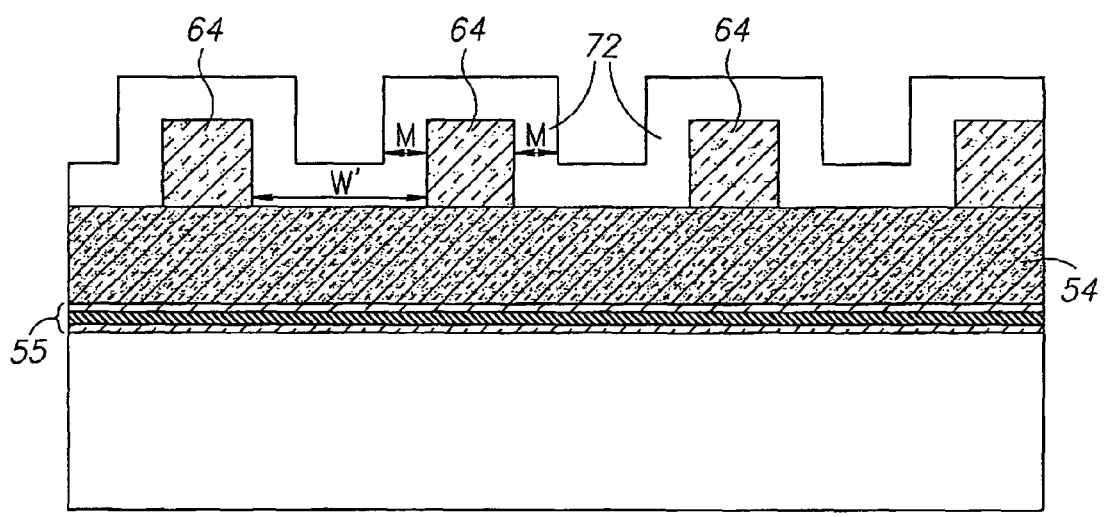
Figure 6G:
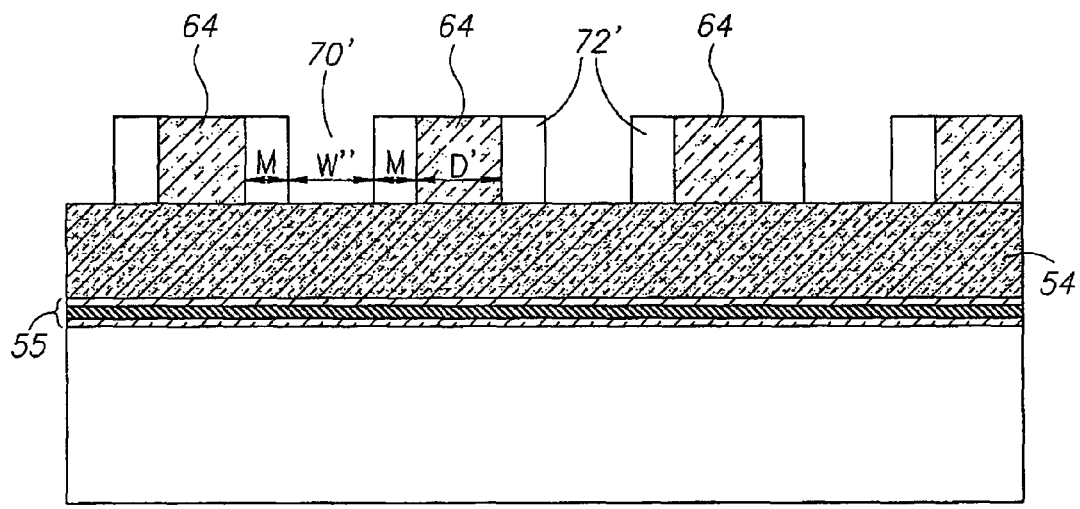

The openings for the odd rows may be generated (step 110) by creating another extended structure, this time from the existing even polysilicon rows 64. As shown in FIG. 6F, another liner, labeled 72, may be deposited on the array and may be etched back to a spacer 72' (FIG. 6G). Spacer 72' may be of nitride, as before, or of another material. For this mask, the spacer may be of sufficient width M to reduce extended opening 70 from extended width W' to a sub-F opening 70' whose width W''' may be generally equivalent to D', the width of even polysilicon rows 60. Typically, W'''=W'−2 M. Moreover, second spacer width M may typically be twice first spacer width L. For the present example, width M of liner 72 may be 25 nm. If a vertical wall spacer is desired, it may be generated through multiple deposition and etch processes.

Figure 6H:
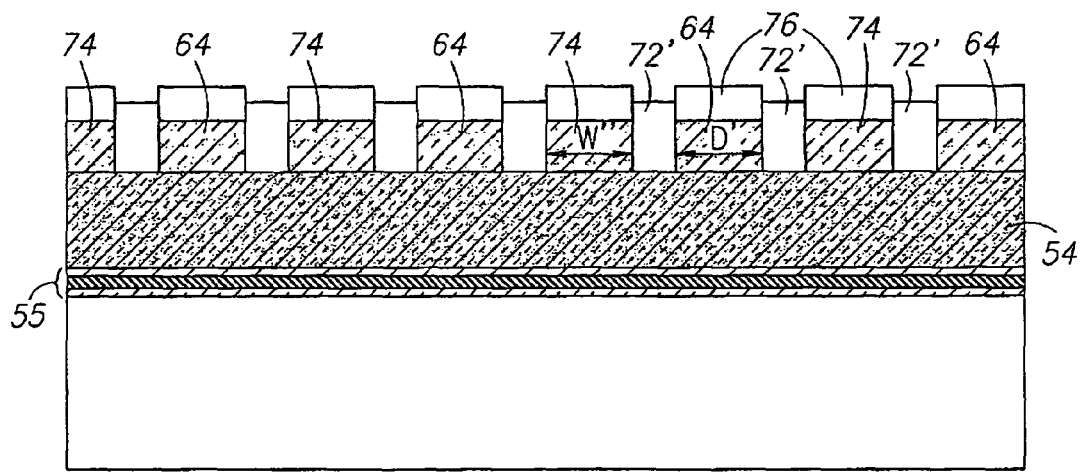
Figure 6I:
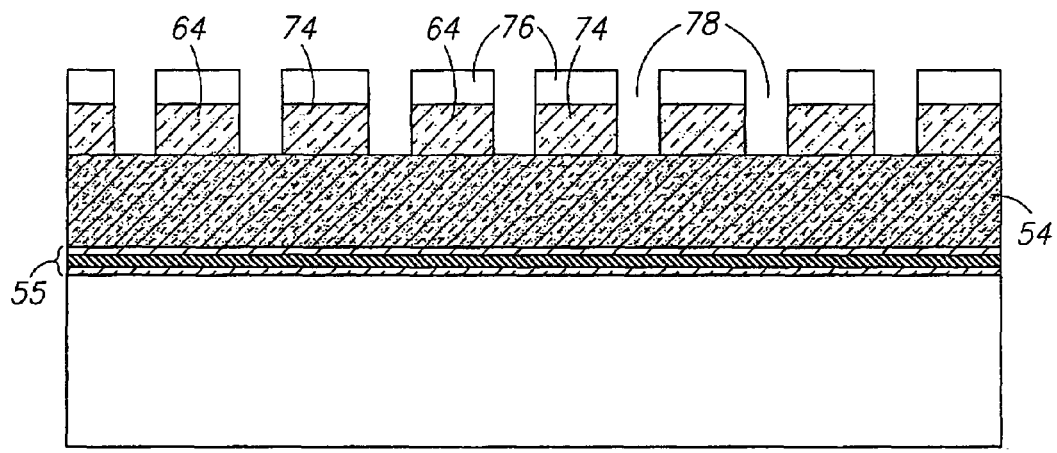

In step 112, polysilicon 74 may be deposited on the array to create the odd rows. As shown in FIG. 6H, polysilicon 74 may cover the array and may fill sub-F openings 70', resulting in alternating rows of polysilicon, even rows 64 alternating with odd rows 74. In the periphery, polysilicon layer 74 is on top of polysilicon layer 54, to form the polysilicon gates of the periphery transistors. The resultant array may be planarized, such as by a CMP process, to remove polysilicon 74 from everywhere in the array but between spacers 72'. The CMP process may consume and flatten some of spacers 72' as well.

It will be appreciated that, at this point, all of the rows (both even and odd) have been generated but the word lines have not been fully generated. In step 114, the rows may be capped with self-aligned oxide caps 76 (FIG. 6H) or some other etch resistant material. If an oxide cap is used, step 114 may be an oxidation step, for example, 20 nm of wet oxidation at 750° C., which may oxidize both polysilicon rows 64 and 74, as well as the polysilicon covering the periphery. Alternatively, polysilicon rows 64 and 74 may have metallized caps (created via a metallization step). For example, a self aligned Tungsten deposition process may be used or a silicidation of the polysilicon may be done to render it more resistant to etch. Once again, only polysilicon rows 64 and 74 and the polysilicon of the periphery will be metallized. As can be seen in FIG. 6H, caps 76 may combine with some of the polysilicon, thereby reducing the height of rows 64 and 74.

Caps 76 may now be utilized to define the word lines. First, the sub-F mask (spacers 72') may be removed (step 116) from between rows 64 and 74, leaving sub-F openings 78 (FIG. 6I) between rows 64 and 74. For nitride spacers, the removal process may be a nitride wet removal operation.

Figure 6J:
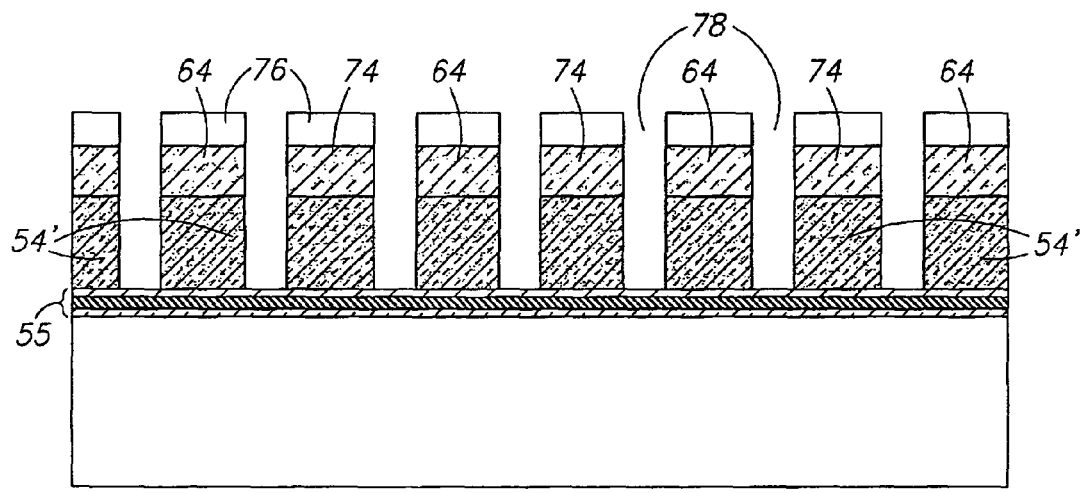

Next, polysilicon columns 54 may be etched (step 118) down to ONO layer 55, using caps 76 on each of polysilicon rows 64 and 74 as the hard mask. FIG. 6J shows one polysilicon column 54 of the previous figures etched into multiple islands, each marked 54'.

Figure 6K:
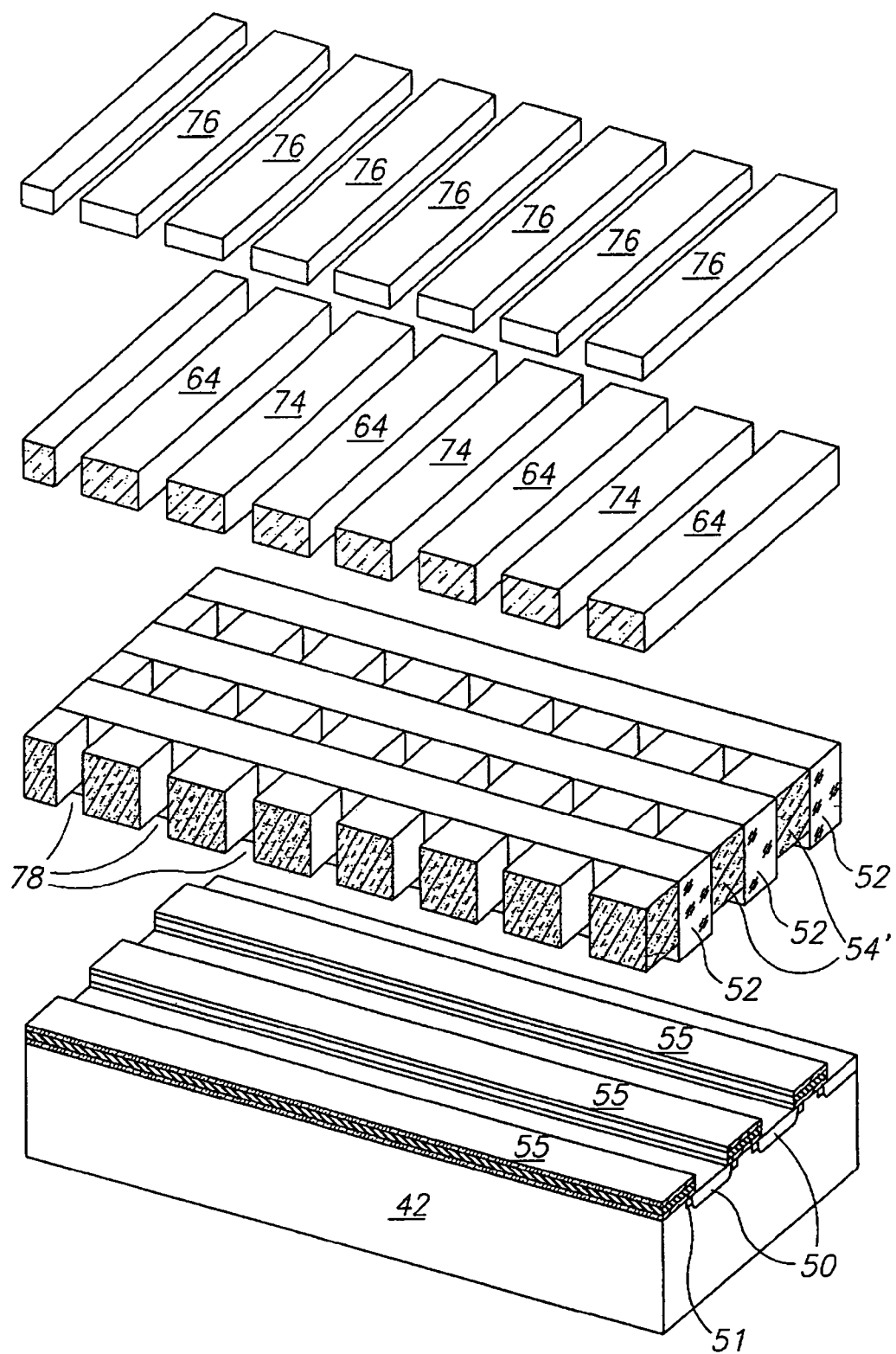

FIG. 6K, an expanded isometric view of FIG. 6J, shows the result of the polysilicon etch more clearly. The lowest layer is substrate 42 covered with three ONO columns 55 and the self-aligned bit lines 50 (with pocket implants 51) implanted into substrate 42. The second layer in FIG. 6K shows three bit line oxide columns 52 interlaced with what used to be three polysilicon columns 54 but are now etched into a multiplicity of polysilicon islands 54' which may form the gates of the cells. The fourth layer of FIG. 6K shows the alternating word line rows 64 and 74 and the top layer shows the rows of caps 76.

Figure 6L:
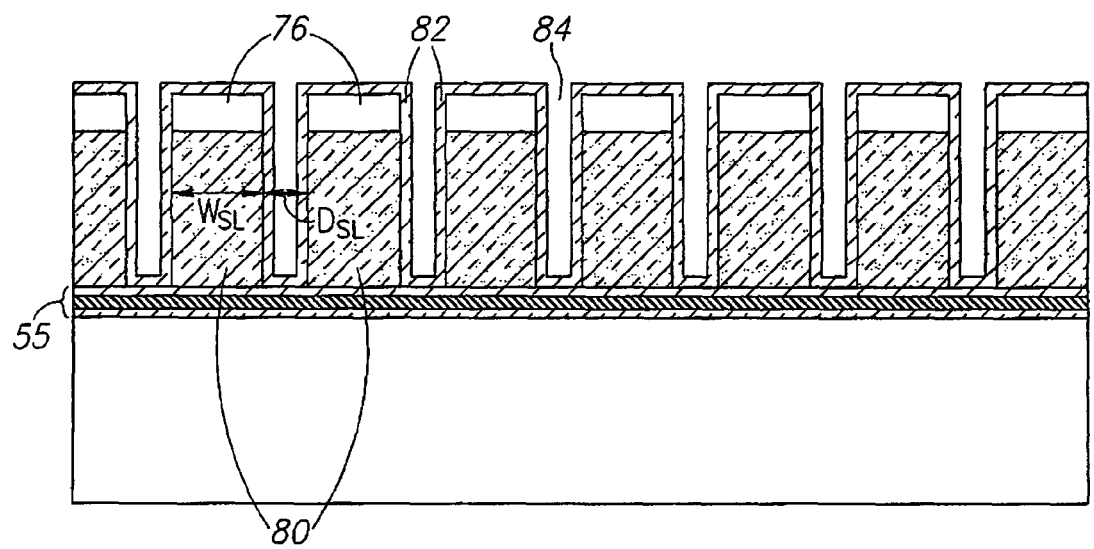
Figure 6M:
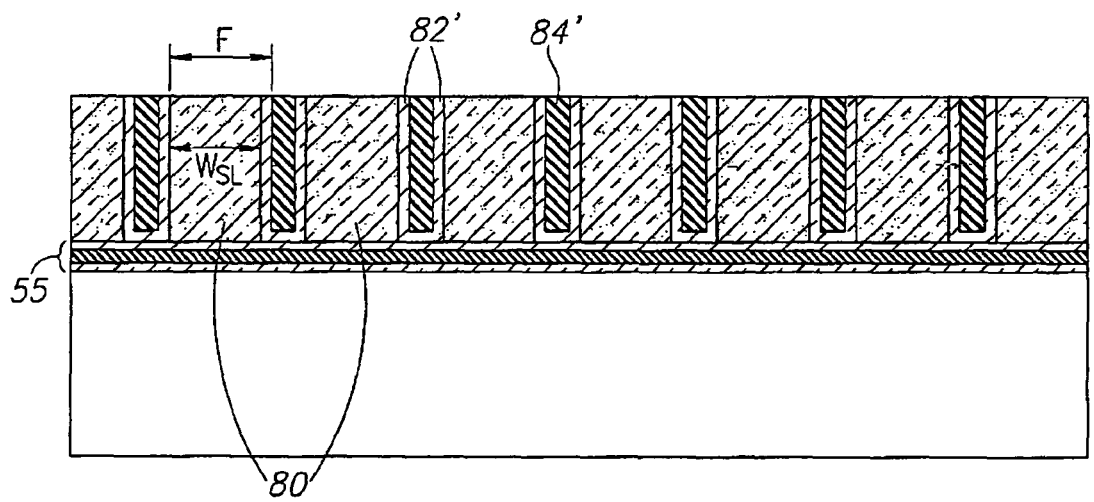

It will be appreciated that this polysilicon etching step is self-aligned, ensuring that the resultant word lines, labeled 80 in FIG. 6L, maintain the spacing defined by rows 64 and 74. It will further be appreciated that each word line 80 may be formed of one row 64 or 74 connecting gates 54' of first polysilicon. Finally, as can be seen from FIG. 6K, it will be appreciated that the polysilicon etch leaves bit line oxide columns 52 intact.

Returning to FIG. 6L, word lines 80 may have sub-F width $W_{s1}$ and may be separated by sub-F spacing $D_{s1}$, where $D_{s1}$=M and $W_{s1}$=W'''=D''. In the present example, sub-F width $W_{s1}$ is 50 nm and sub-F spacing $D_{s1}$ is 25 nm. Moreover, word lines 80 may have a height which is the combined height of polysilicon gates 54' and of polysilicon rows 64 and 74. For example, they might be 85 nm thick.

With word lines 80 defined, openings 78 (FIG. 6I) there between may be filled (step 120) with an insulator. One insulator may be of oxide and may be generated by depositing oxide onto the array. Another one, shown in FIG. 6L, may be an ONO dielectric and may be generated by first depositing an oxide liner 82, such as of 6 nm, following by deposition, into the remaining opening, of a nitride liner 84 of 13 nm. The ONO filler may have a lower defect density than the oxide. Furthermore, if there is a defect in the oxide portion of the ONO filler, the nitride may act to substantially reduce the leakage current between neighboring word lines.

Finally, the word line patterning may finish with a polishing step (step 122), such as a CMP step, which may remove the surface layers of liners 84 and 82 as well as caps 76. It may also remove some of polysilicon word lines 80. For example, the thickness of word lines 80 in the present example may be reduced to 80 nm. Alternatively, for metalized caps, the oxide or ONO may remain on top of the metal. The result for oxide caps, shown in FIG. 6M, may be a set of word lines 80 of sub-F width $W_{s1}$ separated by sub-F distances $D_{s1}$. It is noted that sub-F distances $D_{s1}$ may be less than half of feature size F while widths $W_{s1}$ may be greater than half of feature size F.

It will be appreciated that, since the even and odd word lines are not created in the same step, they may be of slightly different widths.

With the word lines generated, the manufacturing may continue as is known in the art.

It will be appreciated that the ratios discussed hereinabove are exemplary only. Any suitable sub-F word line width $W_{s1}$ and sub-F insulator width $D_{s1}$ between word lines may be created, from any original mask elements. For example, for the 63 nm technology, the following word line and insulator widths represent some of the elements which may be created from elements laid down by masks (listed as a width/space ratio):

| Lithography (W/D) (nm/nm) | Word line Width $W_{s1}$ (nm) | Insulator Spacing $D_{s1}$ (nm) | Word line pitch |
|---|---|---|---|
| 75/75 | 50 | 25 | 1.2 F |
| 75/75 | 40 | 35 | 1.2 F |
| 100/100 | 63 | 37 | 1.65 F |
| 63/63 | 40 | 23 | 1 F |

It will further be appreciated that the sub-F elements are generated from mask elements which are of minimum feature size F or larger. Moreover, the sub-F elements are all self-aligned—each one is generated from existing elements and not via lithography and thus, may scale with smaller lithographies.

It will further be appreciated that the method of the present invention may be utilized to generate feature-size word lines (of feature size F) with sub-F spacing. This can be done by staring with an appropriate starting pitch.

Figure 7:
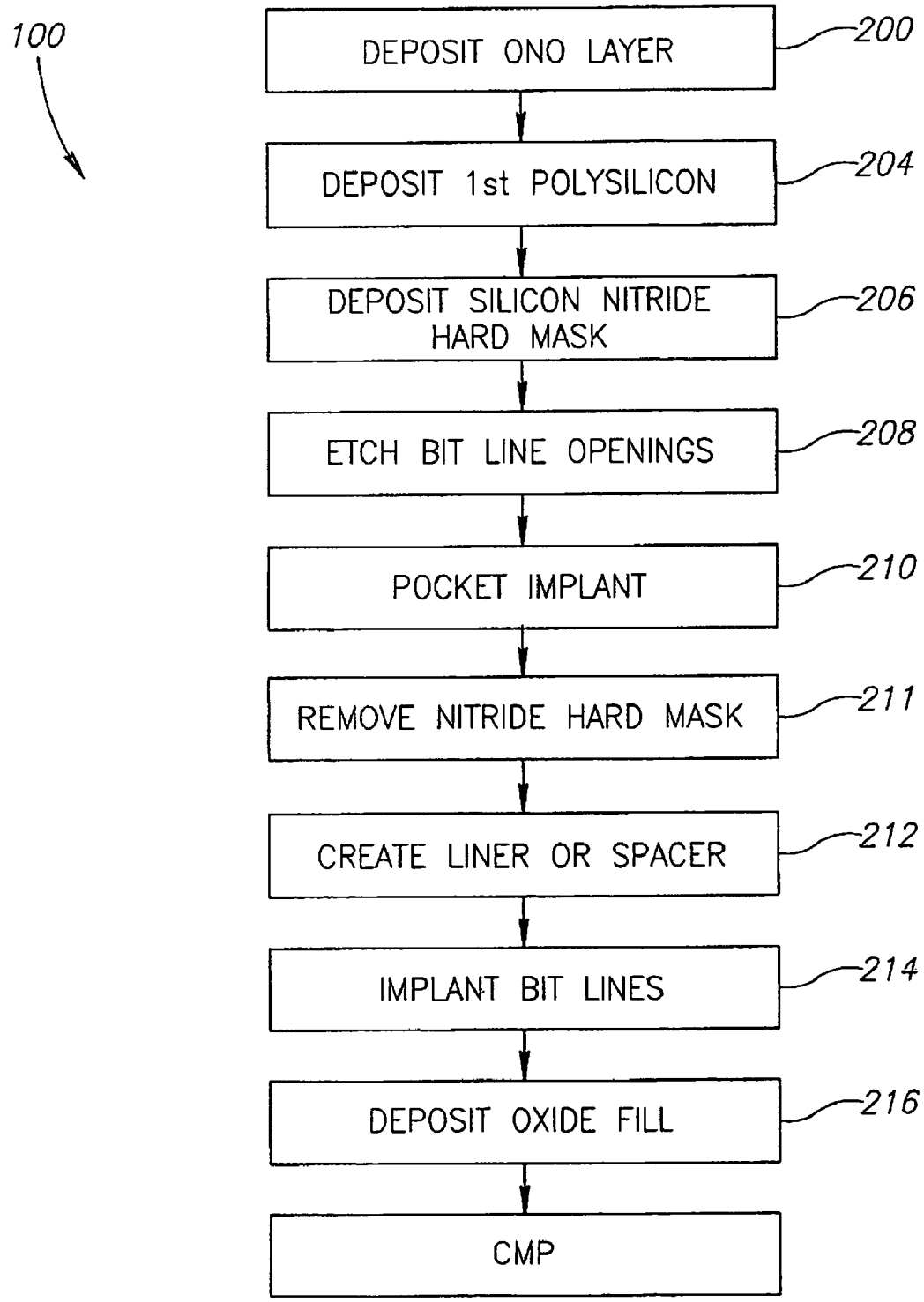
FIG. 7 is a flow chart illustration of a method for pre-word-line patterning, which is useful for the method of FIGS. 4A and 4B.
Figure 8A:
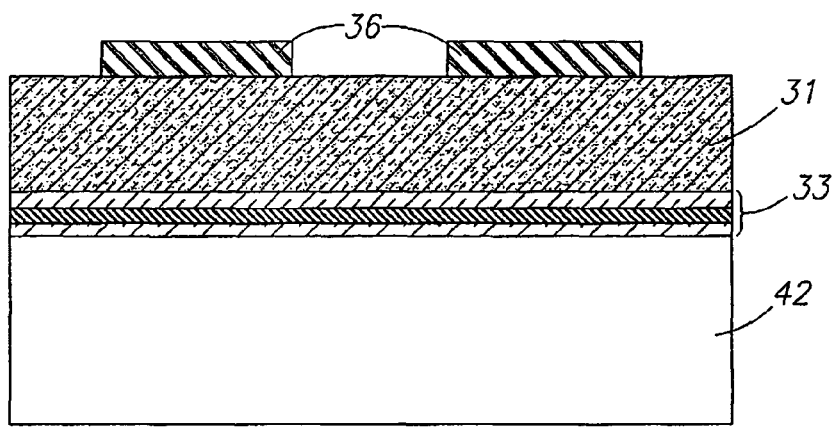
FIGS. 8A, 8B and 8C are schematic illustrations of various steps within the process of FIG. 7.
Figure 8B:
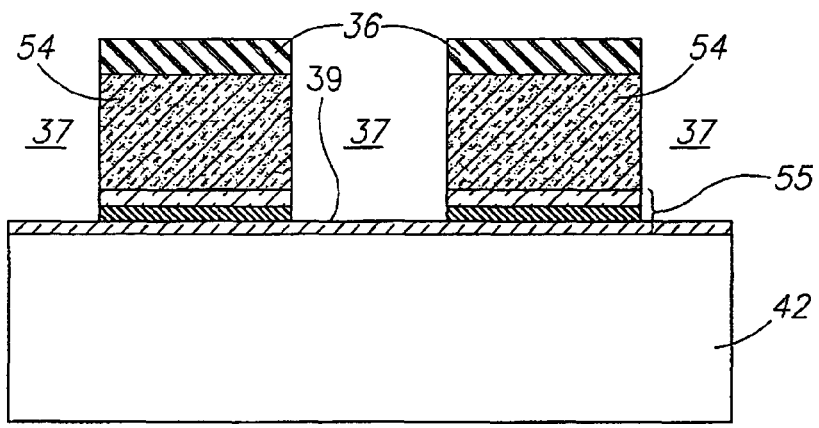
Figure 8C:
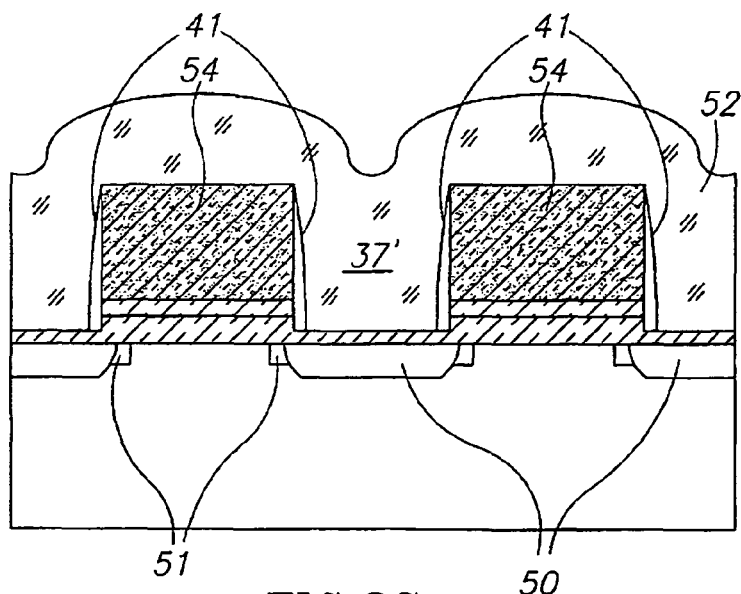

Reference is now made to FIG. 7, which illustrates an exemplary method for pre-word line patterning (step 100 of FIG. 4A). Reference is also made to FIGS. 8A, 8B and 8C which show the results of various steps of FIG. 7.

After preparation of substrate 42 (FIG. 8A), ONO layer 33 may be laid down (step 200) over the entire wafer, where, in an exemplary embodiment, the bottom oxide layer may be 2-5 nm thick, the nitride layer may be 5 nm thick and the gate oxide layer may be 12-14 nm thick.

In step 204, a first polysilicon layer 31 may be laid down over the entire chip. A nitride hard mask 36 may then be deposited (step 206) in a column pattern covering the areas of the memory array not destined to be bit lines. FIG. 8A shows the results of step 206. Two columns of nitride hard mask 36 are shown on top of polysilicon layer 31, which overlays ONO layer 33.

An etch may be performed (step 208) to generate bit line openings 37 by removing the areas of polysilicon layer and the oxide and nitride layers between columns of nitride hard mask layer 36. FIG. 8B shows the results of the etch process. Two columns 54 of first polysilicon and nitride hard mask 36 are shown on top of columns, now labeled 55, of ONO layer 33. The bottom oxide, labeled 39, is shown in bit line openings 37.

A pocket implant 51 (FIG. 8B), such as of Boron (BF$_2$), may now be implanted (step 210) next to or under polysilicon columns 54. An exemplary pocket implant may be of 1-3× $10^{13}$/cm$^2$ at an angle of 0-15°, where the angle may be limited by the width of bit line opening 37 and the height of polysilicon columns 54 covered by nitride hard mask 36. Part of pocket implant 51 may scatter and diffuse under polysilicon columns 54. In an alternative embodiment the pocket implant may be of Boron or Indium.

In step 211, nitride hard mask 36 may be removed.

In step 212, spacers 41 may be generated on the sides of polysilicon columns 54. For example, spacers 41 may be generated by deposition of an oxide liner, such as of 12 nm, and an anisotropic etch, to create the spacer shape. Alternatively, the liner may be left as it is without forming a spacer.

Spacers 41 may decrease the width of bit line openings, labeled 37' in FIG. 8C, in order to reduce the width of the about-to-be implanted bit lines and to increase the effective length of the channels between bit lines.

Once spacers 41 have been formed, bit lines 50 may be implanted (step 214), followed by a rapid thermal anneal (RTA). In one exemplary embodiment, the bit line implant is of Arsenic of $2 \times 10^{15}$/cm$^2$ at 10-20 Kev and with an angle of 0 or 7% to the bit line.

In step 216, an oxide filler 52 may be deposited on the chip. As can be seen in FIG. 8C, oxide filler 52 may fill reduced bit line openings 37' and may cover other parts of the chip. In step 218, a CMP (chemical mechanical planarization) process may be performed to remove excess oxide filler 52. The result of step 218 may be seen in FIG. 5, discussed previously.

Figure 9A:
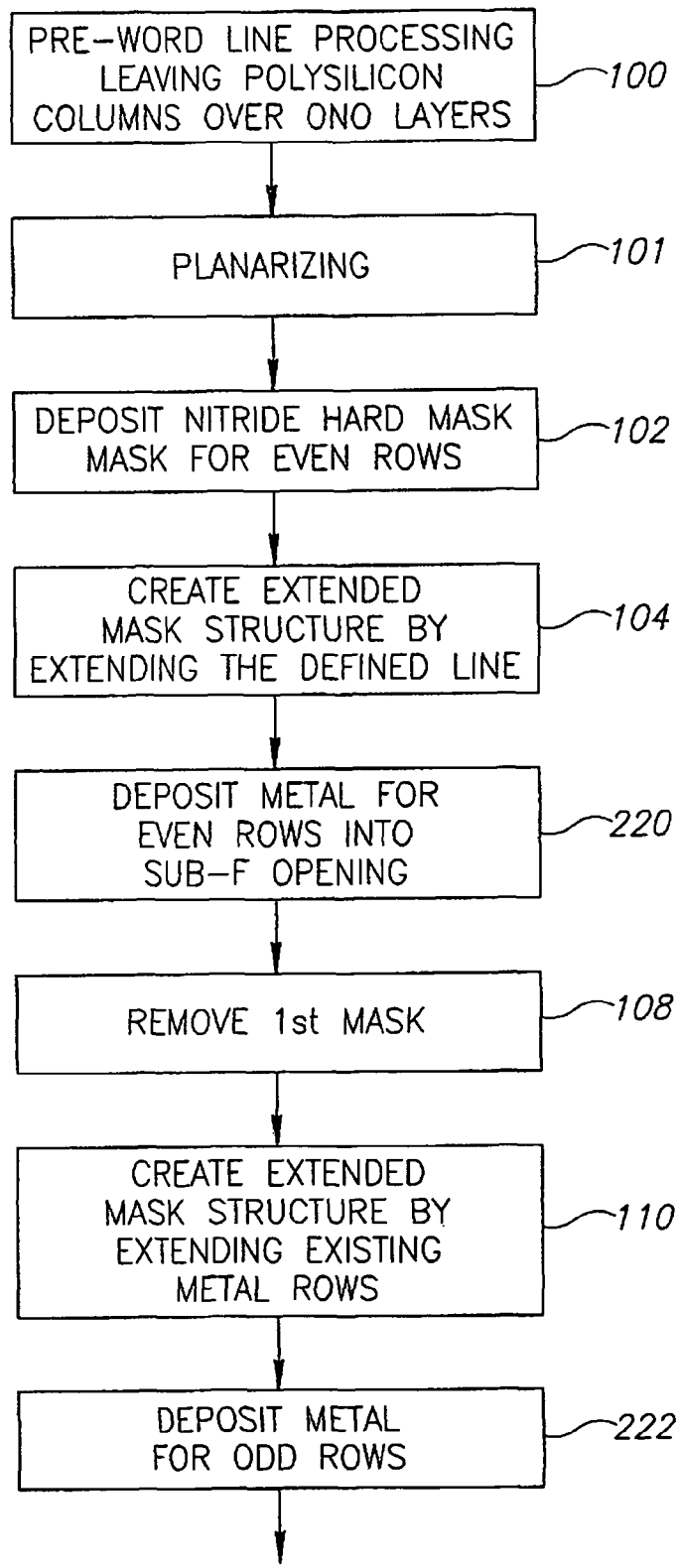
FIGS. 9A and 9B are flow chart illustrations of an alternative embodiment of the word line patterning method of FIGS. 4A and 4B.
Figure 9B:
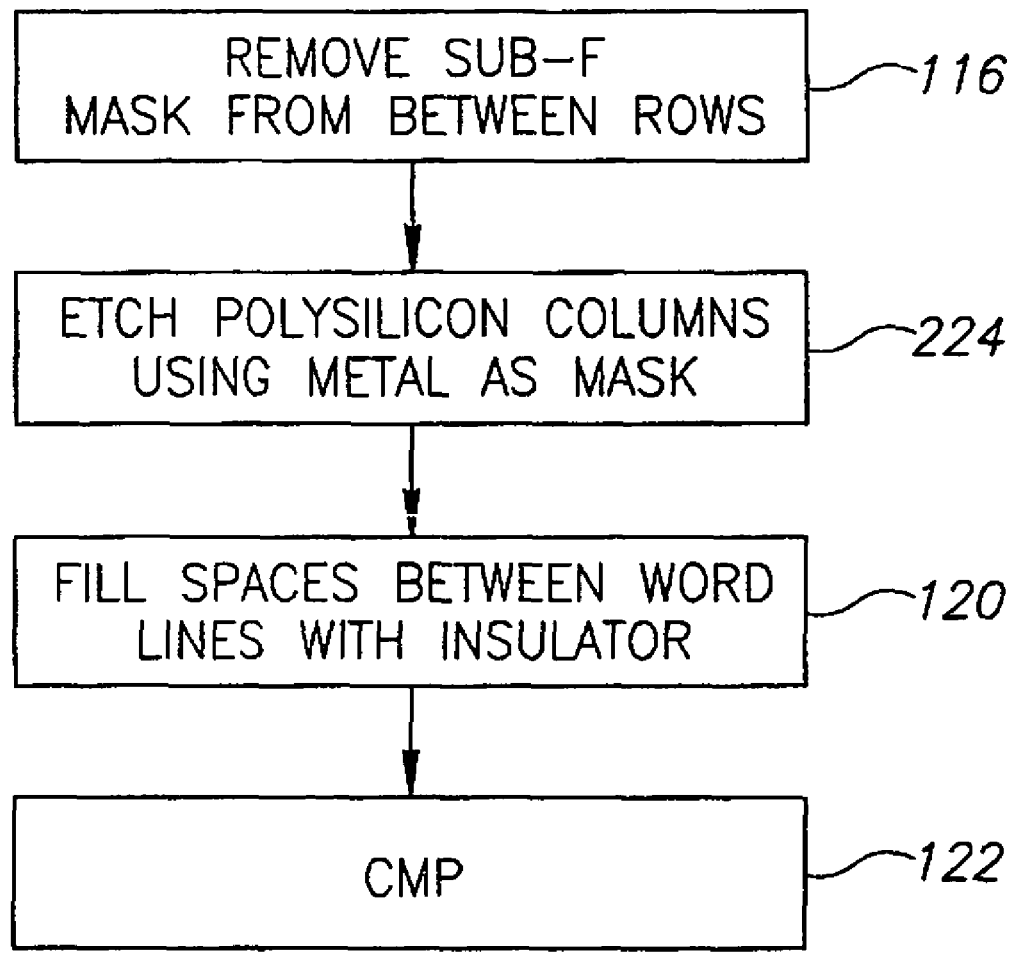

Reference is now made to FIGS. 9A and 9B, which illustrate an alternative embodiment of the present invention in which the word lines are formed of metal rather than of polysilicon. Reference is also made to FIGS. 10A-10D which illustrate the output of various steps of FIGS. 9A and 9B.

Applicants have realized that a "Dual Damascene" type process, used in semiconductor technology for creating metal lines (known as the "metal 1 layer") above the array, may be utilized herein to create metal word lines above polysilicon gates. This new process is shown in FIGS. 9A and 9B, which process is very similar to that shown in FIGS. 4A and 4B and thus, only the changed steps will be described hereinbelow.

The method begins with steps 100, 101, 102 and 104 of FIG. 4A to create the extended mask structure, formed from rows 60 and spacers 62', above polysilicon columns 54. The method may then deposit (step 220) even metal rows 221, such as copper or tungsten, into reduced spaces 61' rather than polysilicon rows 64 as before. Metal rows 221 may then be planarized, resulting in the structure shown in FIG. 10A.

The method then continues with steps 108 (removing 1$^{st}$ mask) and 110 (creating extended mask) of FIG. 4A. However, in this embodiment, the extended mask is formed of even metal rows 221 and spacers 72'. In step 222, odd metal rows 223 may be deposited into spaces 70' (from FIG. 6G). Metal rows 221 may then be planarized, resulting in the structure shown in FIG. 10B.

Because even and odd rows 221 and 223, respectively, are formed of metal, there is no need to put an oxide cap on them, and thus, step 114 is not included in this embodiment.

Figure 10A:
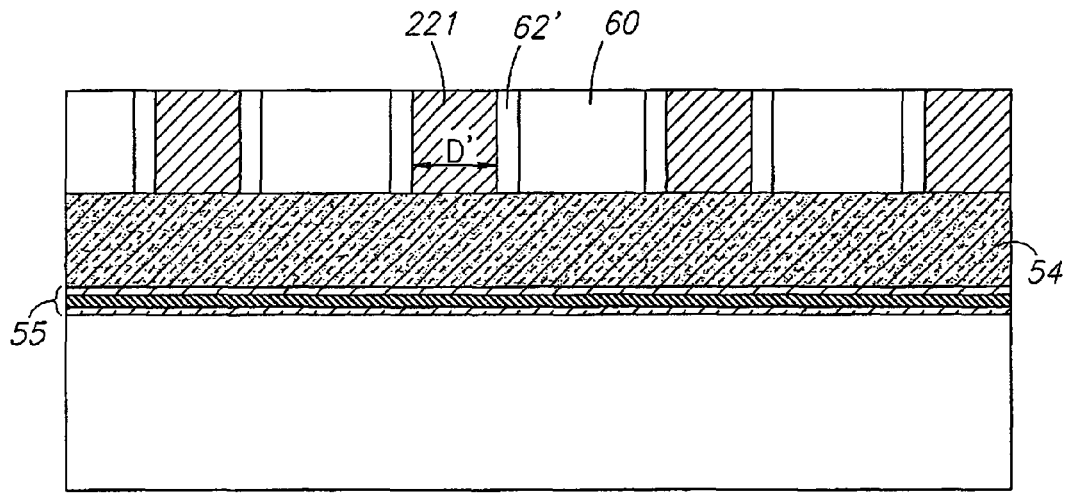
FIGS. 10A, 10B, 10C and 10D are schematic illustrations of various steps within the process of FIGS. 9A and 9B.
Figure 10B:
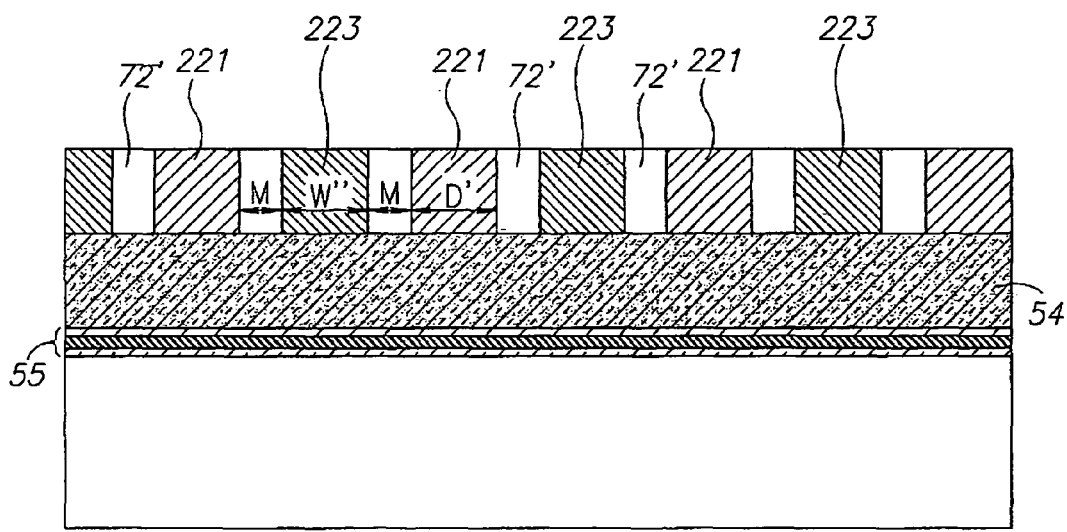
Figure 10C:
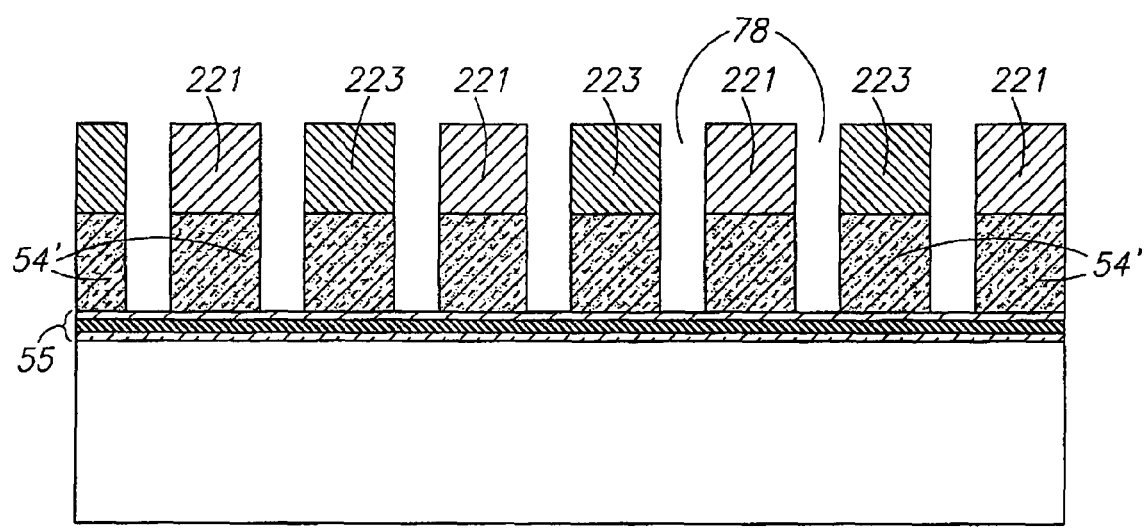
Figure 10D:
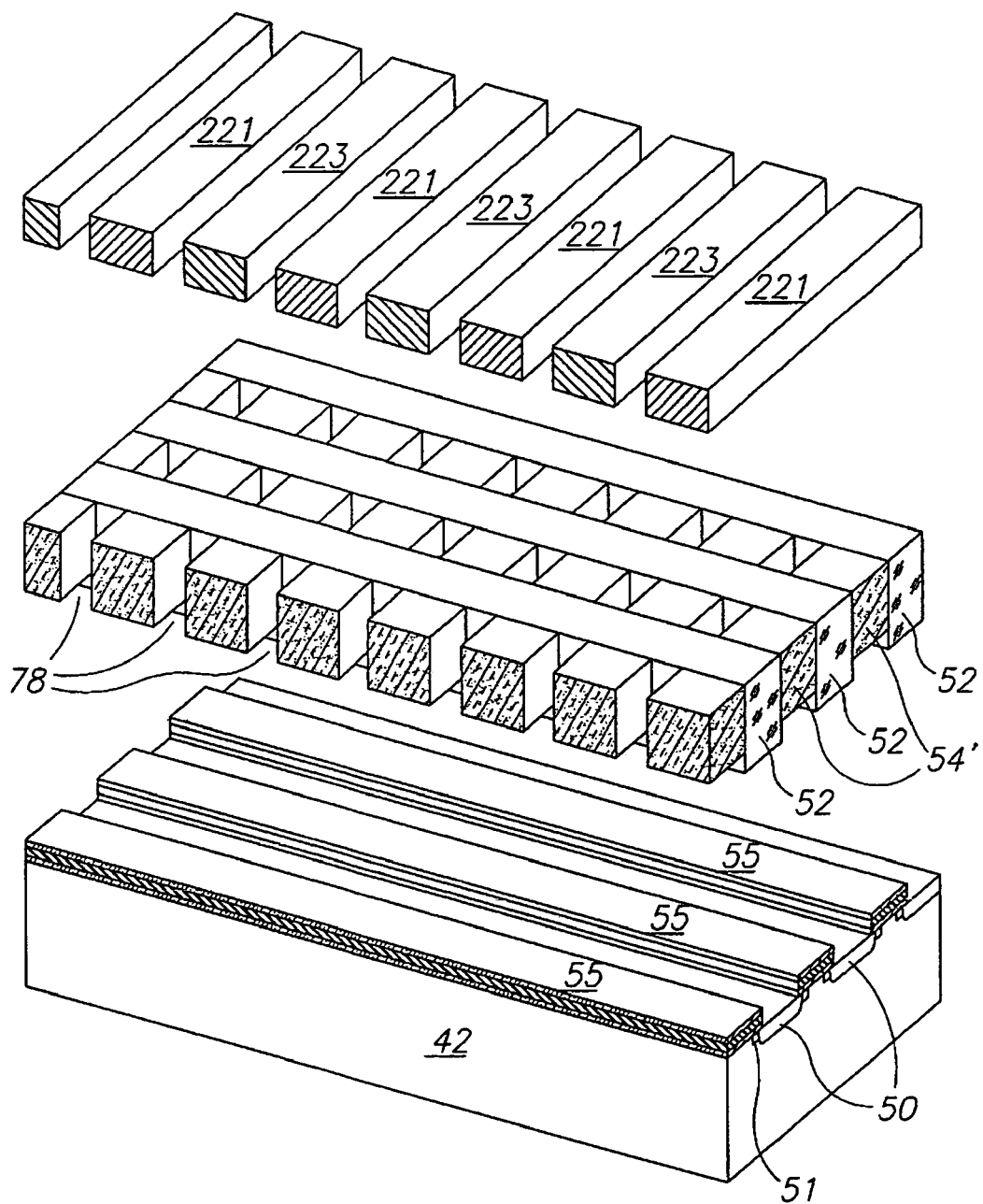

The method may proceed with removing (step 116) sub-F mask 72', leaving spaces between neighboring metal rows 221 and 223. In step 224, polysilicon columns 54 may be etched to create polysilicon gates 54', using metal rows 221 and 223 as masks for the etch. The result is shown in FIG. 10C and an expanded isometric view, showing gates 54' more clearly, is shown in FIG. 10D.

The process may continue as before, filling (step 120) the spaces between word lines with insulator and planarizing (step 122).

Spacer Embodiment

Applicants have realized that spacer technology may also be used to create sub-F word lines. The cell size may thus be reduced significantly by having 2 word lines in the same or a slightly larger pitch than in the prior art while still employing standard lithography. For example, there may be 2 word lines in a pitch of 2.8 F (translating to 1 word line in a 1.4 F pitch). Such an array may result in a cell size of less than the 4 $F^2$ theoretical minimum of the prior art Accordingly, in an alternative preferred embodiment of the present invention, spacer technology may be used to produce a sub-2 F pitch for a word line.

Figure 11:
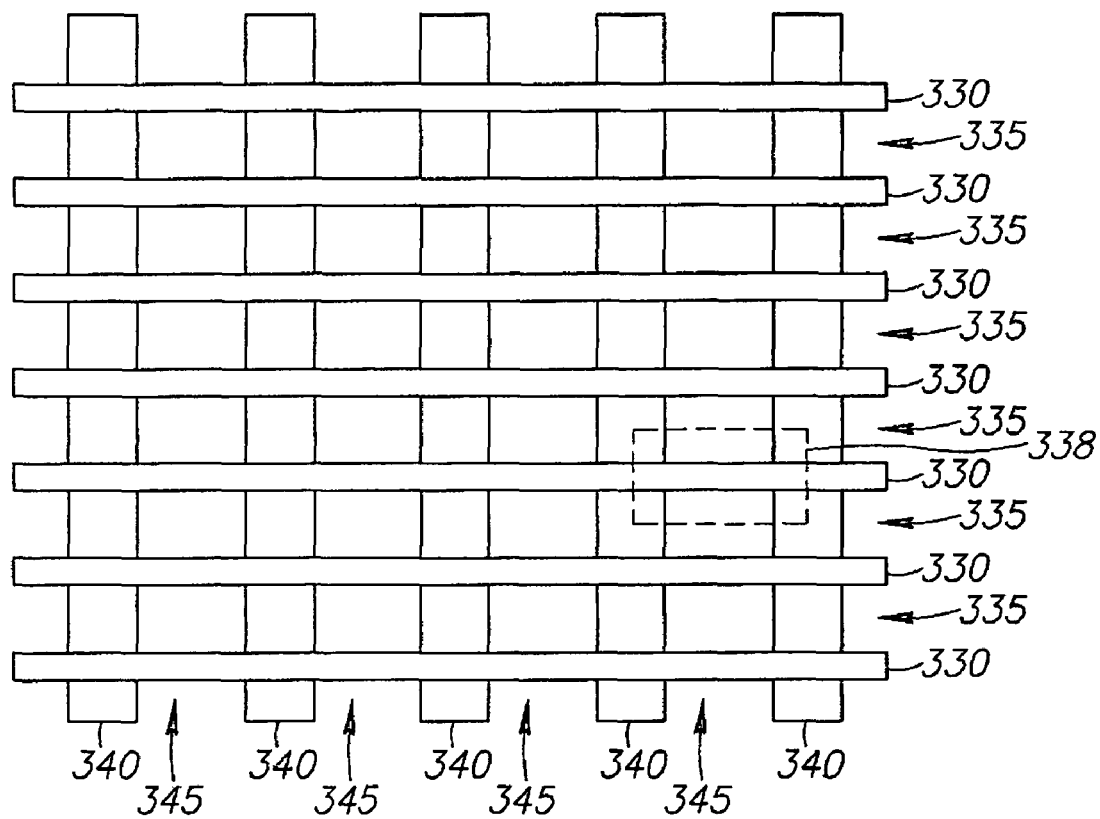
FIG. 11 is a schematic illustration of a layout of an array, constructed and operative in accordance with a preferred embodiment of the present invention.

Reference is now made to FIG. 11, which illustrates a novel, dense array 400, constructed and operative in accordance with the present invention. Array 400 may reduce the minimum size of a memory cell, by providing sub-minimum-feature-size, sub-F, spacer word lines 330 (with word line widths that are less than 1 F) along with feature-size or smaller width spaces 335 (where spacings 335 are 1 F or less).

For example, in FIG. 11, spacer word lines 330 are shown as an exemplary 0.4 F. It will be appreciated that the widths of spacer word lines 330 in FIG. 11 are exemplary; other sub-F widths are possible and are included in the present invention. Bit lines 340 and bit line spaces 345 may have, as in the DPP prior art, widths of 1 F and 1.6 F respectively.

Assuming a pitch of 2.6 F for the bit line dimension, the cell size of the example in FIG. 11 may be 2.6 F×1.4 F=3.64 $F^2$, which is less than the theoretical minimum (of 4 $F^2$) of the prior art. It will be appreciated that the word line and bit line pitches of the example in FIG. 11 are exemplary; other pitches are possible and are included in the present invention. The theoretical limits for the present invention are defined by a pitch of 1 F between spacer word lines 330 and a pitch of 2 F between bit lines 340. Accordingly an exemplary embodiment of the present invention may provide a cell 38 whose size is 1 F×2 F=2 $F^2$. It will therefore be appreciated that, by using spacers as the word lines, the present invention has redefined the theoretical minimum cell size. It will also be appreciated that the width of spacer word line 330 has a direct effect on the amount of current required for programming. Wider spacer word lines 330 may generally require higher currents for programming. Accordingly, as spacer word lines 330 may be less wide than the prior art of 1 F, they may in general require lower currents than in the prior art for programming, resulting in lower power consumption during programming.

It will be appreciated that the present invention may also be implemented in non-DPP type memory cells, and also for non-NROM type memory cells. Furthermore, the memory cells may store 2 bits or 4 bits, with no change in the basic physics and operating mode of the cell.

In accordance with a preferred embodiment of the present invention and as will be shown hereinbelow, sub-F elements may be generated from elements which are the minimum feature size F or larger. As will be described herein below, the present invention utilizes common lithographic concepts to generate such small features.

Figure 12:
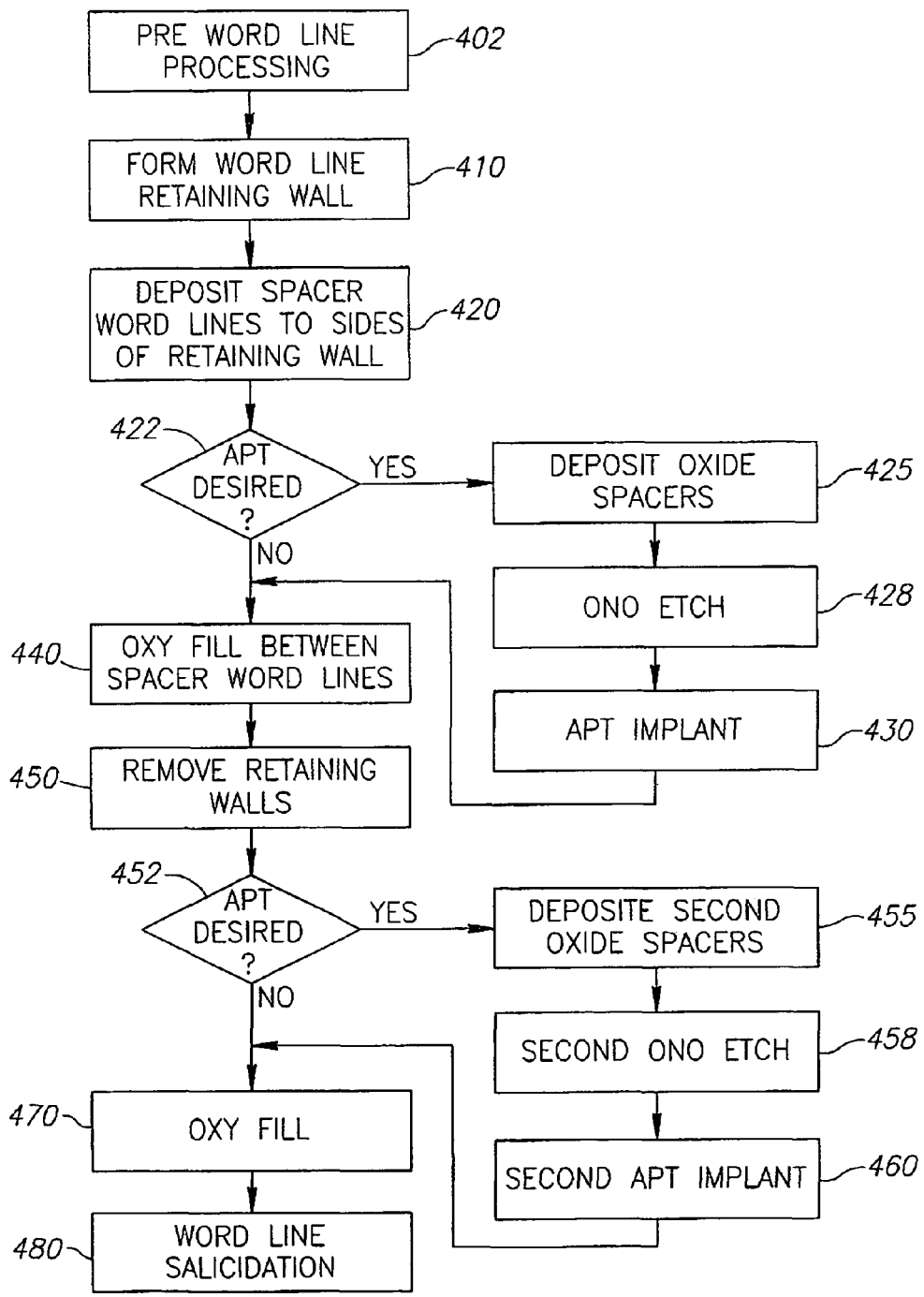
FIG. 12 is a flow chart illustration of a spacer word-line patterning method for creating the array of FIG. 11, constructed and operative in accordance with a preferred embodiment of the present invention.

Reference is now made to FIG. 12, which illustrates the process and to FIGS. 13A-26B, which illustrate various steps within the process of FIG. 12. FIG. 12 shows two alternative methods which will be described herein below, the first one, associated with FIGS. 13A-24B, which enables an anti-punchthrough implant between spacer word lines to be implanted and the second one, associated with FIGS. 25A-26B, which has no such anti-punchthrough implant.

Figure 13A:
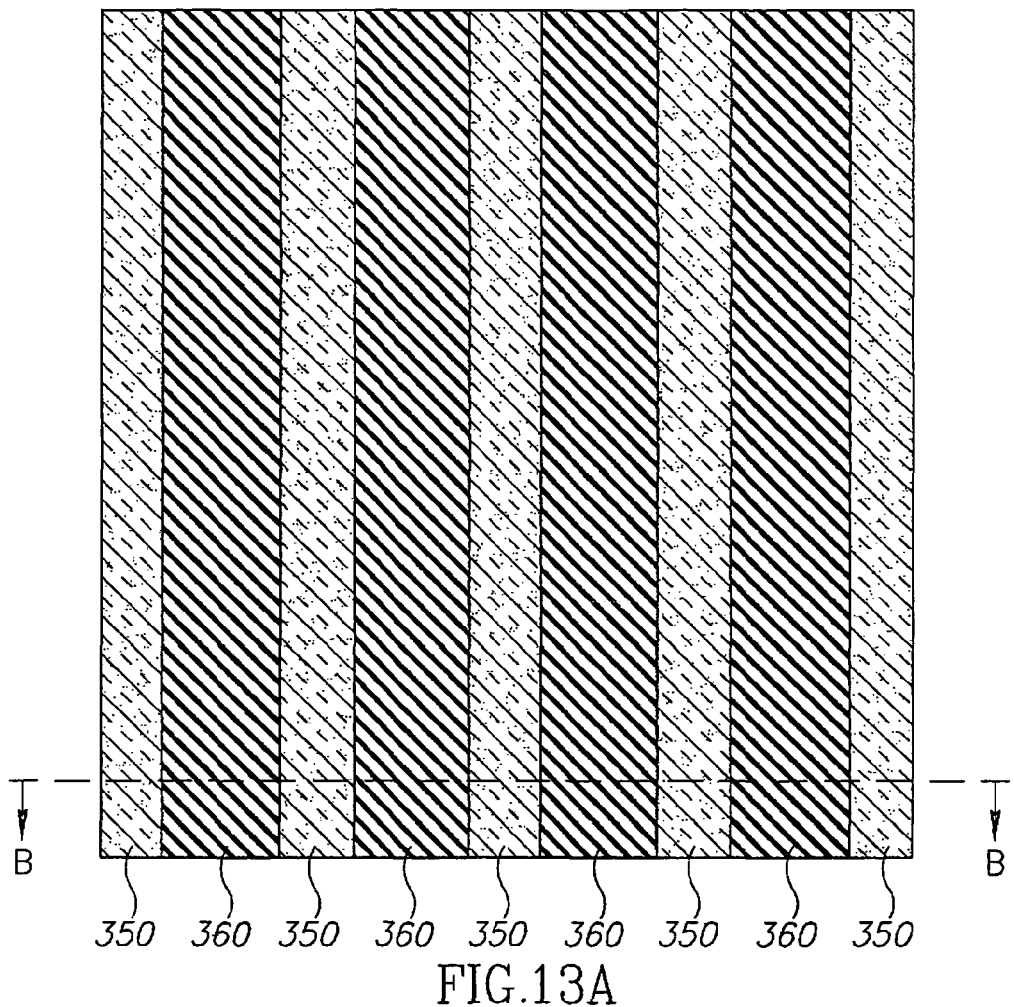
FIGS. 13A, 14A, 15A, 16A, 17A, 18A, 19A, 20A, 21A, 22A, 23A, 24A, 25A and 26A are top view illustrations of the results of various steps within the process of FIG. 12.
Figure 13B:
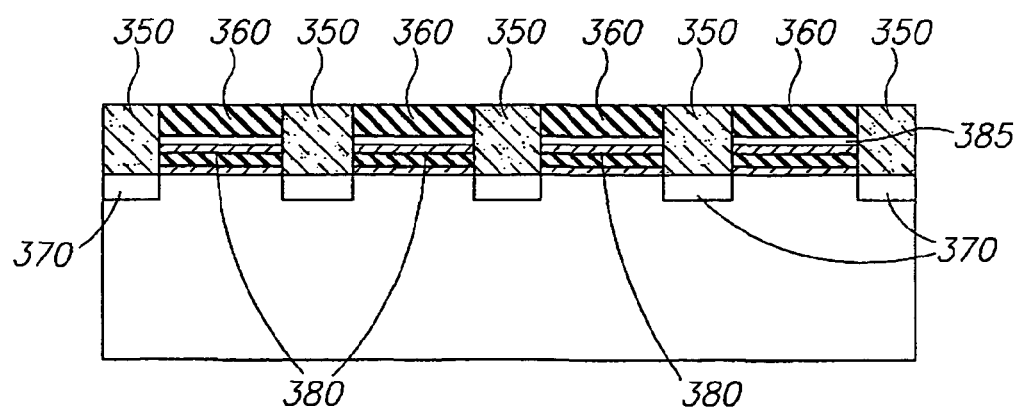
FIGS. 13B, 14B, 15B, 16B, 17B, 18B, 19B, 20B, 21B, 22B, 23B, 24B, 25B and 26B are cross sectional views of FIGS. 13A, 14A, 15A, 16A, 17A, 18A, 19A, 20A, 21A, 22A, 23A, 24A, 25A and 26A, respectively.

The process begins, in step 402, with the process steps prior to word line patterning. The results of these steps are illustrated in FIGS. 13A and 13B. FIG. 13A shows a top view of array 400, whereas FIG. 13B shows a cross section along horizontal lines B-B, viewing multiple bit lines 370. FIG. 13A shows alternating lines of oxide 350 and nitride 360. As shown in FIG. 13B, oxides 350 may be located on top of bit lines 370, which may, for example, be created with arsenic implants. Underneath nitrides 360 may be a polysilicon liner 385 and an oxide-nitride-oxide (ONO) layer 380. It will be appreciated that bit line oxides 350 and bit lines 370 may have been formed using a lithographic process, thus resulting in a bit line width of 1 F. In accordance with a preferred embodiment of the present invention, the width of nitrides 360 and ONO layer 380 may be 1.6 F, with a minimum limit of 1 F.

The pre-word line patterning process steps may be any suitable set of steps, an exemplary set of which may be found in the following applications assigned to the common assignees of the present invention, which applications are incorporated herein by reference: U.S. patent application Ser. No. 11/247,733 filed Oct. 11, 2005, U.S. patent application Ser. No. 11/336,093 filed Jan. 20, 2006 and U.S. patent application Ser. No. 11/440,624, filed 24 May 2006.

Returning to FIG. 12, the first step in word line processing is to form (step 410) retaining walls next to which the spacer word lines may be deposited using a conductive material such as, for example, polysilicon. As shown from above in FIG. 14A, initially, the entire array 400 may be covered with a second layer of nitride 390 which may constitute a hard cap for lithographic purposes. A cross-sectional view in FIG. 14B shows how nitride 390 may cover the previously deposited materials.

Figure 14A:
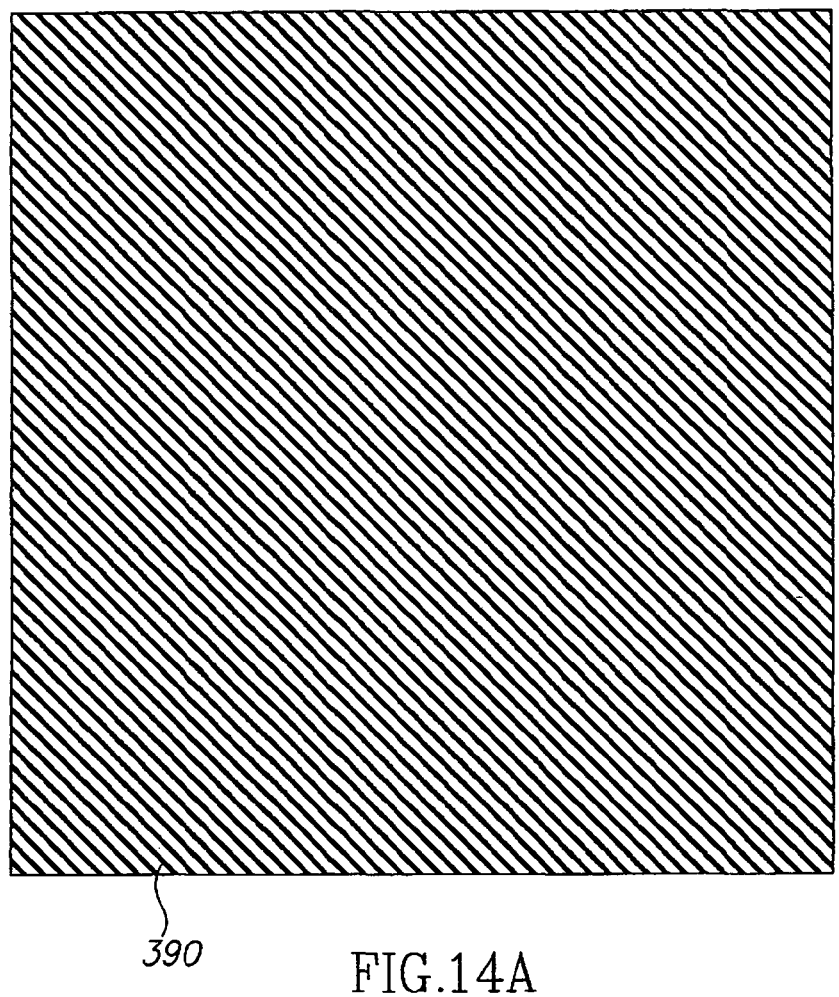
Figure 14B:
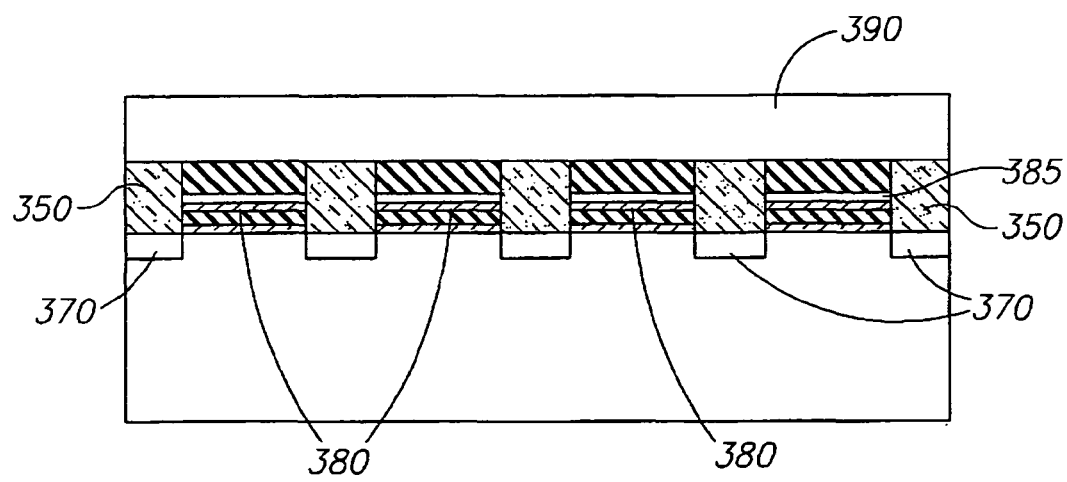
Figure 15A:
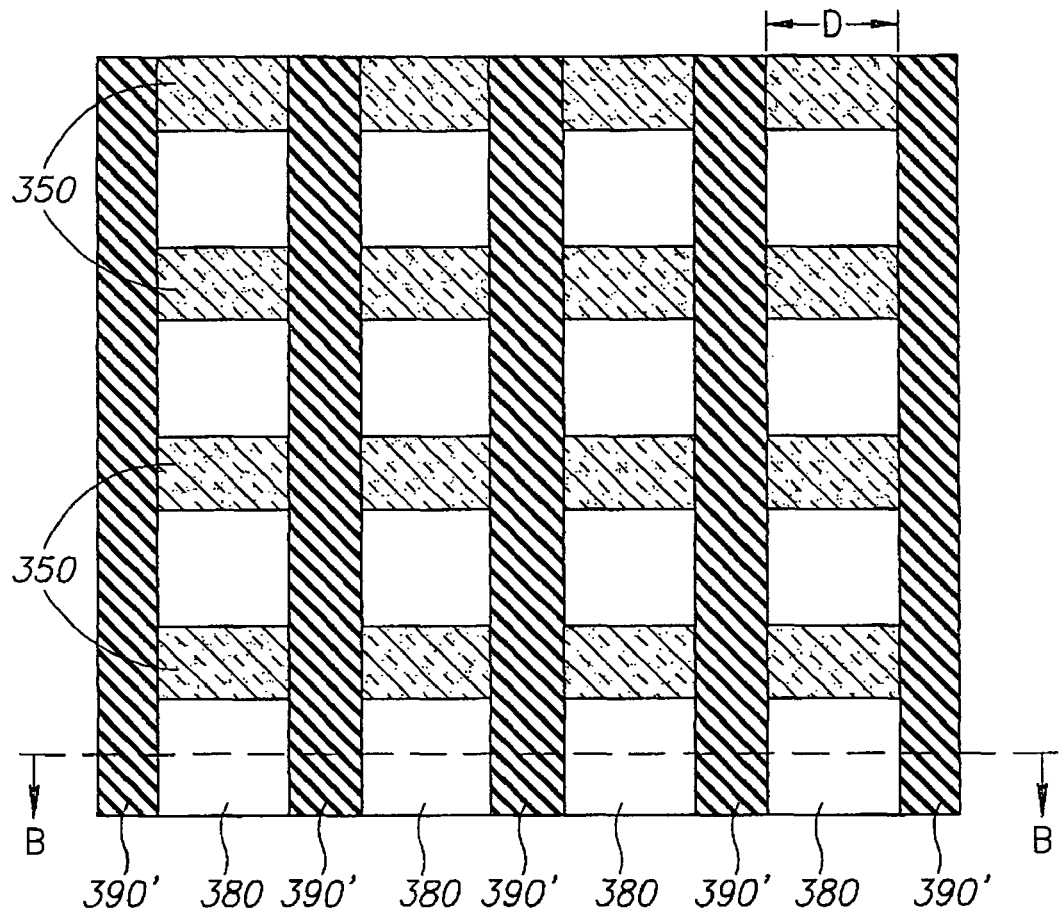

FIG. 15A illustrates a top view of array 400 that has been rotated 90 degrees in a clockwise direction when compared to FIG. 14A. This figure illustrates how nitride 390 may then be etched to create word line retaining walls 390'. Elements of polysilicon liner 385 exposed by this operation may then be removed as well with a wet etch. It will be appreciated, that the width of word line retaining walls 390' may be 1 F or larger, due to the restrictions of lithographic operations. In a preferred embodiment of the present invention, the distance D between each word line retaining wall 390' may be, for example, 1.8 F.

It will be appreciated that the mask for etching nitride 390 may be the same or similar to the prior art mask for generating word lines. However, in the present invention, the mask is used to create retaining walls 390'.

Figure 15B:
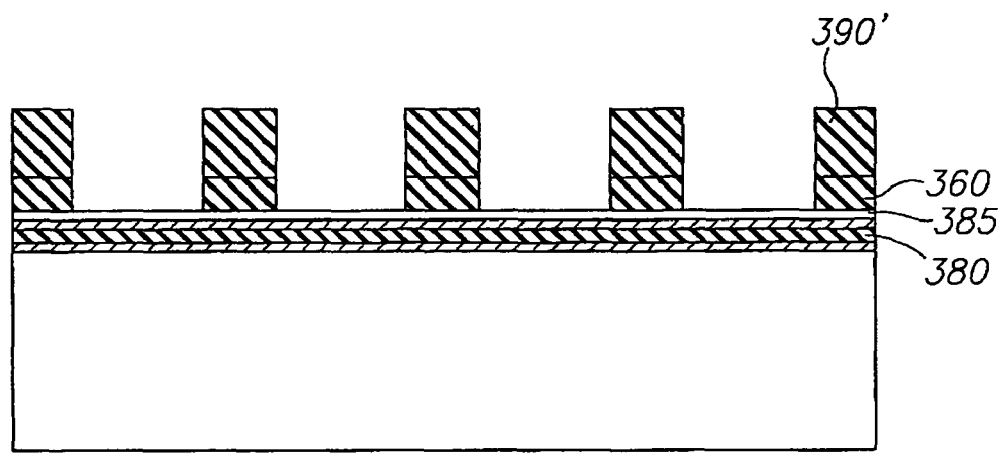

FIG. 15B shows a vertical cross-section along lines B-B, viewing multiple word lines. FIG. 16B illustrates how the remaining elements of nitride 360 provide a base for word line retaining walls 390'. It will thus be appreciated that both retaining walls 390' and nitride 360 consist of the same material and may later be removed in a single step.

Figure 16A:
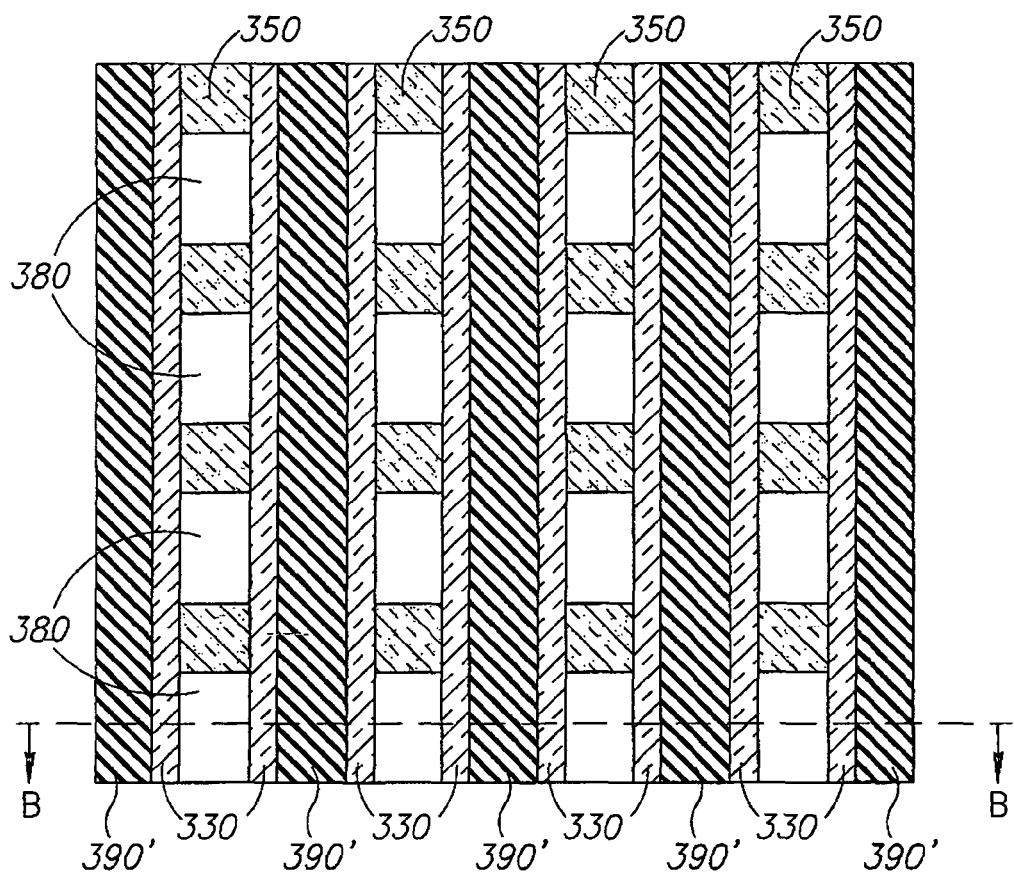
Figure 16B:
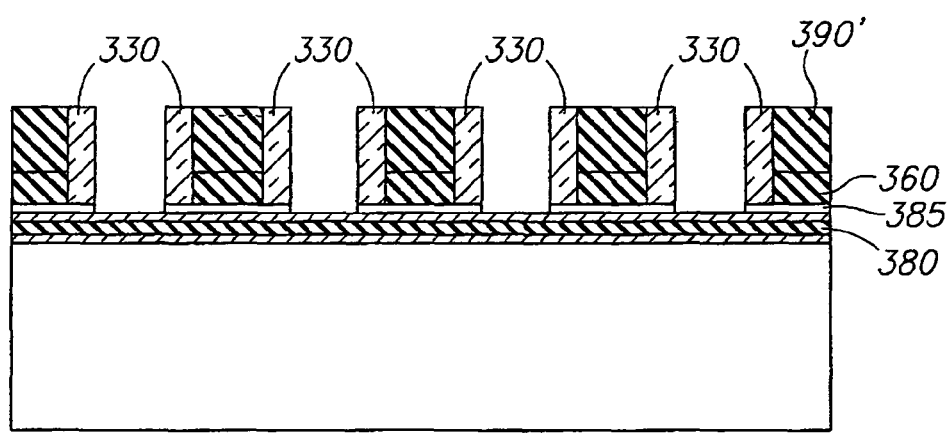

As shown in FIG. 16A, spacer word lines 330 may then be generated (step 420) as polysilicon spacers adjacent to word line retaining walls 390'. The polysilicon spacers may be generated by first laying down a polysilicon liner and then etching the liner back. A Reactive Ion Etching (RIE) may be used to guarantee continuity of spacer word lines 330 over bit line oxides 350.

FIG. 16B shows a cross-sectional view of array 400 after spacer word lines 330 have been generated. It will be appreciated that spacer word lines 330 may be spacers and not created lithographically. Accordingly, spacer word lines 330 may have widths of less than 1 F. In accordance with an exemplary embodiment of the present invention, the width of spacer word lines 330 may be 0.4 F.

It will be appreciated that the width of spacer word lines 330 may no longer be affected by the limitations of lithography. Spacer dimensions may depend only on layer thickness in deposition and may therefore theoretically reach atomic dimensions. However, in light of practical considerations such as narrow channel effects, cell width variations and more, the minimum width for spacer word lines 330 may be defined as 0.1 F.

Figure 17A:
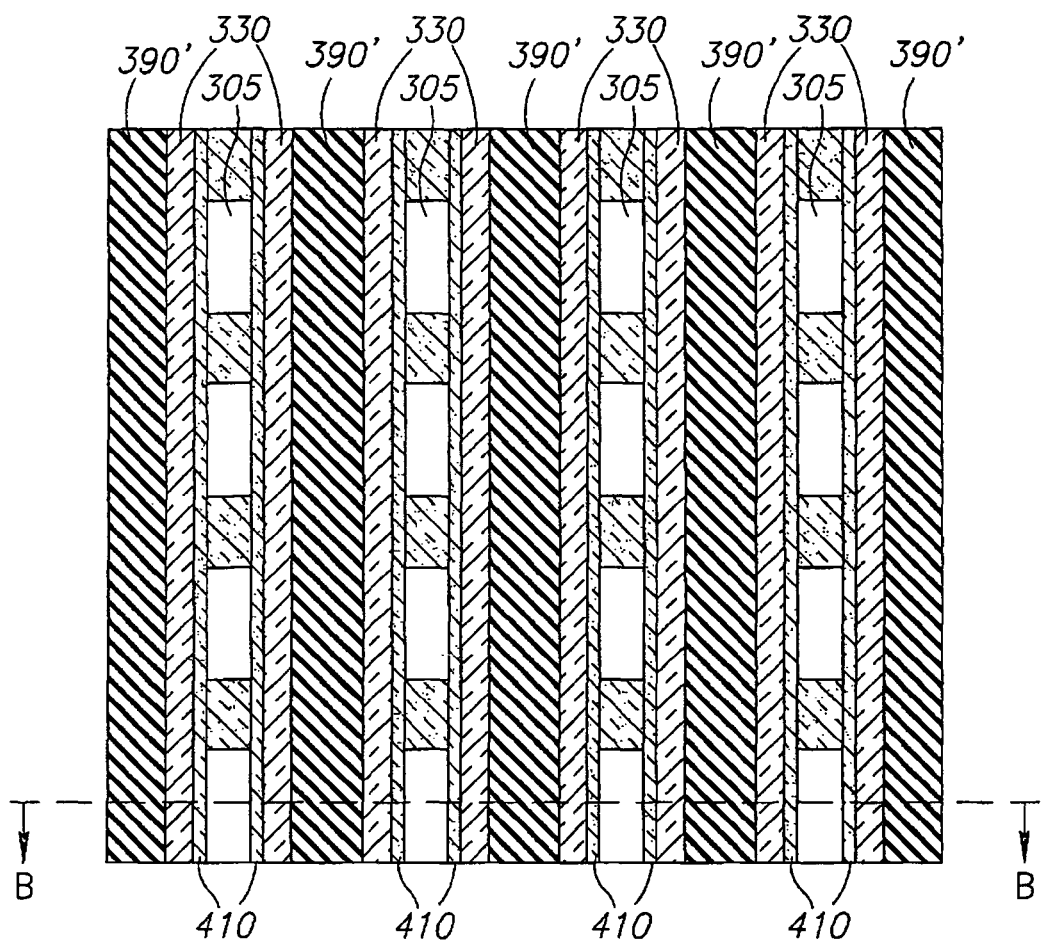
Figure 17B:
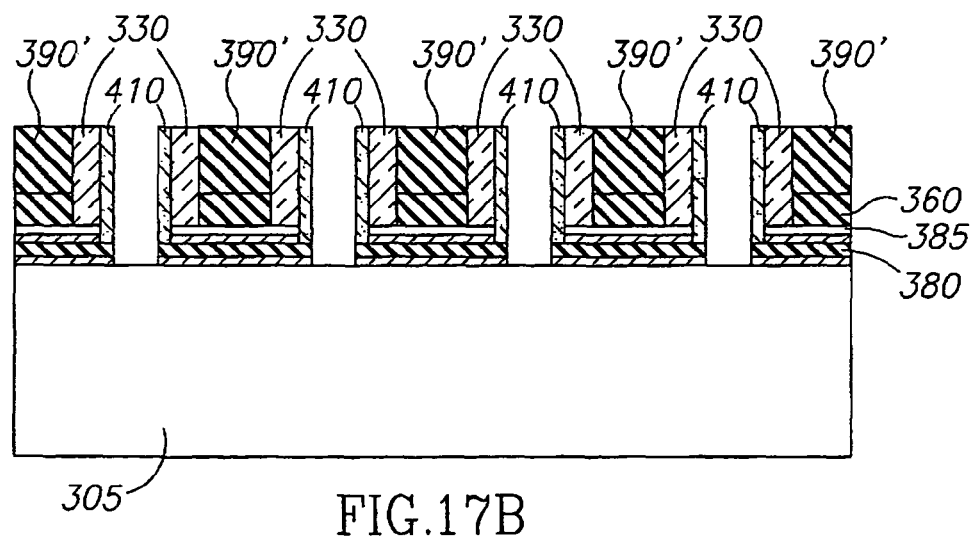

In accordance with a preferred embodiment of the present invention, anti punch through (APT) implants may be included in the process. If anti punch through (APT) implants are required (as checked in step 422), oxide spacers 410 may then be deposited (step 425) adjacent to spacer word lines 330 (FIG. 17A). It will be appreciated that oxide spacers 410 may be located on top of ONO 380 and may provide support to spacer word lines 330 during an implant process. ONO 380 may then be etched (step 428) in order to facilitate an anti punch through (APT) implant. FIG. 17B provides a cross sectional view of FIG. 17A and illustrates the results of such etching. Elements of ONO 380 may remain under spacer word lines 330, spacer word line retaining walls 390', and oxide spacers 410. However, between oxide spacers 410, substrate 305 may now be exposed.

Figure 18A:
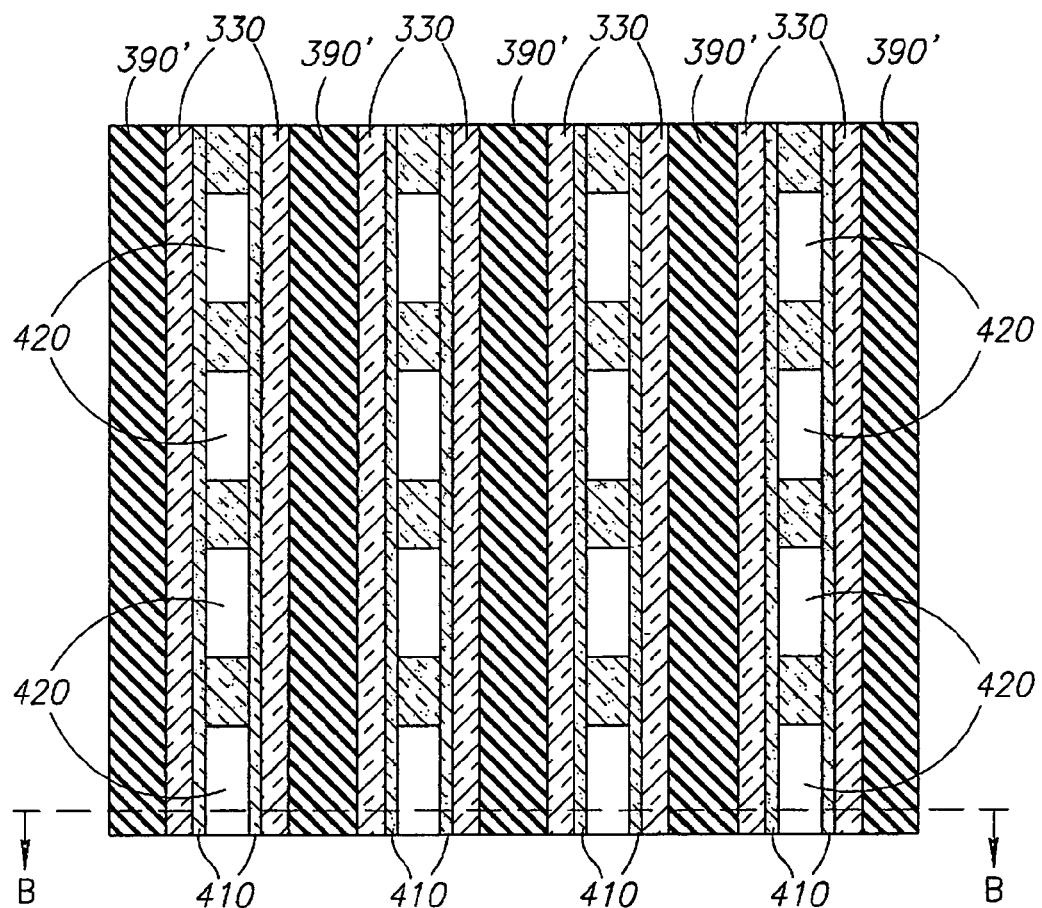
Figure 18B:
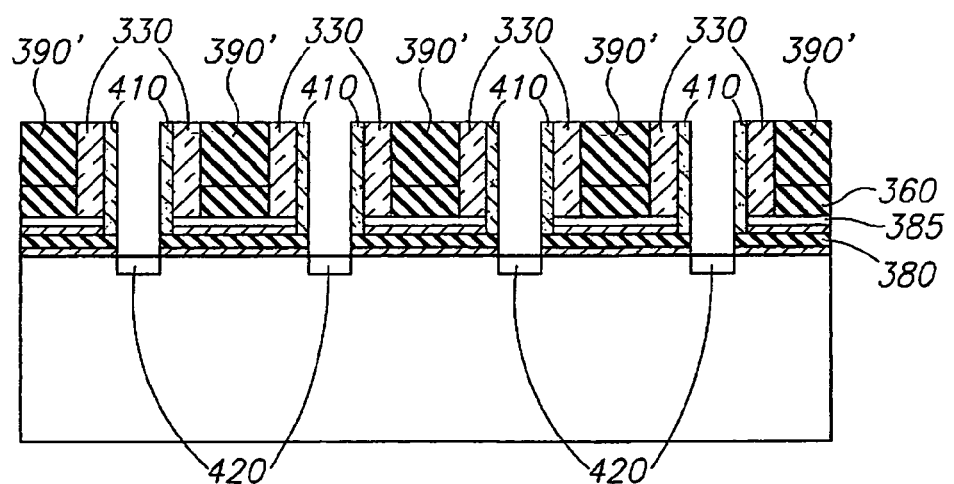
Figure 19A:
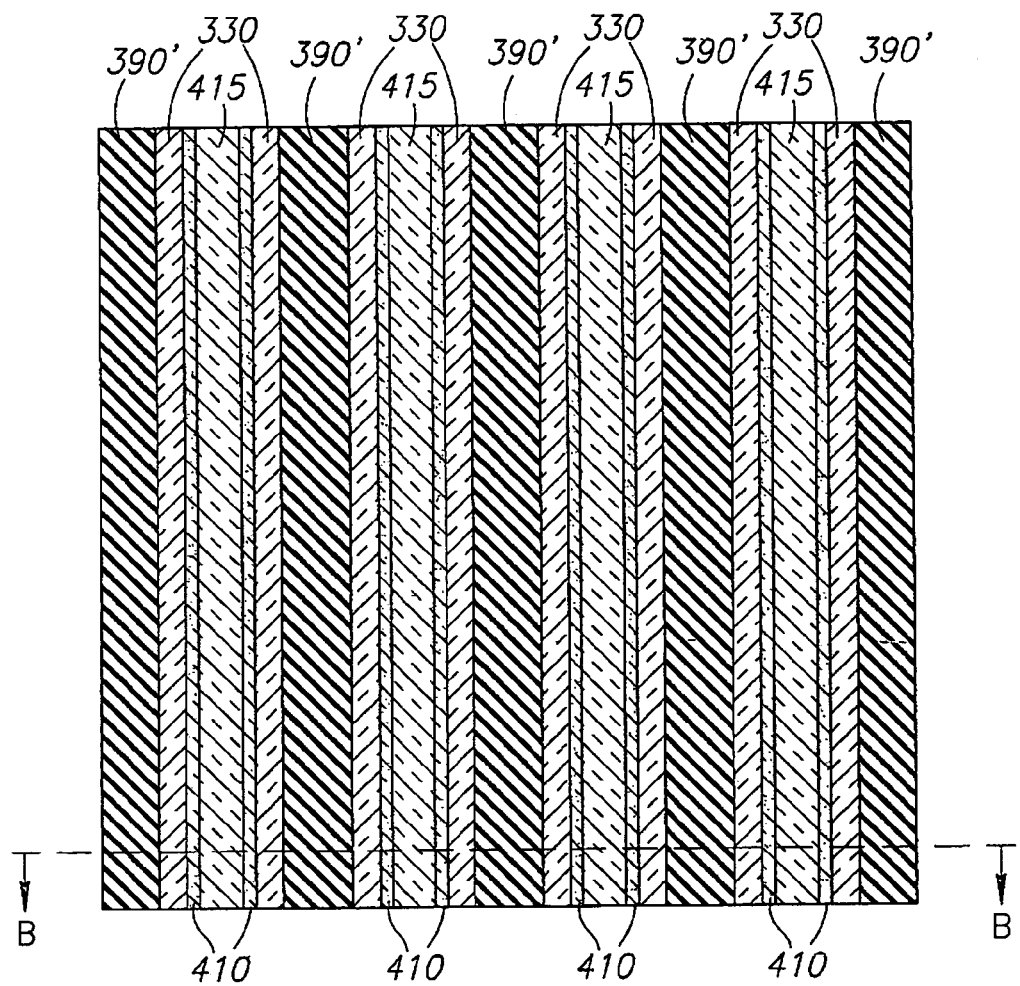
Figure 19B:
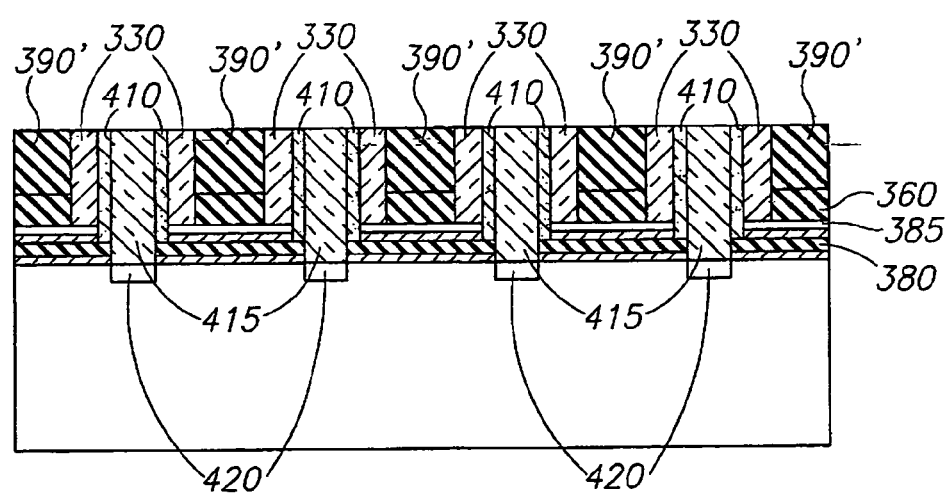

As illustrated in FIGS. 18A and 18B, a first set of APT implants 420 may now be implanted (step 430) in the exposed elements of substrate 305. As shown in FIGS. 19A and 19B, an oxide filler 415 may then be deposited (step 440) over first APT implants 420.

It will be appreciated that steps 425 and 428 are optional. In an alternate embodiment of the present invention, APT implants 420 may be implanted (step 430) directly through ONO layer 380 without depositing oxide spacers 410 or etching ONO layer 380. Oxide filler 415 may then be deposited (step 340) in the area containing both oxide spacers 410 and oxide filler 415 in the previous embodiment.

In accordance with a preferred embodiment of the present invention, array 400 may also be planarized at this point to remove excess oxide fill. An exemplary planarizing operation may be chemical-mechanical polishing (CMP). Thus, as illustrated in FIG. 19B, array 400 may now be filled to a uniform height. It will be appreciated the oxide spacers 410 and oxide filler 415 may consist of the same material and accordingly may now in effect comprise a uniform filler between spacer word lines 330.

Figure 20A:
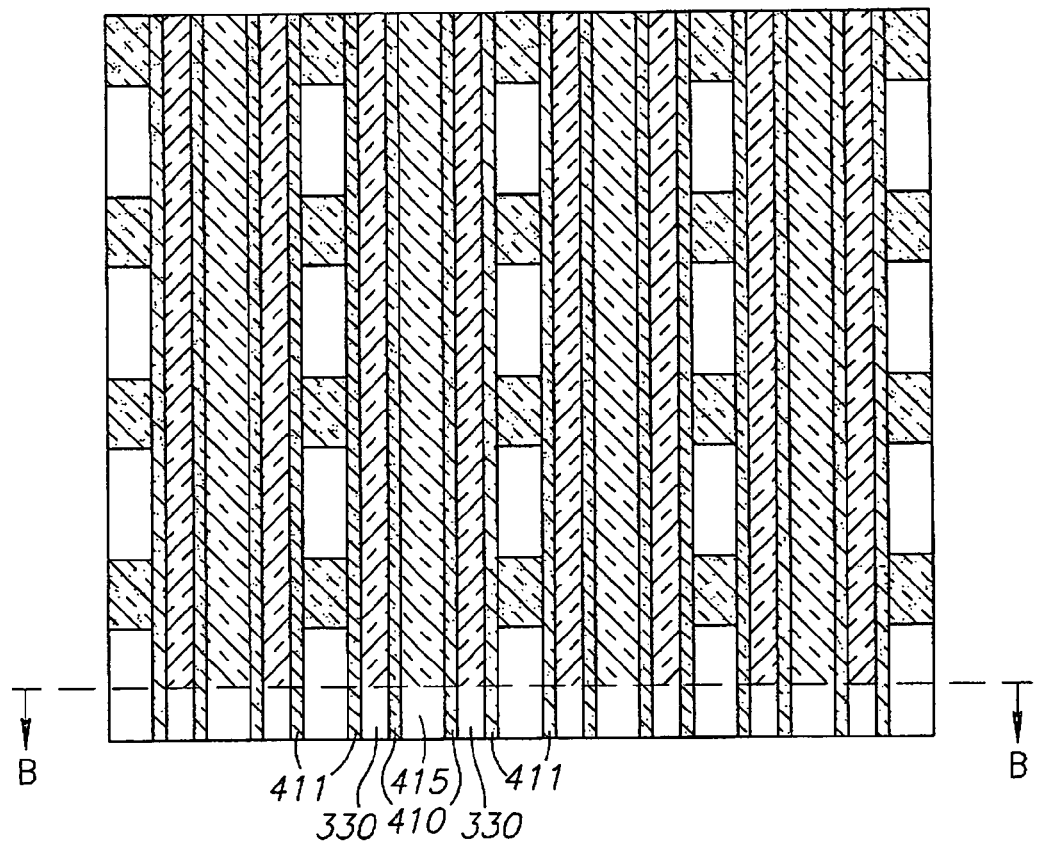
Figure 20B:
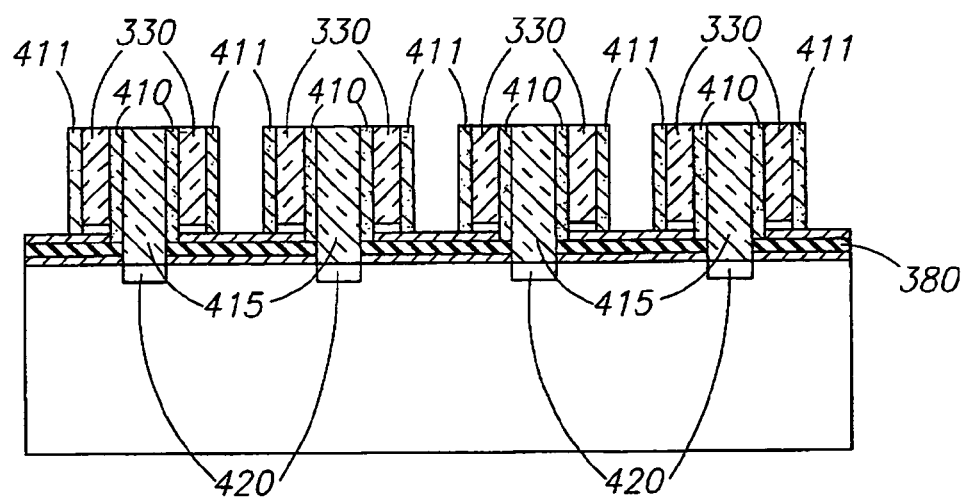

Word line retaining walls 390' may now be removed (step 450), such as with a nitride etch. If anti punch through (APT) implants are required (as checked in step 452), oxide spacers 411 may then be deposited (step 455) adjacent to spacer word lines 330. FIGS. 20A and 20B show the results of step 455. Bit line oxides 370 and ONO layer 380 have been exposed from underneath the removed retaining walls 390'. Oxide spacers 411 are next to spacer word lines 330 and may partially cover elements of ONO 380 that had previously been exposed by the removal of word line retaining walls 390'.

Figure 21A:
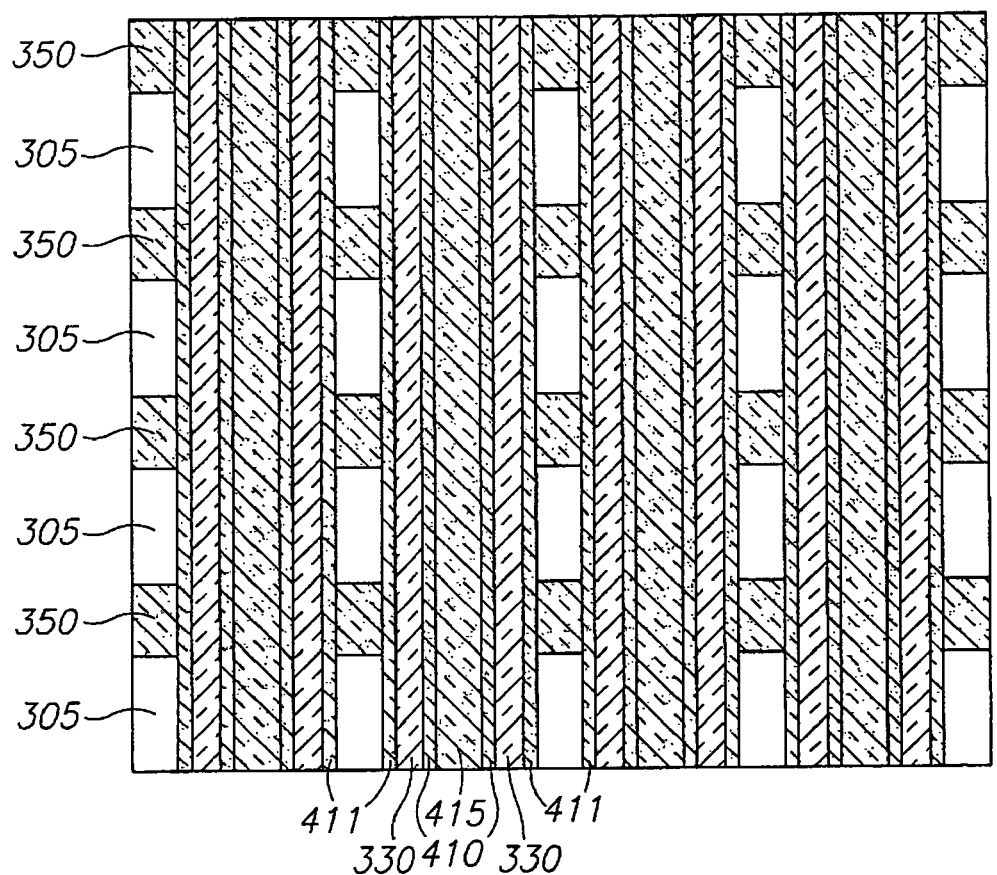
Figure 21B:
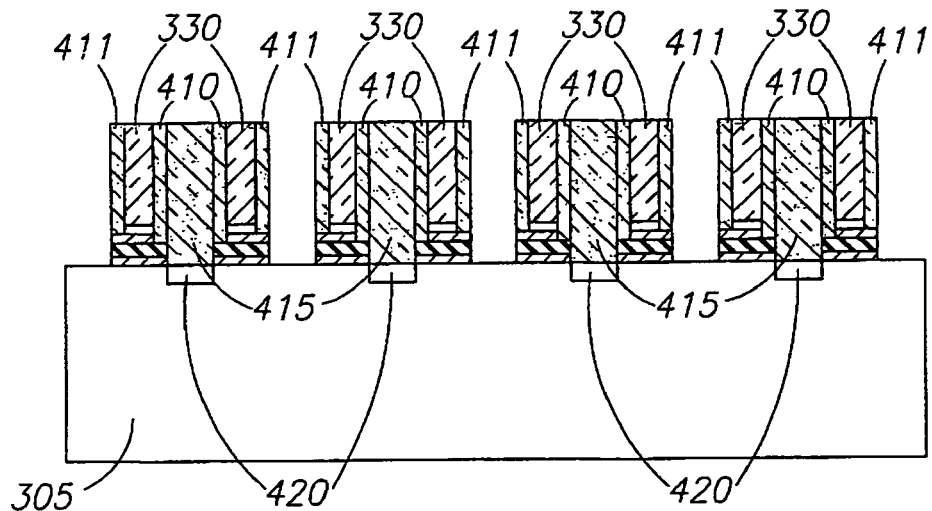

In accordance with a preferred embodiment of the present invention, the remaining exposed portions of ONO 380 may then be etched (step 458) in order to facilitate a second APT implant. FIGS. 21A and 21B illustrate the results of such etching. Similar to the preparation for first APT implants 420 (FIGS. 17A and 17B), substrate 305 may now be exposed, and elements of ONO 380 may remain under spacer word lines 330 and oxide spacers 410 and 411. However, now there may be no remaining word line retaining walls 390'.

Figure 22A:
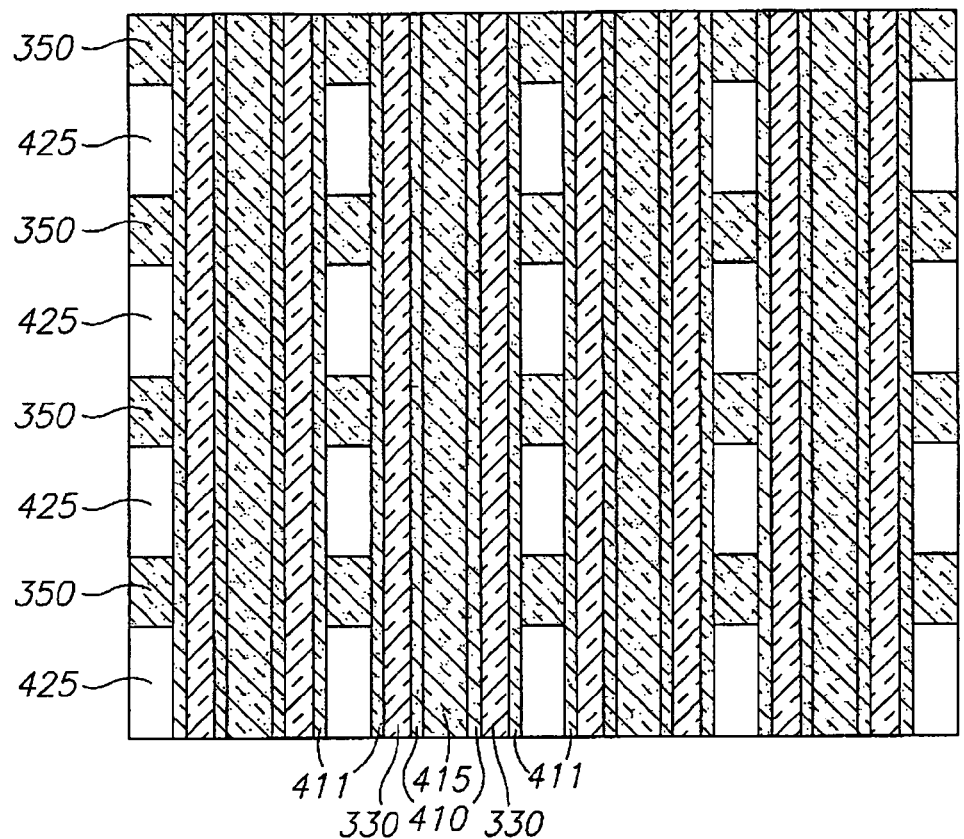
Figure 22B:
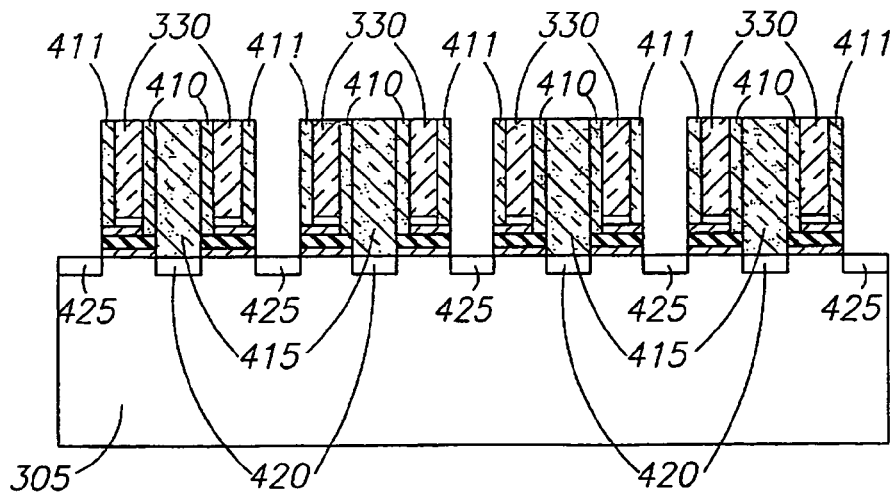
Figure 23A:
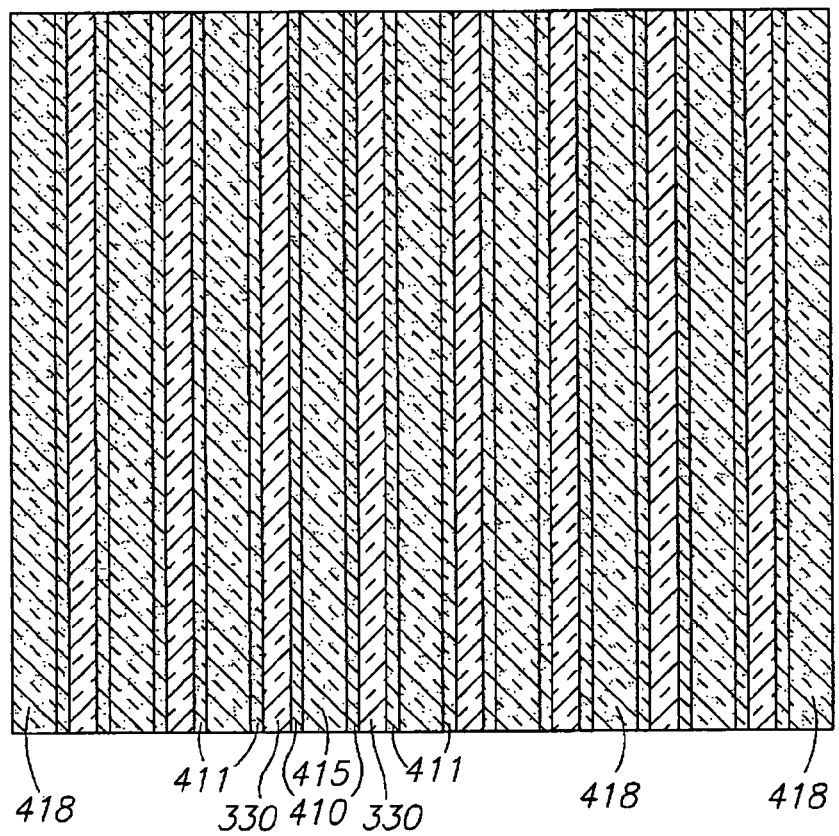

As illustrated in FIGS. 22A and 22B, a second APT implant 425 may then be implanted (step 460) in exposed substrate 305. FIG. 23A shows how an oxide fill 418 may then be deposited (step 470) to cover APT implant 425.

It will be appreciated that steps 455 and 458 are optional. In an alternate embodiment of the present invention, APT implants 425 may be implanted (step 460) directly through ONO layer 380 without depositing oxide spacers 411 or etching ONO layer 380. Oxide filler 418 may then be deposited (step 440) in the area containing both oxide spacers 410 and oxide filler 418 in the previous embodiment.

Figure 23B:
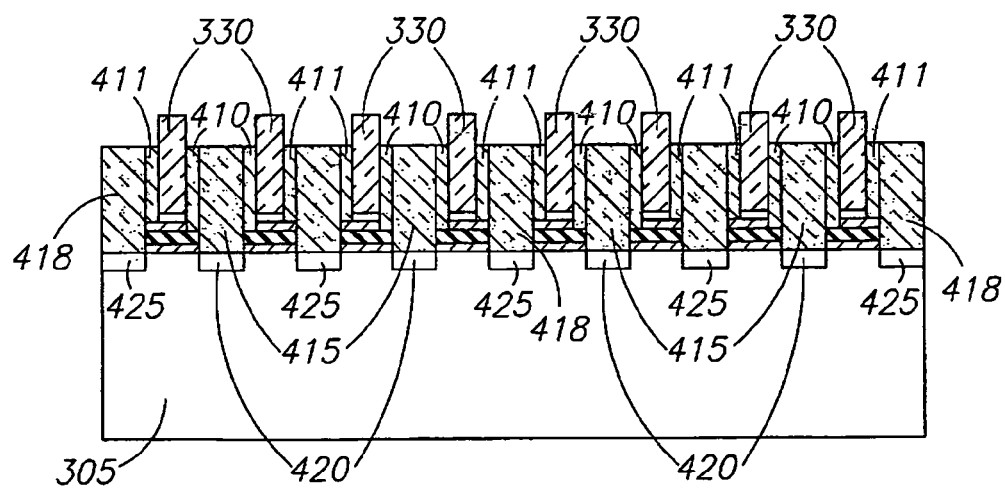

After oxide fill 418 is deposited, array 400 may be planarized as in step 440, using for example, a CMP process to remove excess oxide filler 418 above the level of spacer word lines 330. After the CMP process is performed, the only exposed elements remaining may be the polysilicon from spacer word lines 330 and oxides 410, 411, 415, and 418. An oxide etch-back may then be employed to expose spacer word lines 330 to a depth of, for example, approximately twice the spacer thickness for example. The cross sectional view in FIG. 23B illustrates the results of this etch. Spacer word lines 330 may rest on ONO 380 and may extend above surrounding oxides 410, 411, 415 and 418. It will also be appreciated that portions of ONO 380 may also extend underneath oxide spacers 410 and 411.

Figure 24A:
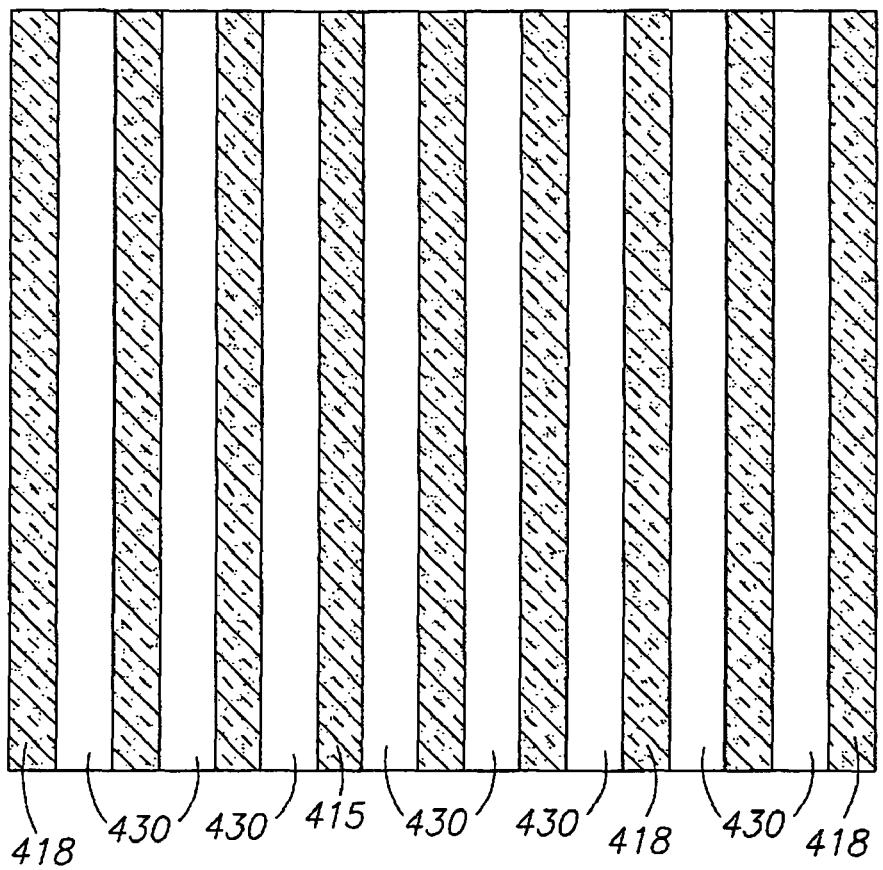
Figure 24B:
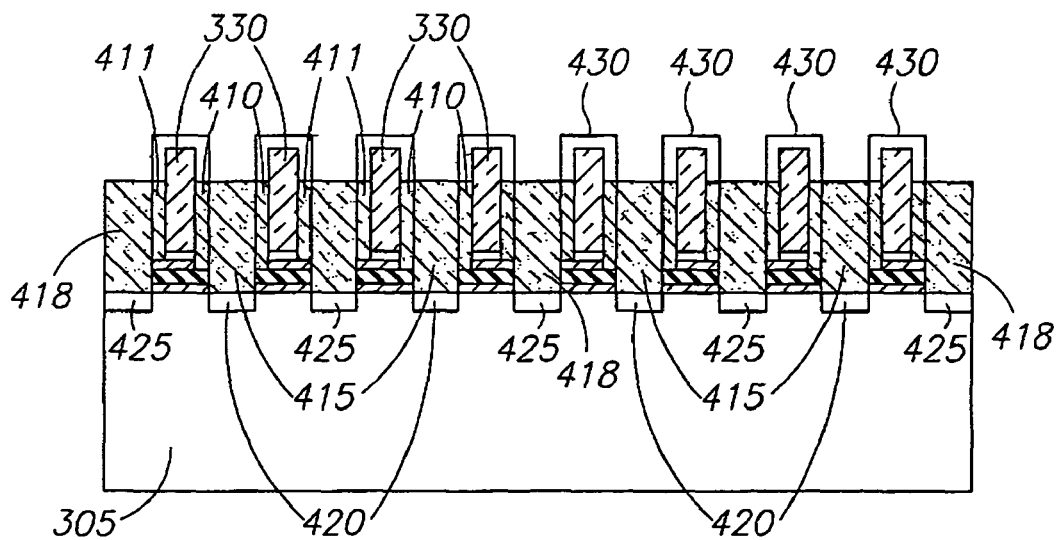

As illustrated in FIGS. 24A and 24B, spacer word line salicidation may now be performed (step 480) to salicide the exposed spacer word lines 330. For example, cobalt or tungsten may be used in this process. This step may complete the creation of array 400.

It will be appreciated that, as stated hereinabove, the width of spacer word lines 330 may be 0.4 F. It will also be appreciated that the combined width of an oxide 410, oxide 415 and a second oxide 410 may be 1 F. Similarly, the combined width of an oxide 411, oxide 418 and a second oxide 411 may also be 1 F. Accordingly, it will be appreciated that array 400 may have a pitch of one word line for every 1.4 F, as opposed to the previous minimal pitch of one word line per 2 F as described hereinabove for the prior art.

It will be appreciated that the values provided in the embodiment provided above are exemplary only. Polysilicon spacer word lines 330 may have a width of 0.1 F-0.5 F. Similarly, width spaces 335 may be 1 F or smaller. The constraint may be that the pitch of the mask for word line retaining walls 390' may be 2 F. This may be split between wall width of 0.8 F and width space of 1.2 F or some other arrangement.

In an alternative embodiment of the present invention, array 400 may not have anti punchthrough implants. This alternative embodiment is also illustrated in FIG. 12. The steps for this embodiment may include steps 402-420 of the previous embodiment at which point, spacer word lines 330 may be created (as illustrated in FIGS. 16A and 16B) next to word line retaining walls 390'.

Figure 25A:
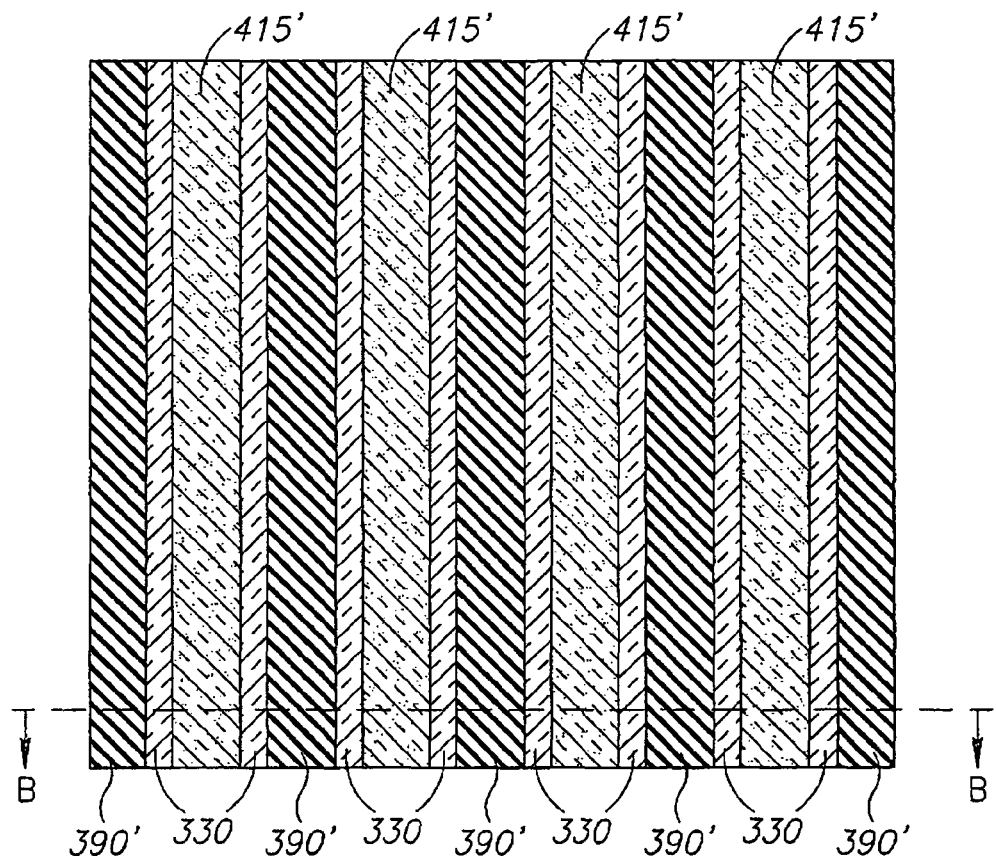
Figure 25B:
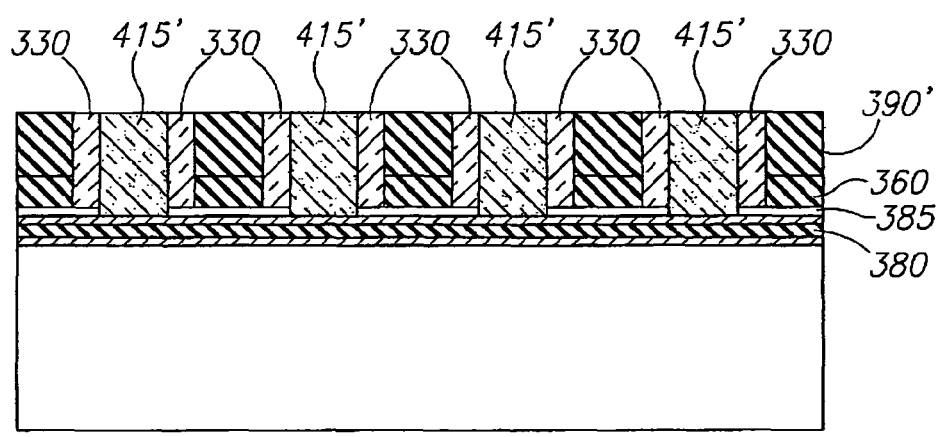

As APT implants are not required (as checked in step 422), the next step may be to deposit (step 440) oxide filler 415' between spacer word line 330. As in the previous embodiment, array 400 may also be planarized at this point to remove excess oxide filler. Reference is now made to FIGS. 25A and 25B which illustrate the results of step 440. Oxide filler 415' may be on top of ONO layer 380, and may fill the entire area between spacer word lines 330. It will be appreciated that the areas covered by oxide filler 415' may be equivalent to the areas that may be covered by oxide spacers 410 and oxide filler 415 in the previous embodiment.

Figure 26A:
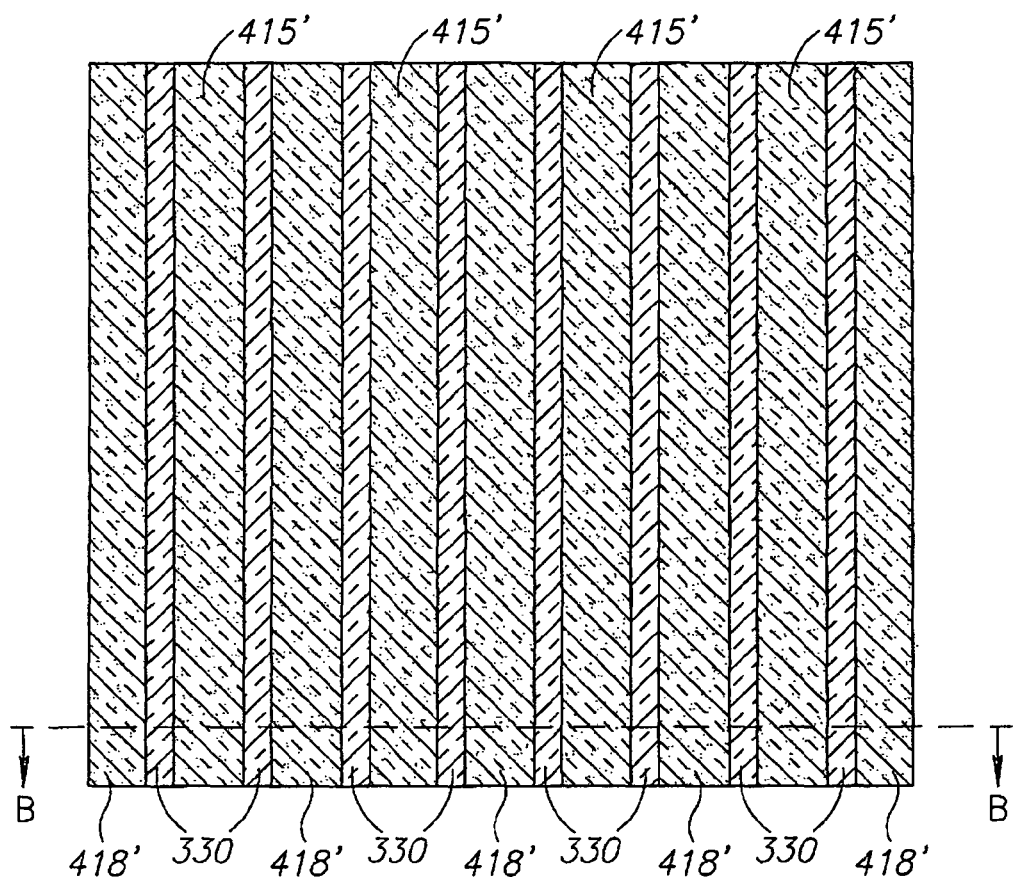
Figure 26B:
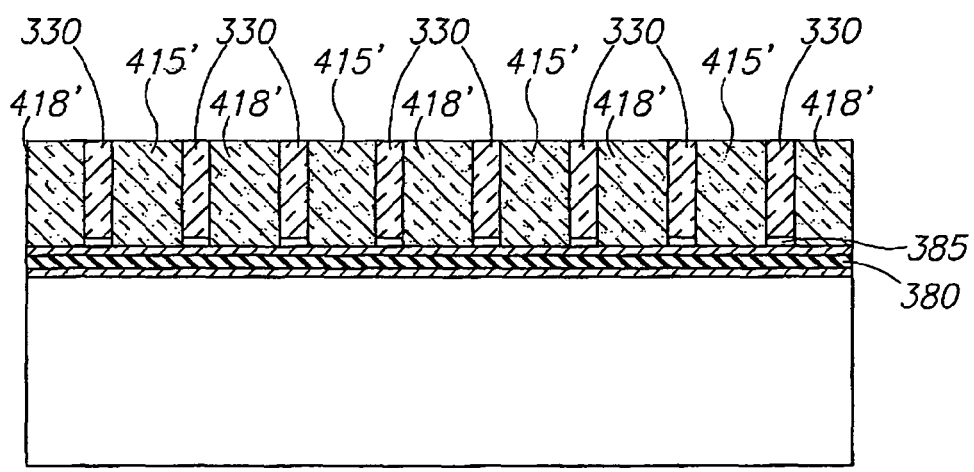

Step 450 may then proceed as in the previous embodiment to remove retaining walls 390'. As illustrated in FIGS. 26A and 26B, to which reference is now made, retaining walls 390' may be removed and ONO layer 380 exposed between spacer word lines 330.

Again assuming that APT implants are not required (as checked in step 452), the next step may be to deposit (step 470) oxide filler 418' in the area previously filled by retaining walls 390'. As in the previous embodiment, array 400 may also be planarized at this point to remove excess oxide filler. FIGS. 26A and 26B illustrate the results of step 470. Oxide filler 415' may be on top of ONO layer 380, and may fill the entire area between spacer word lines 330. It will be appreciated that the areas covered by oxide filler 418' may be equivalent to the areas that may be covered by oxide spacers 411 and oxide filler 418 in the previous embodiment.

Processing may continue with word line salicidation (step 480) as in the previous embodiment. When comparing FIGS. 23A and 23B of the previous embodiment to FIGS. 26A and 26B of the present embodiment, it will be appreciated that other than the absence of APT implants and the etching of ONO 380 required to facilitate such implants, there may be no material differences between memory arrays 400 manufactured via the two embodiments. In both embodiments, there may be oxide fillers between spacer word lines 330. In the previous embodiment such fillers may be comprised of oxide spacers 410 and 411 as well as oxide fillers 415 and 418. In the present embodiment such fillers may be comprised of oxide fillers 415' and 418'.

It will thus be appreciated that there may be no material difference between the sizes of memory cells 38 (FIG. 11) manufactured via the two embodiments. Other than the absence of APT implants and the existence of more elements of ONO 380, the results of the present embodiment may be generally similar to those of the previous embodiment.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A non-volatile memory array comprising: word lines; and bit lines generally perpendicular to said word lines, wherein: (a) a pitch between two neighboring word lines is less than 2 F, (b) said pitch is a word line width and a word line spacing, and (c) a minimum spacing is electrically limited to the point at which a dielectric between neighboring word lines breaks down.

2. The array of claim 1 and wherein said word line pitch is between 1 F and 2 F.

3. The array according to claim 1 and wherein said array is a NROM (nitride read only memory) array.

4. The array according to claim 1 and wherein a distance from a first word line to a word line two away from said first word line is 2 F.

5. The array according to claim 1 and wherein said word line width is at least 0.5 F and said spacing is less than 0.5 F.

6. The array according to claim 1 and wherein said dielectric is oxide-nitride-oxide.

7. The array according to claim 1 and wherein said word lines are formed from polysilicon spacers.

8. The array according to claim 7 and wherein said word lines are at least 0.1 F wide.

9. A non-volatile memory chip comprising:
  (a) an array of memory cells each of whose area is less than 4 $F^2$ per cell, wherein F is a minimum feature size;
  (b) wherein said array also comprises word lines and bit lines generally perpendicular to said word lines such that a pitch between two neighboring word lines is less than 2 F, said pitch is a word line width and a word line spacing, and a minimum spacing is electrically limited to the point at which a dielectric between neighboring word lines breaks down; and
  (c) periphery elements to control said memory cells.

10. The chip according to claim 5 and wherein said cells are NROM cells.

11. The chip according to claim 9 wherein gates of rows of said memory cells are formed together into word lines and wherein a word line width is at least 0.5 F and a word line spacing is less than 0.5 F.

12. The chip according to claim 11 and wherein said rows are formed of metal.

13. The chip according to claim 9 wherein gates of rows of said memory cells are formed together into word lines and wherein said word lines are formed from polysilicon spacers.

14. The chip according to claim 13 and wherein said word lines are at least 0.1 F wide.

15. The chip according to claim 13 and wherein a distance from a first word line to a word line two away from said first word line is 2 F.

16. A non-volatile memory array comprising: polysilicon spacer word lines; and bit lines generally perpendicular to said word lines, wherein: (a) a pitch between two neighboring word lines is less than 2 F, (b) said pitch is a word line width and a word line spacing, and (c) a minimum spacing is electrically limited to the point at which a dielectric between neighboring word lines breaks down.

17. The array according to claim 16 and wherein said spacer word lines are at least 0.1 F wide.

18. The array according to claim 16 and wherein a distance from a first word line to a word line two away from said first word line is 2 F.

19. The array according to claim 16 and wherein the width of said word lines is less than 1 F.

20. The array according to claim 19 and wherein said word lines generally pass low currents during programming.

* * * * *